(12) United States Patent
Sawada

(10) Patent No.: US 7,336,557 B2
(45) Date of Patent: Feb. 26, 2008

(54) SEMICONDUCTOR MEMORY DEVICE SUITABLE FOR MOUNTING ON PORTABLE TERMINAL

(75) Inventor: Seiji Sawada, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 407 days.

(21) Appl. No.: 11/049,059

(22) Filed: Feb. 3, 2005

(65) Prior Publication Data

US 2005/0169091 A1    Aug. 4, 2005

(30) Foreign Application Priority Data

Feb. 3, 2004    (JP)    ............... 2004-026999

(51) Int. Cl.
*G11C 8/00*    (2006.01)
(52) U.S. Cl. ............... 365/233; 365/194; 365/226
(58) Field of Classification Search ............... 365/233, 365/194, 226, 191, 189.03, 189.12
See application file for complete search history.

(56) References Cited

U.S. PATENT DOCUMENTS 6,842,397 B2 *    1/2005    Toda et al. ............... 365/233

6,992,946 B2 *    1/2006    Ooishi ............... 365/226

FOREIGN PATENT DOCUMENTS

| JP | 07-226077 | 8/1995 |
| JP | 2001-155484 | 6/2001 |
| JP | 2002-352577 | 12/2002 |

OTHER PUBLICATIONS

"Burst CellularRam™", Micron Technology, Inc., 2003, pp. 1-55, (URL: http://www.micron.con/products/psram/cellularram/).
"CellularRam™ Next-Generation Mobile SRAM", Agenda, Rev. 1.1, 2003, pp. 1-13, (URL: http://www.cellularram.com).

* cited by examiner

*Primary Examiner*—Anh Phung
*Assistant Examiner*—Dang Nguyen
(74) *Attorney, Agent, or Firm*—Buchanan Ingersoll & Rooney PC

(57) ABSTRACT

A trigger producing circuit provides a trigger signal. A delay circuit receives the trigger signal, and provides a delay signal produced by delaying the trigger signal. A clock counter receives clocks, counts the received clocks for a period from reception of the trigger signal to reception of the delay signal, and provides a result of the counting. A determining circuit stores a relationship between the number of clocks and a latency, and determines the latency corresponding to the result of counting provided from the clock counter. A latency register holds the determined latency. A WAIT control circuit externally provides a WAIT signal based on the latency held in the latency register.

2 Claims, 49 Drawing Sheets

FIG.63
| tcsp≧20ns | BCR[15]=0 | ASYNCHRONOUS-FIXED MODE |
|---|---|---|
| | BCR[15]=1 | ASYNCHRONOUS-FIXED MODE |
| tcsp＜20ns | BCR[15]=0 | SYNCHRONOUS/ASYNCHRONOUS MIXED MODE |
| | BCR[15]=1 | ASYNCHRONOUS-FIXED MODE |
FIG.64A
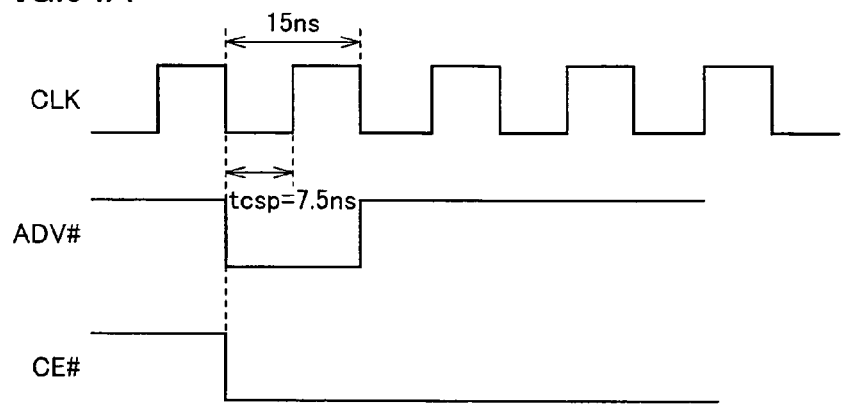
FIG.64B
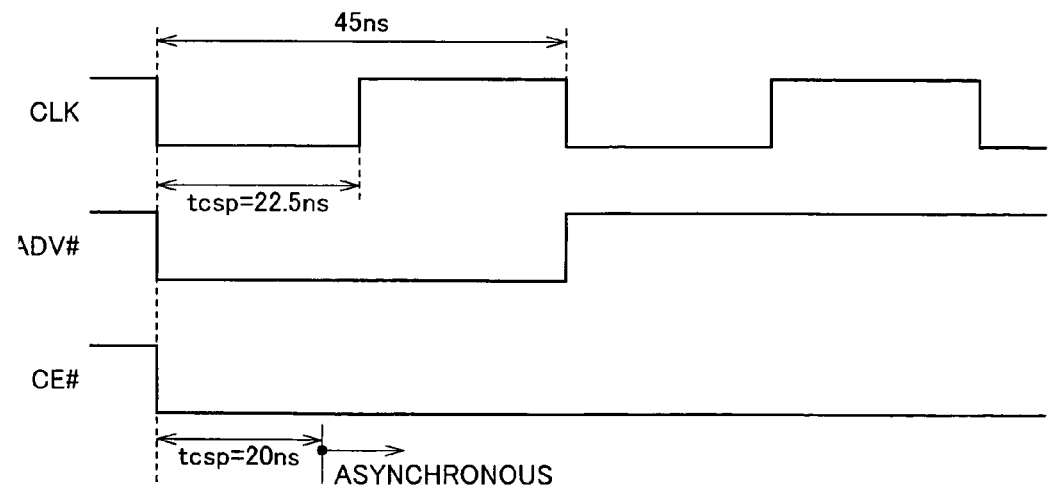

FIG.65

| BCR[16] | tcsp | BCR[15] | Mode |
|---|---|---|---|
| BCR[16]=0 | tcsp≧20ns | BCR[15]=0 | SYNCHRONOUS-FIXED MODE |
| | | BCR[15]=1 | SYNCHRONOUS-FIXED MODE |
| | tcsp<20ns | BCR[15]=0 | SYNCHRONOUS-FIXED MODE |
| | | BCR[15]=1 | ASYNCHRONOUS-FIXED MODE |
| BCR[16]=1 | tcsp≧20ns | BCR[15]=0 | ASYNCHRONOUS-FIXED MODE |
| | | BCR[15]=1 | SYNCHRONOUS/ASYNCHRONOUS MIXED MODE |
| | tcsp<20ns | BCR[15]=0 | ASYNCHRONOUS-FIXED MODE |
| | | BCR[15]=1 | ASYNCHRONOUS-FIXED MODE |

SEMICONDUCTOR MEMORY DEVICE SUITABLE FOR MOUNTING ON PORTABLE TERMINAL

BACKGROUND OF THE INVENTION

1. Field of the Invention

The present invention relates to a semiconductor memory device, and particularly to a semiconductor memory device suitable for mounting on a portable terminal.

2. Description of the Background Art

Semiconductor memory devices, which are used in portable terminals such as cellular phones, employ pseudo-SRAMs (Static Random Access Memories) for achieving large capacities and easy control. The pseudo-SRAM includes DRAM (Dynamic Random Access Memory) cells as internal memory cells, and also includes an interface, which is asynchronous to a clock similar to that of a SRAM, as an external interface for defining input control signals and address signals. A refresh operation is not controlled by an externally applied signal, but is performed internally and automatically (e.g., see Japanese Patent Laying-Open No. 2002-352577).

For further achieving a high speed operation, a synchronous pseudo-SRAM, which additionally employs a synchronous interface, has been available, e.g., as CellularRAM® disclosed on the Internet Web site (URL: http://www.micron.com/products/psram/cellularram/). This synchronous pseudo-SRAM includes a synchronous interface synchronized with a clock similar to that of a SRAM in addition to an asynchronous interface not synchronized with the clock.

According to the synchronous pseudo-SRAM, a WAIT signal is issued to notify that external access is prohibited, before elapsing of a command latency CL, which is the number of clocks issued until data is output after reception of a read or write request, and while self-refresh is being performed. In a conventional structure, command latency CL is externally applied. However, the synchronous pseudo-SRAM does not require such external application because the WAIT signal can be internally issued to notify that the access is impossible. Command latency CL of a more appropriate value can be determined by internally determining it within the synchronous pseudo-SRAM according to a current state, as compared with the case of externally determining the command latency.

In contrast to the above, Japanese Patent Laying-Open No. 2001-155484 has disclosed a latency determining circuit, which can adjust a latency according to a clock frequency. This latency determining circuit includes a latency determining instruction input unit, which issues an internal start signal in response to activation of a latency determination start signal for starting latency determination in synchronization with a clock signal, a latency section defining circuit, which issues a predetermined latency determination section signal at every edge of the clock signal in response to the latency determination start signal, a delay unit issuing a delay signal to adjust the latency by delaying the internal start signal by a predetermined time, and a latency instructing circuit, which determines a latency number in response to the latency determination start signal and the latency determination section signal at the point in time of activation of the delay signal. The latency determining circuit described above can internally determine the latency without an external instruction.

For example, Japanese Patent Laying-Open No. 07-226077 has disclosed a method, in which self-refresh is performed simultaneously with reading or writing in the case where a pseudo-SRAM has multiple banks. More specifically, according to the paragraph [0020] in Japanese Patent Laying-Open No. 07-226077, even when one of first to fourth cell banks 10-13 is in a refresh mode, first to fourth row address latch circuits and buffers 80-83 can transmit second load address signals $A_0$-$A_{n-2}$ latched by a row address latch circuit 70 to remaining three cell banks to allow access to data even during the refresh mode.

However, the following problems arise in the methods disclosed in the foregoing references.

Although Japanese Patent Laying-Open No. 2001-155484 has disclosed a manner of internally setting the latency, it has not disclosed timing for setting the latency.

Although Japanese Patent Laying-Open No. 07-226077 has disclosed a manner of performing the refresh simultaneously with reading or writing when the bank to be refreshed is different from the bank of a reading or writing target, it has not disclosed a manner of determining the bank to be refreshed such that the bank to be refreshed may not overlap with the bank of the reading or writing target.

Further, in a structure having a plurality of pseudo-SRAMs accommodated in a single package, each pseudo-SRAM performs the refreshing according to timing different from the timing of the others. This results in a conflict of the WAIT signals issued from the respective pseudo-SRAMs.

Further, there is such a problem that data cannot be output according to timing earlier than the timing defined by command latency CL.

In the case where the pseudo-SRAM has multiple modes such as a synchronous mode and an asynchronous mode, and operates in one mode selected from these modes, a preamplifier, which can operate appropriately in a certain mode, may not operate appropriately in another mode, and thus may not correctly perform amplification.

In the case where a processing target changes to a next row during continuous reading or writing, a byte mask signal must be applied after an externally applied WAIT signal notifies of the completion of processing for starting processing of a next row (i.e., deactivation of a word line in the last processed row, activation of a word line in the next target row, amplification by a sense amplifier and others).

For precharging a bit line pair, a chip enable signal must be externally deactivated, and thus external control is required.

Semiconductor memory devices such as a CellularRAM® cannot operate synchronously with a clock of a low frequency.

When a chip is on standby, or is inactive because another chip is being accessed, an input/output buffer continues an operation, and thus wastes a current.

SUMMARY OF THE INVENTION

Accordingly, an object of the invention is to provide a semiconductor memory device, which internally sets a latency according to appropriate timing.

Another object of the invention is to provide a semiconductor memory device, which appropriately determines a bank to be refreshed while preventing overlapping of the bank to be refreshed with a bank of a reading or writing target.

Still another object of the invention is to provide a semiconductor memory device, which has a plurality of pseudo-SRAMs arranged within a single package, and can refresh them according to the same timing.

Yet another object of the invention is to provide a semiconductor memory device, which can output data according to timing earlier than timing defined by command latency CL.

Further another object of the invention is to provide a semiconductor memory device, which has multiple modes, and can appropriately operate a preamplifier in all the modes when one of the modes is selected for operation.

A further object of the invention is to provide a semiconductor memory device, in which a byte mask signal can be externally applied similarly to the case of not moving to a next row even when change to the new row is to be performed during continuous reading or writing.

A further object of the invention is to provide a semiconductor memory device, which can precharge a bit line pair only under internal control without requiring external control.

A further object of the invention is to provide a semiconductor memory device, which can operate in a synchronous manner with a clock of a low frequency.

A further object of the invention is to provide a semiconductor memory device, which can prevent such a situation that an input/output buffer continues an operation in an inactive chip, and thereby wastes a current.

According to an aspect of the invention, a semiconductor memory device operable in synchronization with a clock-includes a memory array having a plurality of memory cells arranged in rows and columns; a trigger producing circuit providing a trigger signal; a delay circuit receiving the trigger signal, and providing a delay signal produced by delaying the trigger signal; a clock counter receiving the clocks, counting the received clocks during a period from reception of the trigger signal to reception of the delay signal, and providing a result of the counting; a determining circuit storing a relationship between the number of clocks and a latency, and determining the latency corresponding to the result of counting provided from the clock counter; a register holding the determined latency; and a wait control circuit externally providing a wait signal based on the latency held in the register.

According to another aspect of the invention, a semiconductor memory device includes a memory array having memory cells of a plurality of dynamic random access memories arranged in rows and columns, and having a plurality of banks each forming a unit to be refreshed at a time; a circuit providing a trigger of refreshing; a bank select circuit selecting the bank different from the currently operating bank, and providing an address of the selected bank when the currently operating bank is performing an externally instructed operation at the time of reception of the refresh trigger; and a refresh control circuit refreshing the bank at the received address. The bank select circuit includes a register holding addresses of the refreshed banks, and erasing all the addresses held in the register when the addresses of all the banks are held, a determining circuit determining the addresses of the unrefreshed banks by referring to the register when the refresh trigger is received, and a comparing circuit comparing the address of the unrefreshed bank with the address of the currently operating bank, and providing the address of the unrefreshed bank when the address of the unrefreshed bank is different from the address of the currently operating bank.

According to still another aspect of the invention, a semiconductor memory device includes a memory array having memory cells of a plurality of dynamic random access memories arranged in rows and columns; a first circuit producing a first signal defining timing of refreshing; an output terminal outputting the first signal; an input terminal receiving a second signal externally defining the timing of the refreshing; a switch receiving the first and second signals, and outputting one of the first and second signals; and a second circuit receiving the signal output from the switch, and performing refresh control based on the received signal.

According to further another aspect of the invention, a semiconductor memory device for operating in synchronization with a clock, performing access in a burst mode, and obtaining row and column addresses prior to production of a read signal or a write signal, includes a memory array having a plurality of memory cells arranged in rows and columns; and a control circuit performing control, in synchronization with a first clock defined by a time of production of the read signal or the write signal according to an externally applied control signal, to effect row access processing on a selected row and to effect column access processing on column(s) starting from a first position and being equal in number to a first number exceeding zero and not exceeding a burst length, and performing control, in synchronization with a second or later clock defined by a latency, to effect the column access processing on a second number of the columns remaining in the burst mode access.

According to further another aspect of the invention, a semiconductor memory device being set to one of a plurality of operation modes according to a combination of external signals, includes a memory array having a plurality of memory cells arranged in rows and columns; bit line pairs connected to the memory cells; a first amplifier circuit amplifying a potential on the bit line pair; an I/O line pair connected to the plurality of bit line pairs; and two or more kinds of second amplifier circuits being selectively activated in accordance with the mode for amplifying the potential on the I/O line pair.

According to further another aspect of the invention, a semiconductor memory device operable in synchronization with a clock includes a memory array having a plurality of memory cells arranged in rows and columns; a byte mask control circuit receiving an externally applied byte mask signal, and controlling byte mask processing based on the byte mask signal; and an output circuit receiving data provided from the memory cell, and not outputting a byte corresponding to the byte mask signal of the data provided from the memory cell. When the byte mask control circuit receives the externally applied byte mask signal during row access processing performed for change to a second row due to reaching a last column in a first row during an operation of continuously effecting writing or reading on the first row and the subsequent second row, the byte mask control circuit defers mask processing to be effected on the byte corresponding to the byte mask signal until data of a next bit is output after the end of the row access.

According to further another aspect of the invention, a semiconductor memory device having a synchronous mode for operation synchronous with a clock and an asynchronous mode for operation asynchronous to the clock, includes a memory array having a plurality of memory cells arranged in rows and columns; a setting circuit capable of setting one of a synchronous-fixed mode, an asynchronous-fixed mode and a synchronous/asynchronous mixed mode; an asynchronous-changing circuit determining in the mixed mode whether a time from asserting of an external chip enable signal to rising of an external clock is equal to or greater than a predetermined value or not, and changing the mode to the asynchronous-fixed mode when the time is equal to or greater than the predetermined value; a synchronous control circuit controlling a synchronous operation when the synchronous-fixed mode or the mixed mode is set; and an asynchronous control circuit controlling the asynchronous operation when the asynchronous-fixed mode or the mixed mode is set, or when the mode is changed to the asynchronous-fixed mode. The asynchronous-changing circuit is deactivated in accordance with an output of the setting circuit.

According to further another aspect of the invention, a semiconductor memory device operable in synchronization with a clock includes a memory array having a plurality of memory cells arranged in rows and columns; a chip enable buffer receiving an external chip enable signal, and producing an internal chip enable signal; a clock buffer receiving an external clock and producing an internal clock; an address buffer receiving an external address signal and producing an internal address signal; and a control buffer receiving an external control signal other than the external chip enable signal and producing an internal control signal. The clock buffer, the address buffer and the control buffer receive the internal chip enable signal, and stop operations when the internal chip enable signal indicates deactivation of the chip. The clock buffer, the address buffer and the control buffer execute the operations when the internal chip enable signal indicates activation. The control buffer receives an external address take-in signal, and produces an internal address take-in signal. The semiconductor memory device further includes a delay circuit delaying the internal address take-in signal by a predetermined delay amount; a data holding circuit holding an output of the delay circuit in synchronization with the internal clock; a logical circuit providing an AND signal obtained from an output of the data holding circuit and the internal clock; and a circuit activating a row address strobe signal based on a leading pulse of the AND signal. The predetermined delay amount of the delay circuit is determined such that the leading pulse of the AND signal is formed of an internal clock pulse produced from an external clock pulse rising during an active state of the external address take-in signal.

According to further another aspect of the invention, a semiconductor memory device being set to one of a plurality of operation modes, the semiconductor memory device includes a memory array having a plurality of memory cells arranged in rows and columns; bit line pairs connected to the memory cells a first amplifier circuit amplifying a potential on bit line pair; an I/O line pair connected to plurality of bit line pairs; and two or more different types of second amplifier circuits connected to I/O line pair and aligned in a column direction and wherein I/O line pair connects two or more different types of second amplifier circuits to one another.

According to further another aspect of the invention, a semiconductor memory device being set to one a plurality of operation modes semiconductor memory device includes a memory array having a plurality of memory cells arranged in rows and columns; bit line pairs connected to memory cells; a first amplifier circuit amplifying a potential on bit line pair; an I/O line pair connected to plurality of bit line pairs; two or more different types of second amplifier circuits connected to each I/O line pair and aligned in a row direction.

The semiconductor memory device according to the above aspect of the invention can internally set the latency according to appropriate timing.

Also, the semiconductor memory device according to the above aspect of the invention can appropriately determine the bank to be refreshed without causing overlapping with the bank of the read or write target.

Further, the semiconductor memory device according to the above aspect of the invention allows refreshing of a plurality of pseudo-SRAMs arranged in one package according to the same timing.

Further, the semiconductor memory device according to the above aspect of the invention can output the data according to the timing earlier than the timing defined by the command latency.

Further, according to the above aspect of the invention, if the semiconductor memory device has the plurality of modes, and is configured to operate by selecting one of the modes, the preamplifier can operate appropriately in all the modes.

Further, according to the above aspect of the invention, when the processing target changes to the next row while the reading or writing is being continuously performed in the semiconductor memory device, the byte mask signal can be externally applied similarly to the case of not changing to the next row.

Further, the semiconductor memory device according to the above aspect of the invention can precharge the bit line pair only under the internal control without requiring external control.

Further, the semiconductor memory device according to the above aspect of the invention can operate with a clock of a low frequency and in a synchronous manner.

Further, the semiconductor memory device according to the above aspect of the invention can prevent such a situation that an I/O buffer continues an operation in an inactive chip, and thereby wastes a current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 63 illustrates a manner of setting synchronous and asynchronous modes in the background art.

FIG. 64A illustrates mode setting with tCSP equal to 7.5 ns, and FIG. 64B illustrates mode setting with tCSP equal to 22.5 ns.

FIG. 65 illustrates a manner of setting synchronous and asynchronous modes in a ninth embodiment.

DESCRIPTION OF THE PREFERRED EMBODIMENTS

Embodiments of the invention will now be described with reference to the drawings.

First Embodiment

A first embodiment relates to a synchronous pseudo-SRAM, which can internally and automatically set a latency to an appropriate value according to appropriate timing.

(Structure)

Figure 1:
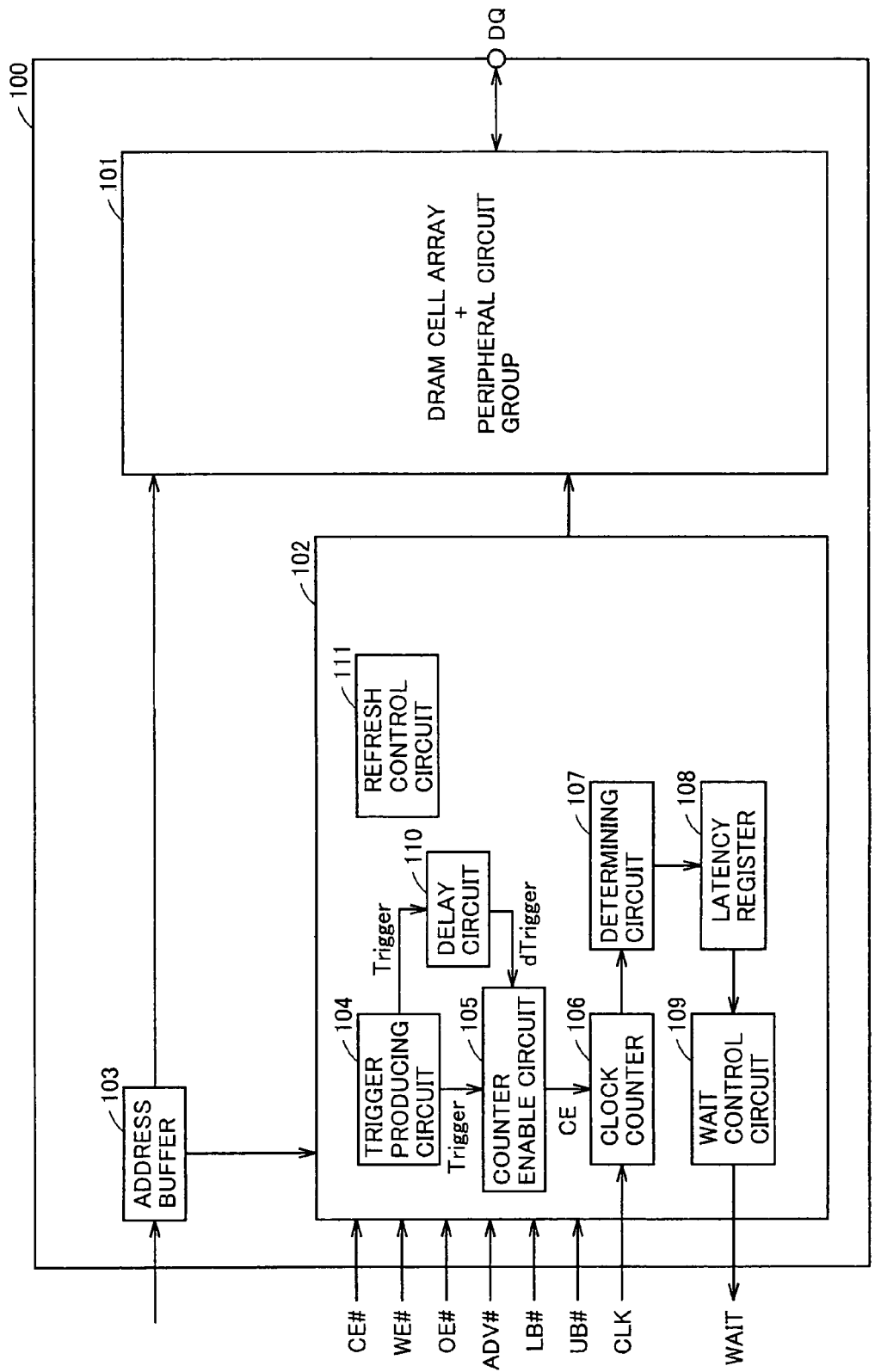
FIG. 1 shows a structure of a synchronous pseudo-SRAM 100 according to a first embodiment.

FIG. 1 shows a structure of synchronous pseudo-SRAM 100 according to the first embodiment. Referring to FIG. 1, synchronous pseudo-SRAM 100 includes a DRAM cell array and peripheral circuit group 101, an address buffer 103 and a control circuit 102.

A DRAM cell array in DRAM cell array and peripheral circuit group 101 is a memory array formed of cells of a Dynamic Random Access Memory (DRAM). Peripheral circuit group 101 includes a global I/O line pair GIOP (GIO and /GIO), column select lines provided corresponding to respective columns, column select gates, sense amplifiers, preamplifiers, a write driver, a row decoder, a column decoder and others.

Address buffer 103 receives an external address signal ADD[21:0], and produces an internal address signal.

Control circuit 102 includes a trigger producing circuit 104, a counter enable circuit 105, a clock counter 106, a determining circuit 107, a latency register 108 (i.e., a register for a latency), a WAIT control circuit 109, a delay circuit 110 and a refresh control circuit 111.

Refresh control circuit 111 controls a self-refresh operation of the DRAM cell array based on an internal refresh timer (not shown).

Trigger producing circuit 104 outputs a trigger signal Trigger, which triggers setting of a latency.

Delay circuit 110 is formed of a plurality of inverters. Delay circuit 110 receives trigger signal Trigger, and provides a delayed trigger signal dTrigger.

Counter enable circuit 105 keeps a counter enable signal CE at "H" for a period from reception of trigger signal Trigger to reception of delayed trigger signal dTrigger.

Clock counter 106 counts external clocks CLK applied thereto while counter enable signal CE is at "H". The count depends on the number of applied external clocks CLK and a period of the "H" state of counter enable signal CE, i.e., the delay amount, by which delay circuit 110 delays trigger signal Trigger. The delay amount of delay circuit 110 depends on ambient environments such as a temperature.

Determining circuit 107 stores a relationship between the count of clocks and the minimum latency allowing the operation with the count. This relationship is determined such that the minimum latency increases with increase in count of the clocks. Based on this relationship, determining circuit 107 determines the minimum latency corresponding to the count provided from clock counter 106, and provides it to latency register 108.

Latency register 108 holds the minimum latency sent from determining circuit 107.

WAIT control circuit 109 keeps the WAIT signal at "L" only for a period corresponding to the minimum latency held in latency register 108.

Figure 2:
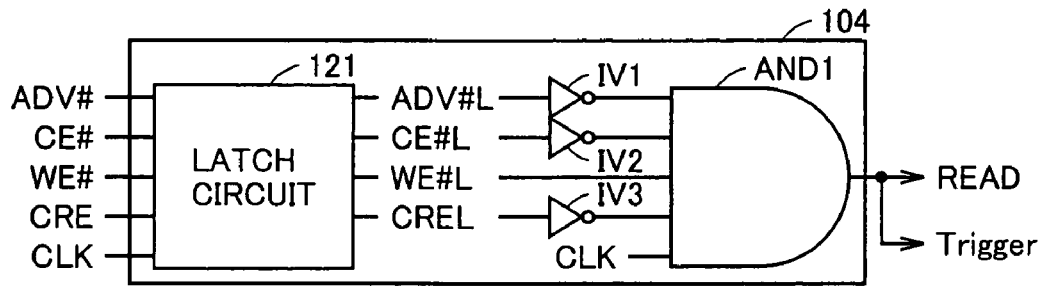
FIG. 2 shows a specific structure of a trigger producing circuit 104.

FIG. 2 shows a specific structure of trigger producing circuit 104. In FIG. 2, trigger producing circuit 104 is formed of a latch circuit 121, inverters IV1, IV2 and IV3, and an AND circuit AND1.

Figure 3:
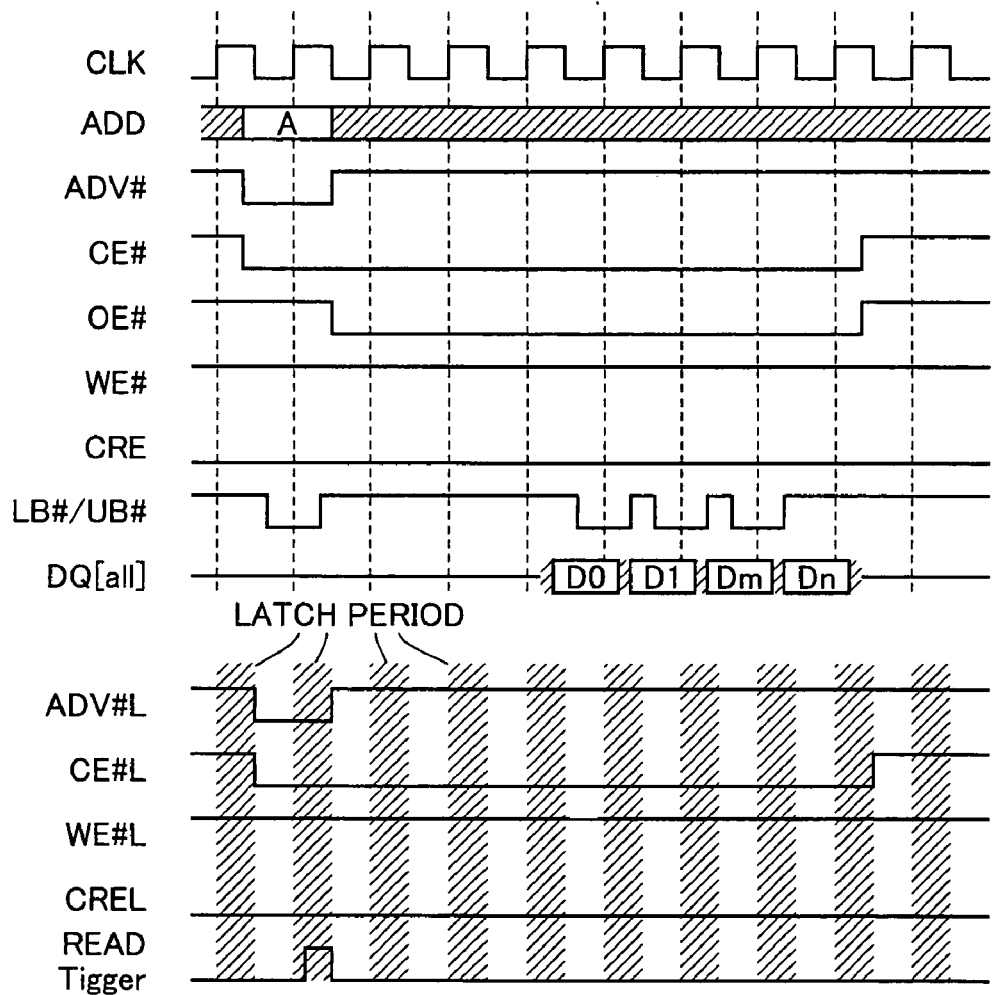
FIG. 3 is a timing chart of signals produced by trigger producing circuit 104.

FIG. 3 is a timing chart of signals produced by trigger producing circuit 104. Referring to FIG. 3, latch circuit 121 latches an external address take-in signal ADV#, and provides an address take-in latch signal ADV#L. Latch circuit 121 latches an external chip enable signal CE#, and provides a chip enable latch signal CE#L. Latch circuit 121 latches an external write enable signal WE#, and provides a write enable latch signal WE#L. Latch circuit 121 latches an external configuration register enable signal CRE#, and provides a configuration register enable latch signal CREL. AND circuit AND1 activates a read signal READ to attain "H", and sets trigger signal Trigger to "H" when address take-in latch signal ADV#L is at "L", chip enable latch signal CE#L is at "L", write enable latch signal WE#L is at "H", configuration register enable latch signal CREL is at "L" and external clock CLK is at "H".

When trigger producing circuit 104 described above produces read signal READ for performing the reading according to a combination of logical values of the external signals, trigger signal Trigger is also produced, and the latency is set.

According to the synchronous pseudo-SRAM of the embodiment of this embodiment, as described above, when read signal READ is produced and the command latency for read processing is actually required, the latency can be set to a minimum value allowing an operation with a frequency of applied external clock CLK and under ambient environments such as a temperature.

According to this embodiment, delay circuit 110 is formed of the plurality of inverters. However, delay circuit 110 is not restricted to such a structure, and may be formed of, e.g., a replica circuit reproducing a specific fashion in an imitating fashion. Clock counter 106 may be configured to receive the internal clock instead of external clock CLK.

This embodiment is not restrictively applied to the synchronous pseudo-SRAM, and may be applied to various semiconductor memory devices operating in synchronization with clocks.

Modification of First Embodiment

According to the first embodiment, trigger producing circuit 104 detects the production of read signal READ, and thereby produces trigger signal Trigger. However, this is not restrictive. For example, trigger signal Trigger may be produced as follows.

(1) Trigger signal Trigger is produced by detecting input of another operation instructing signal such as a write signal WRITE.

(2) Trigger signal Trigger is produced when a power-on detecting circuit detects the turn-on.

(3) Trigger signal Trigger is produced when an operation mode setting command determining circuit determines that mode setting relating to, e.g., a latency and a burst length is set according to external signals.

(4) Trigger signal Trigger is produced when a temperature change detecting circuit detects a change in temperature.

(5) An internal signal producing circuit produces trigger signal Trigger at constant intervals.

Second Embodiment

A second embodiment relates to synchronous pseudo-SRAM, in which a WAIT period is reduced by appropriately changing banks to be self-refreshed.

(Structure)

Figure 4:
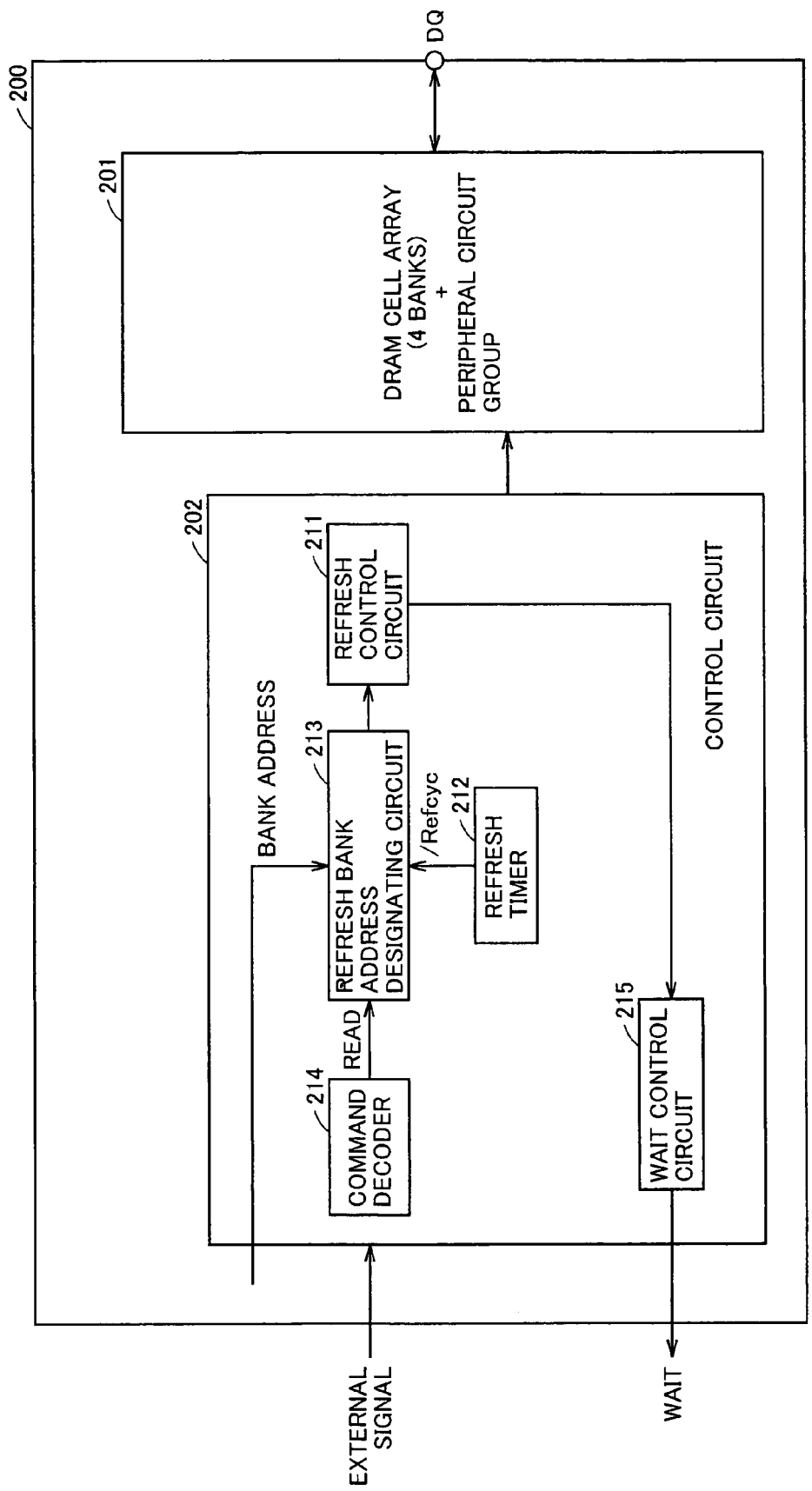
FIG. 4 shows a structure of a synchronous pseudo-SRAM 200 according to a second embodiment.

FIG. 4 shows a structure of a synchronous pseudo-SRAM 200 according to this embodiment. Referring to FIG. 4, synchronous pseudo-SRAM 200 according to the embodiment includes a DRAM cell array and peripheral circuit group 201, and a control circuit 202.

A DRAM cell array in DRAM cell array and peripheral circuit group 201 is a memory array formed of cells of a Dynamic Random Access Memory (DRAM), and has four banks. The banks are memory cell groups formed by dividing the DRAM cell array, and each forms a unit to be refreshed at a time. Thus, one refresh operation refreshes one bank.

The peripheral circuit group includes global I/O line pair GIOP (GIO and /GIO), column select lines provided corresponding to respective columns, column select gates, sense amplifiers, preamplifier, a write driver, a row decoder, a column decoder and others.

Control circuit 202 includes a command decoder 214, a refresh bank address designating circuit 213, a refresh timer 212, a refresh control circuit 211 and a WAIT control circuit 215.

Command decoder 214 produces a row activating signal ACT, read signal READ and write signal WRITE in accordance with a combination of logical levels of internal control signals produced according to external control signals.

Refresh timer 212 is formed of a ring oscillator, and provides a refresh cycle signal /Refcyc, which cyclically becomes active.

Refresh bank address designating circuit 213 receives refresh cycle signal /Refcyc, read or write signal READ or WRITE, and a bank address, and designates the address of the bank to be refreshed and the timing of such refreshing.

When refresh control circuit 211 receives only the bank address from refresh bank address designating circuit 213, it immediately controls the operation of refreshing the bank in the received address. When refresh control circuit 211 receives the bank address provided from refresh bank address designating circuit 213 as well as an instruction to the effect that the refreshing is to be performed after the reading is effected on the bank in the received address, it controls the operation of refreshing the bank in question after a predetermined time elapses.

WAIT control circuit 215 keeps the WAIT signal at the level of "L" while refresh control circuit 211 is controlling the refresh operation.

Figure 5:
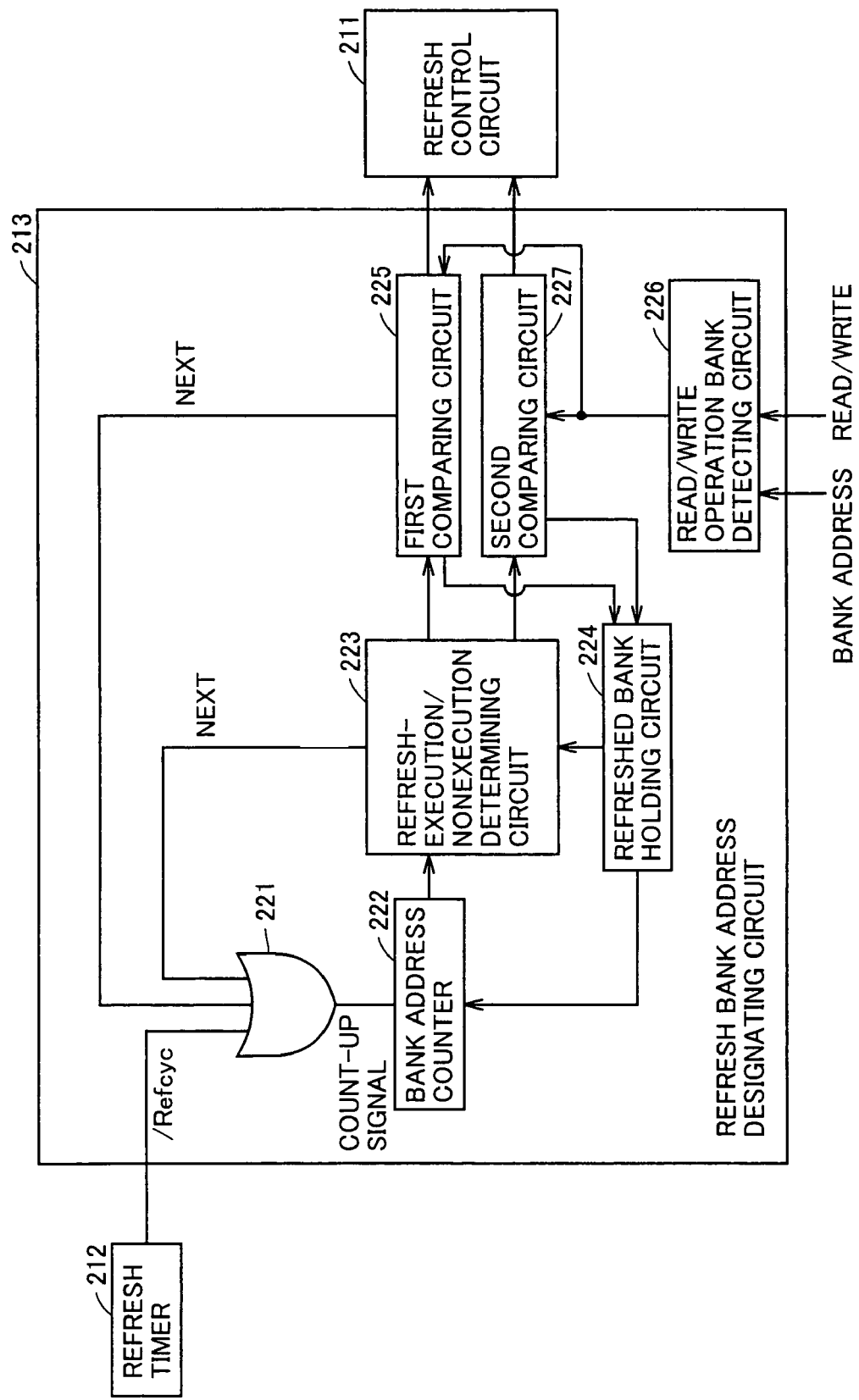
FIG. 5 shows a specific structure of a refresh bank address designating circuit 213.

FIG. 5 shows a specific structure of a refresh bank address designating circuit 213. Referring to FIG. 5, refresh bank address designating circuit 213 includes an OR circuit 221, a bank address counter 222, a refresh-execution/nonexecution determining circuit 223, a refreshed bank holding circuit 224, a first comparing circuit 225, a second comparing circuit 227, and a read/write operation bank detecting circuit 226.

When OR circuit 221 receives refresh cycle signal /Refcyc provided from refresh timer 212, a signal NEXT provided from refresh-execution/nonexecution determining circuit 223 for designating a next bank, or signal NEXT provided from first comparing circuit 225 for designating a next bank, OR circuit 221 provides a count-up signal.

When bank address counter 222 receives the count-up signal, it increments the count within a range from 1 to 4. The initial value of the count is equal to "0", and the count of "4" will change to "1".

Refreshed bank holding circuit 224 holds the address of the refreshed bank. When refreshed bank holding circuit 224 holds all the bank addresses of "1"-"4", it then erases all the bank addresses held therein, and resets the count of bank address counter 222 to "0". Therefore, by performing the refresh four times, all the banks 1-4 are refreshed.

Refresh-execution/nonexecution determining circuit 223 determines whether refreshed bank holding circuit 224 holds the bank address corresponding to the count of bank address counter 222 or not. If refreshed bank holding circuit 224 holds the bank address corresponding to the count, it determines that the refresh is not yet executed, and provides the bank address in question to first or second comparing circuit 225 or 227. If the bank address to be provided is the last one bank address, which is not held in refreshed bank holding circuit 224, refresh-execution/nonexecution determining circuit 223 provides the bank address to second comparing circuit 227. Otherwise, refresh-execution/nonexecution determining circuit 223 provides the bank address to first comparing circuit 225.

If the bank address corresponding to the count is held, refresh-execution/nonexecution determining circuit 223 determines that the refresh is already executed, and provides signal NEXT designating a next bank address.

When read/write operation bank detecting circuit 226 receives read signal READ or write signal WRITE, it provides the applied bank address (i.e., the address of the bank, on which reading or writing is effected) to first and second comparing circuits 225 and 227.

First comparing circuit 225 determines whether the two bank addresses, which are received from read/write operation bank detecting circuit 226 refresh-execution/nonexecution determining circuit 223, respectively, are the same or not. If these addresses are different from each other, first comparing circuit 225 provides the bank address received from refresh-execution/nonexecution determining circuit 223 to refresh control circuit 211, and also provides this bank address to refreshed bank holding circuit 224 for holding it therein. When the two bank addresses are the same, first comparing circuit 225 provides signal NEXT designating a next bank address.

Second comparing circuit 227 determines whether the two bank addresses received from read/write operation bank detecting circuit 226 and refresh-execution/nonexecution determining circuit 223 are the same or not. If these addresses are different from each other, second comparing circuit 227 provides the bank address received from refresh-execution/nonexecution determining circuit 223 to refresh control circuit 211, and also provides this bank address to refreshed bank holding circuit 224 for holding it therein. When the two bank addresses are the same, second comparing circuit 227 provides to refresh control circuit 211 the bank address received from refresh-execution/nonexecution determining circuit 223 as well as an instruction to the effect that the refresh is to be performed after the reading is effected on the bank in the address in question.

EXAMPLE OF OPERATION OF SYNCHRONOUS PSEUDO-SRAM IN THE BACKGROUND ART

First, an operation of a synchronous pseudo-SRAM in the background art will be described for comparison with that of synchronous pseudo-SRAM 200 of this embodiment.

Figure 6:
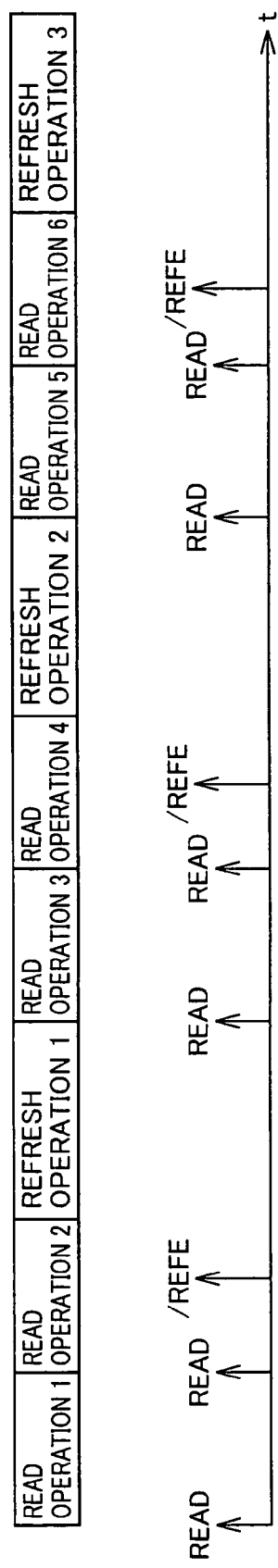
FIG. 6 illustrates an operation of a synchronous pseudo-SRAM of a background art.

FIG. 6 illustrates an operation of a synchronous pseudo-SRAM in the prior art. As illustrated in FIG. 6, if a refresh timer provides a refresh cycle signal /Refcyc while a read operation is being performed based on read signal READ according to an external instruction, a refresh control circuit will start the control of the refresh operation after the end of the read operation, which is being performed. A WAIT control circuit externally provides a WAIT signal during execution of the refresh operation.

In the synchronous pseudo-SRAM, therefore, when the timing of the read operation overlaps with the timing of the self-refresh, the timing of the self-refresh is delayed, and the read instruction cannot be externally provided to the synchronous pseudo-SRAM until the end of the self-refresh.

Operation Example 1 of Synchronous
Pseudo-SRAM 200 of the Embodiment

Figure 7:
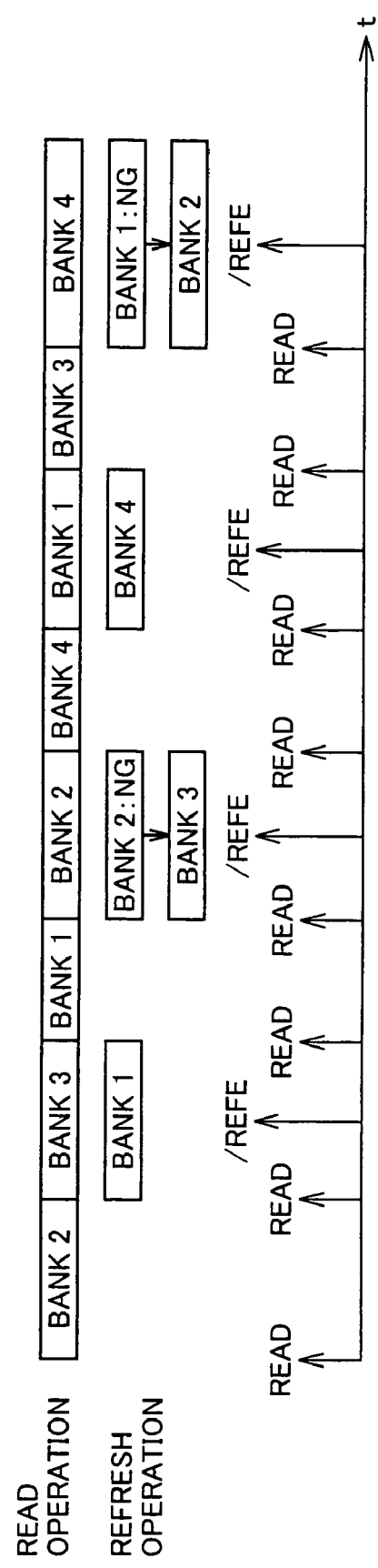
FIG. 7 illustrates an example of an operation of a synchronous pseudo-SRAM 200 according to a second embodiment.

FIG. 7 illustrates an operation example of synchronous pseudo-SRAM 200 according to the embodiment.

First, a read operation is effected on bank 2 based on read signal READ externally designating bank 2, Then, a read operation is effected on bank 3 based on read signal READ externally designating bank 3. During the read operation of bank 3, refresh timer 212 provides refresh cycle signal /Refcyc. OR circuit 221 in refresh bank address designating circuit 213 provides the count-up signal when it receives refresh cycle signal /Refcyc. Bank address counter 222 sets the count of bank address to "1". Since refreshed bank holding circuit 224 has not yet held any bank data, refresh-execution/nonexecution determining circuit 223 determines that the refresh is not yet executed, and provides the bank address "1" to first comparing circuit 225. Read/write operation bank detecting circuit 226 receives read signal READ and the bank address "3", and issues the bank address "3" to first and second comparing circuits 225 and 227. Since first comparing circuit 225 receives the two bank addresses different from each other, it sends the bank address "1" received from refresh-execution/nonexecution determining circuit 223 to refresh control circuit 211, and provides the bank address "1" to refreshed bank holding circuit 224 for holding it therein. When refresh control circuit 211 receives the bank address "1", it controls the refresh operation to be effected on bank 1.

Then, based on read signal READ externally designating bank 1, the read operation is effected on bank 1.

Then, based on read signal READ externally designating bank 2, the read operation is effected on bank 2. During the read operation of bank 2, refresh timer 212 provides refresh cycle signal /Refcyc. When OR circuit 221 in refresh bank address designating circuit 213 receives refresh cycle signal /Refcyc, OR circuit 221 provides the count-up signal. Bank address counter 222 sets the count of the bank address to "2". Since refreshed bank holding circuit 224 holds only the bank address "1", and does not hold the bank address "2", refresh-execution/nonexecution determining circuit 223 determines that the refresh is not executed, and provides the bank address "2" to first comparing circuit 225. Read/write operation bank detecting circuit 226 receives read signal READ and the bank address "2", and provides the bank address "2" to first and second comparing circuits 225 and 227. Since the received two bank addresses are the same, first comparing circuit 225 receives provides signal NEXT designating the next bank.

When OR circuit 221 receives signal NEXT designating the next bank, it provides the count-up signal. Bank address counter 222 sets the count of the bank address to "3". Since refreshed bank holding circuit 224 holds only the bank address "1", and does not hold the bank address "3", refresh-execution/nonexecution determining circuit 223 determines that the refresh is not yet executed, and provides the bank address "3" to first comparing circuit 225. Read/write operation bank detecting circuit 226 receives read signal READ and the bank address "2", and provides the bank address "2" to first and second comparing circuits 225 and 227. Since first comparing circuit 225 receives the two bank addresses different from each other, it sends the bank address "3" received from refresh-execution/nonexecution determining circuit 223 to refresh control circuit 211, and provides the bank address "3" to refreshed bank holding circuit 224 for holding it therein. When refresh control circuit 211 receives the bank address "3", it controls the operation of refreshing bank 3.

Then, the read operation is effected on bank 4 based on read signal READ externally designating bank 4.

Then, the read operation is effected on bank 1 based on read signal READ externally designating bank 1. During the read operation of bank 1, refresh timer 212 provides refresh cycle signal /Refcyc. When OR circuit 221 in refresh bank address designating circuit 213 receives refresh cycle signal /Refcyc, OR circuit 221 provides the count-up signal. Bank address counter 222 sets the count of the bank address to "4". Since refreshed bank holding circuit 224 holds only the bank addresses "1" and "3", and does not hold the bank address "4", refresh-execution/nonexecution determining circuit 223 determines that the refresh is not yet executed, and provides the bank address "4" to first comparing circuit 225. Read/write operation bank detecting circuit 226 receives read signal READ and the bank address "1", and provides the bank address "1" to first and second comparing circuits 225 and 227. Since first comparing circuit 225 receives the two bank addresses different from each other, it sends the bank address "4" received from refresh-execution/nonexecution determining circuit 223 to refresh control circuit 211, and provides the bank address "4" to refreshed bank holding circuit 224 for holding it therein. When refresh control circuit 211 receives the bank address "4", it controls the operation of refreshing bank 4.

Then, the read operation is effected on bank 3 based on read signal READ externally designating bank 3.

Then, the read operation is effected on bank 4 based on read signal READ externally designating bank 4. During the read operation of bank 4, refresh timer 212 provides refresh cycle signal /Refcyc. When OR circuit 221 in refresh bank address designating circuit 213 receives refresh cycle signal /Refcyc, OR circuit 221 provides the count-up signal. Bank address counter 222 sets the count of the bank address to "1" (and thus cyclically renews it). Since refreshed bank holding circuit 224 holds the bank addresses "1", "3" and "4", refresh-execution/nonexecution determining circuit 223 determines that the refresh is already executed, and provides signal NEXT designating the next bank.

When OR circuit 221 receives signal NEXT designating the next bank, it provides the count-up signal. Bank address counter 222 sets the count of the bank address to "2". Since refreshed bank holding circuit 224 holds the bank addresses "1", "3" and "4", and does not hold the bank address "2", refresh-execution/nonexecution determining circuit 223 determines that the refresh is not yet executed, and provides the bank address "2" to second comparing circuit 227. In this operation, the bank address "2" is provided not to first comparing circuit 225 but to second comparing circuit 227 because the bank of bank address "2" is the unrefreshed last bank among those of the bank addresses "1"-"4". Read/write operation bank detecting circuit 226 receives read signal READ and the bank address "4", and provides the bank address "4" to first and second comparing circuits 225 and 227. Since second comparing circuit 227 receives the two bank addresses different from each other, it sends the bank address "2" received from refresh-execution/nonexecution determining circuit 223 to refresh control circuit 211, and provides the bank address "2" to refreshed bank holding circuit 224 for holding it therein. When refresh control circuit 211 receives the bank address "2", it controls the operation of refreshing bank 2.

When refreshed bank holding circuit 224 holds all the bank addresses "1"-"4", it erases the bank addresses held therein, and causes bank address counter 222 to reset the count of bank address to "0".

Operation Example 2 of Refresh Bank Address Designating Circuit

Figure 8:
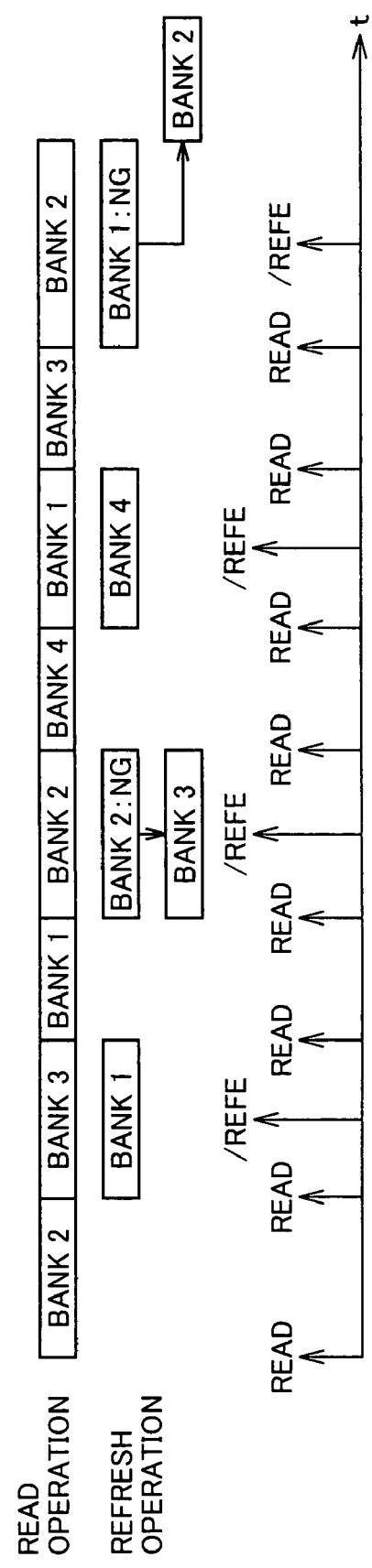
FIG. 8 illustrates another example of the operation of synchronous pseudo-SRAM 200.

FIG. 8 illustrates another example of the operation of synchronous pseudo-SRAM 200 according to the embodiment.

In the last stage of the operation example 1, if read signal READ externally designating bank 2 is input instead of read signal READ designating bank 4, processing is performed as follows.

Then, the read operation is effected on bank 2 based on read signal READ externally designating bank 2. During the read operation of bank 2, refresh timer 212 provides refresh cycle signal /Refcyc. OR circuit 221 in refresh bank address designating circuit 213 provides the count-up signal when it receives refresh cycle signal /Refcyc. Bank address counter 222 sets the count of bank address to "1" (and thus cyclically renews it). Since refreshed bank holding circuit 224 holds the bank addresses "1", "3" and "4", refresh-execution/nonexecution determining circuit 223 determines that the refresh is already executed, and provides signal NEXT designating the next bank.

When OR circuit 221 receives signal NEXT designating the next bank, it provides the count-up signal. Bank address counter 222 sets the count of the bank address to "2". Since refreshed bank holding circuit 224 holds the bank addresses "1", "3" and "4", and does not hold the bank address "2", refresh-execution/nonexecution determining circuit 223 determines that the refresh is not yet executed, and provides the bank address "2" to second comparing circuit 227.

In this operation, the bank address "2" is provided not to first comparing circuit 225 but to second comparing circuit 227 because the bank of bank address "2" is the unrefreshed last bank among those of the bank addresses "1"-"4". Read/write operation bank detecting circuit 226 receives read signal READ and the bank address "2", and provides the bank address "2" to first and second comparing circuits 225 and 227. Since second comparing circuit 227 receives the same two bank addresses, it sends the bank address "2" received from refresh-execution/nonexecution determining circuit 223 as well as an instruction to the effect that the refresh is to be performed after the end of read operation of bank 2 to refresh control circuit 211, and provides the bank address "2" to refreshed bank holding circuit 224 for holding it therein. When refresh control circuit 211 receives the bank address "2" as well as the instruction to the effect that the refresh is to be performed after the end of read operation of bank 2, refresh control circuit 211 controls the operation of refreshing bank 2 after elapsing of a predetermined time.

When refreshed bank holding circuit 224 holds all the bank addresses "1"-"4", it erases the bank addresses held therein, and causes bank address counter 222 to reset the count of bank address to "0".

According to the synchronous pseudo-SRAM of the embodiment, as described above, the bank not overlapping with the banks, on which the reading or writing is to be effected, and not yet refreshed is determined as the bank to be refreshed. Therefore, the self-refresh can be effected on the respective banks at substantially equal frequencies without delay in timing.

According to the embodiment, refreshing of all the four banks is completed by the four refresh operations such as first to fourth refresh operations or by fifth to eighth refresh operations. However, this is not restrictive. For example, such a manner may be employed that refreshing of all the four banks is completed every time the self-refresh is performed eight times. If this manner is employed in the operation example 2, the fourth operation of self-refreshing bank 2 can be performed without a delay in timing. Further, such a manner may be employed that a schedule of the bank addresses to be read can be designated on the external system side prior to read signal READ. In this case, the schedule of the bank addresses of the banks to be refreshed can be set such that the refreshing may not overlap with the schedule-designated reading of the bank addresses, and the respective banks may be refreshed equal times.

Although the operation examples of the embodiment have been described in connection with the case where the refresh request is issued during the read operation. However, similar processing can be performed in the case where the refresh request is issued during the write operation.

This embodiment is not restrictively applied to the synchronous pseudo-SRAM, and may be applied to the synchronous pseudo-SRAM, which does not operate in synchronization with the clock.

Third Embodiment

A third embodiment relates to a structure, in which a plurality of synchronous pseudo-SRAMs are accommodated in one package, and are configured to be refreshed according to the same timing.

(Structure)

Figure 9:
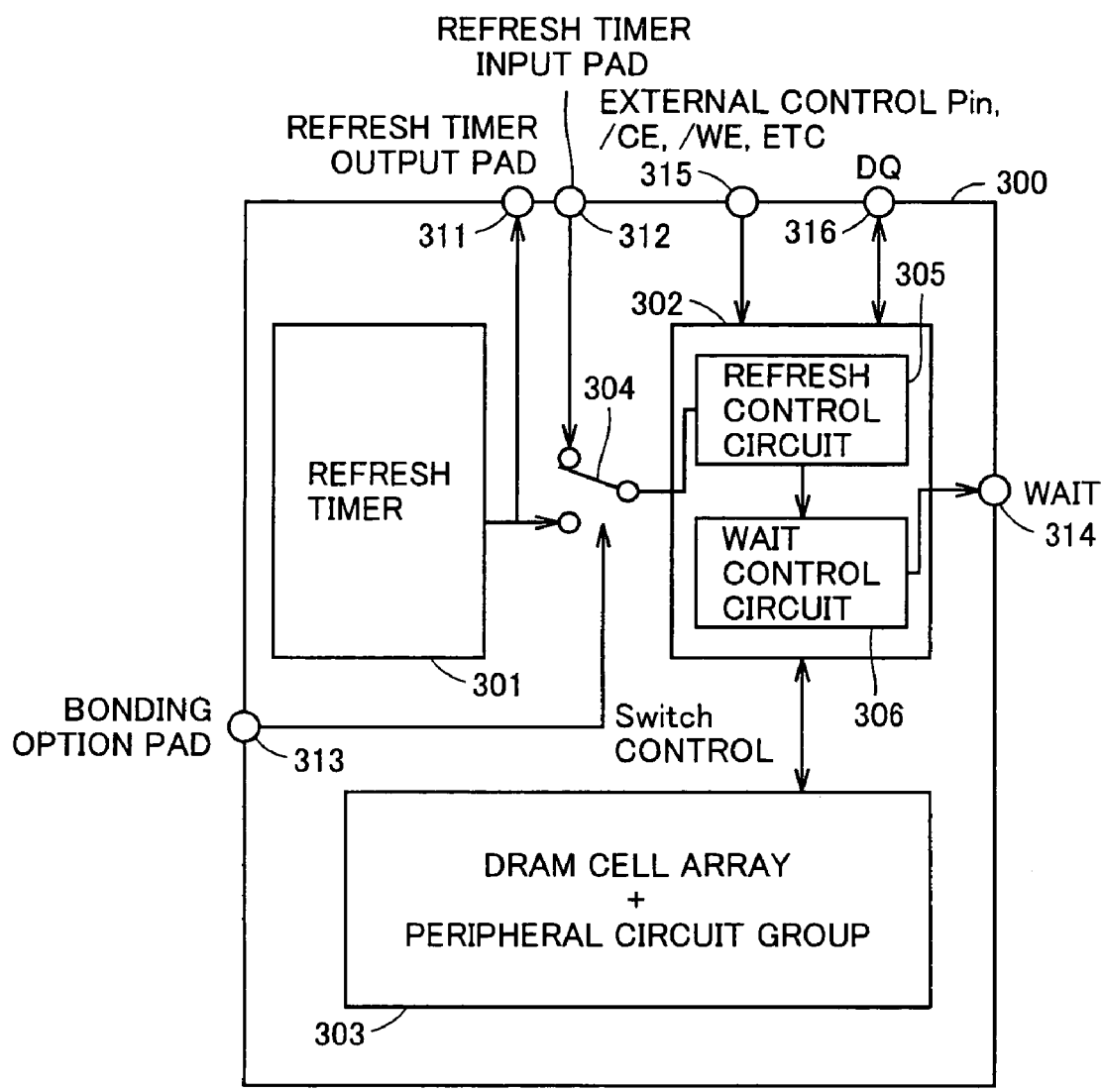
FIG. 9 shows a structure of one of synchronous pseudo-SRAMs 300 accommodated in one package according to a third embodiment.

FIG. 9 shows a structure of one of synchronous pseudo-SRAMs 300 accommodated in one package according to this embodiment. Synchronous pseudo-SRAM 300 includes a refresh timer 301, a control circuit 302 and a DRAM cell array and peripheral circuit group 303, and a switch 304.

The DRAM cell array in DRAM cell array and peripheral circuit group 303 is a memory array formed of cells of a Dynamic Random Access Memory (DRAM). The peripheral circuit group includes global I/O line pair GIOP (GIO and /GIO), column select lines provided corresponding to respective columns, column select gates, sense amplifiers, preamplifiers, a write driver, a row decoder, a column decoder and others.

Control circuit 302 receives external control signals provided via a control signal terminal 315 as well as write data provided via a data I/O terminal 316 for the DRAM cell array, and controls the whole processing of synchronous pseudo-SRAM 300 based on these received signal and data. Also, control circuit 302 provides read data read from the DRAM array via data I/O terminal 316. Control circuit 302 includes a refresh control circuit 305 and a WAIT control circuit 306.

Refresh timer 301 is formed of a ring oscillator, and provides refresh cycle signal /Refcyc, which cyclically becomes active, to switch 304 and a refresh timer output PAD 311. Refresh cycle signal /Refcyc provided to refresh timer output PAD 311 is sent to another synchronous pseudo-SRAM.

A refresh timer input PAD 312 receives refresh cycle signal /Refcyc from a refresh timer of another synchronous pseudo-SRAM.

A bonding option PAD 313 controls switch 304 according to a potential applied thereto.

Switch 304 receives refresh cycle signal /Refcyc provided from refresh timer 301 as well as refresh cycle signal /Refcyc provided from refresh timer input PAD 312. These two refresh cycle signals/Refcyc have the same period, but differ in timing from each other.

Switch 304 provides one of received refresh cycle signals /Refcyc to refresh control circuit 305 according to the potential applied to bonding option PAD 313. More specifically, when a ground potential is applied to bonding option PAD 313, switch 304 provides refresh cycle signal /Refcyc received from refresh timer input PAD 312. When a potential other than the ground potential is applied to bonding option PAD 313, switch 304 provides refresh cycle signal /Refcyc received from refresh timer 301.

Refresh control circuit 305 controls the self-refresh.

Figure 10:
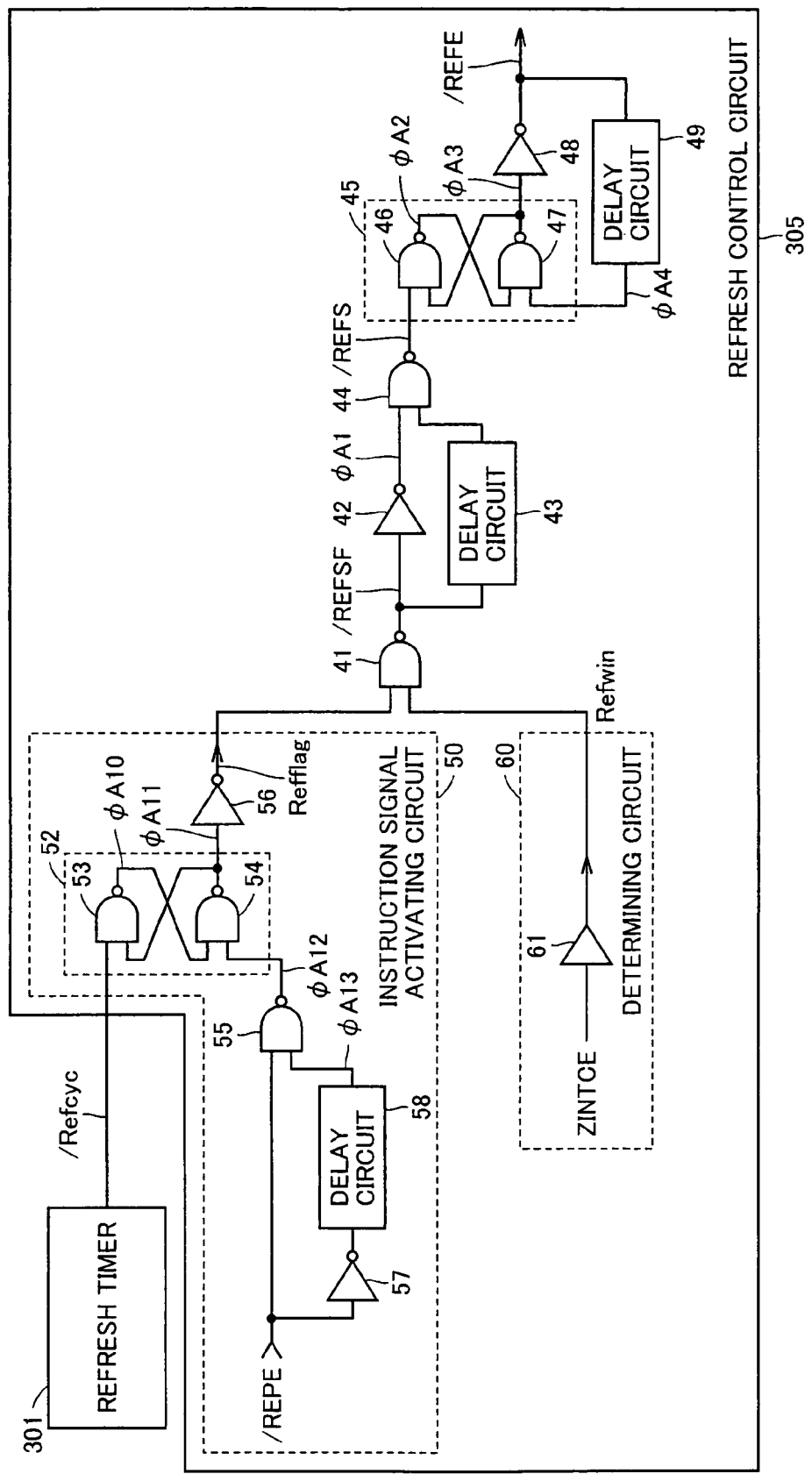
FIG. 10 shows a specific structure of a refresh control circuit 305.

FIG. 10 shows a specific structure of refresh control circuit 305. Referring to FIG. 10, refresh control circuit 305 includes an instruction signal activating circuit 50, a determining circuit 60, NAND gates 41 and 44, an inverter 42, a buffer 48, delay circuits 43 and 49, and a flip-flop 45.

Instruction signal activating circuit 50 provides refresh cycle signal /Refcyc for activating a refresh instructing signal /REFE. Determining circuit 60 provides a determining signal Refwin for determining whether refresh instructing signal /REFE activated by a refresh flag signal Refflag is to be output or not.

NAND gate 41 receives refresh flag signal Refflag and determining signal Refwin, carries out the logical AND between refresh signal flag Refflag and determining signal Refwin, and provides a signal produced by inverting a result of the AND as an inverted AND signal /REFSF.

Inverter 42 receives and inverts signal /REFSF provided from NAND gate 41 to provide a signal φA1. Delay circuit 43 receives inverted AND signal /REFSF, and delays it by a predetermined time.

NAND gate 44 receives output signal φA1 of inverter 42 and the output signal of delay circuit 43, carries out the logical AND between signal φA1 and the output signal of delay circuit 43, and inverts the result of the AND to provide a signal /REFS.

Flip-flop 45 is formed of NAND gates 46 and 47. NAND gate 46 receives signal /REFS and an output signal φA3 provided from NAND gate 47, carries out the logical AND between signal /REFS and signal φA3, and inverts the result of the AND to provide a signal φA2. NAND gate 47 receives signal φA2 provided from NAND gate 46 and a signal φA4 provided from delay circuit 49, carries out the logical AND between signals φA2 and φA4, inverts the result of the AND, and provides the result thus inverted as refresh instructing signal /REFE. The refresh operation is performed according to the activation of refresh instructing signal /REFE.

Delay circuit 49 receives refresh instructing signal /REFE provided from flip-flop 45, and delays it by a constant time to provide signal φA4.

Buffer 48 receives signal φA3, and provides refresh instructing signal /REFE.

Instruction signal activating circuit 50 includes a flip-flop 52, a NAND gate 55, inverters 56 and 57, and a delay circuit 58.

Flip-flop 52 is formed of NAND gates 53 and 54. NAND gate 53 receives refresh cycle signal /Refcyc and an output signal φA11 of NAND gate 54, carries out the logical AND between refresh cycle signal /Refcyc and signal φA11, and inverts the result of the AND to provide a signal φA10. NAND gate 54 receives output signal φA10 of NAND gate 53 and an output signal φA12 of NAND gate 55, carries out the logical AND between signals φA10 and φA12, and inverts the result of the AND to provide signal φA11.

Inverter 56 receives and inverts signal φA11 provided from flip-flop 52 to provide the inverted signal as refresh flag signal Refflag.

Inverter 57 receives and inverts refresh instructing signal /REFE. Delay circuit 58 receives refresh instructing signal /REFE inverted by inverter 57, and delays the inverted refresh instructing signal /REFE by a constant time to provide a signal φA13.

NAND gate 55 receives refresh instructing signal /REFE and signal φA13 provided from delay circuit 58, carries out the logical AND between refresh instructing signal /REFE and signal φA13, and inverts the result of the AND to provide signal φA12.

Determining circuit 60 is formed of a buffer circuit 61. Buffer circuit 61 receives internal chip enable signal ZINTCE, and provides determining signal Refwin.

Referring to FIG. 9 again, WAIT control circuit 306 keeps a WAIT signal, which is output from a WAIT terminal 314, at the level of "L" while refresh control circuit 305 is performing the refresh control.

(Package)

Figure 11:
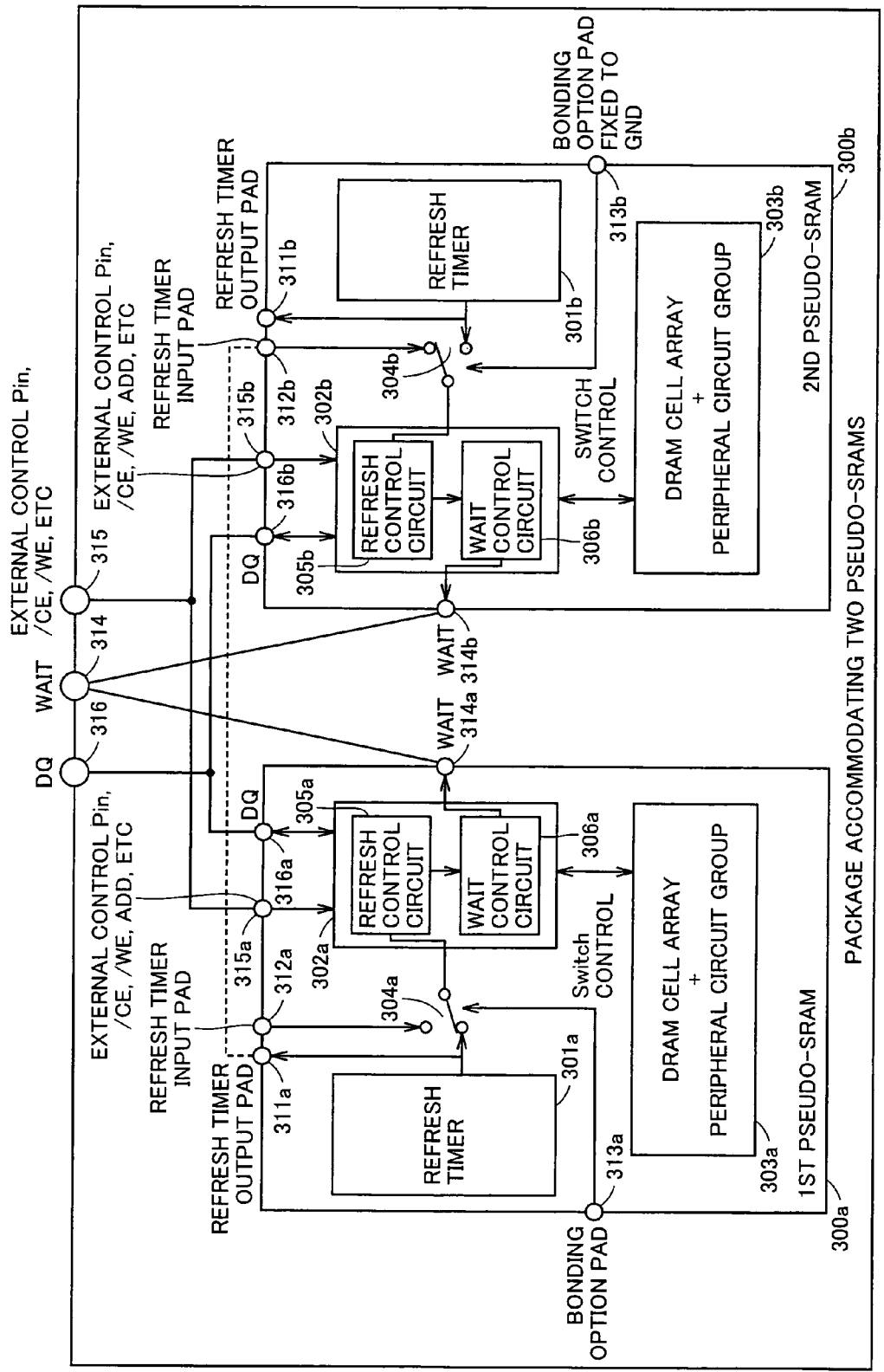
FIG. 11 shows a structure of a package accommodating two synchronous pseudo-SRAMs according to the third embodiment.

FIG. 11 shows a structure of a package accommodating two synchronous pseudo-SRAMs according to the embodiment. Referring to FIG. 11, first and second synchronous pseudo-SRAMs 300a and 300b have structures similar to that of the synchronous pseudo-SRAM shown in FIG. 9. A bonding option PAD 313a of first synchronous pseudo-SRAM 300a is open, and a switch 304a sends refresh cycle signal /Refcyc provided from a refresh timer 301a to a refresh control circuit 305a.

A bonding option PAD 313b of second synchronous pseudo-SRAM 300b is supplied with a ground potential, and a switch 304b receives refresh cycle signal /Refcyc, which is provided from refresh timer 301a of first synchronous pseudo-SRAM 300a, via a refresh timer input 312b, and provides it to a refresh control circuit 305b. Thereby, both refresh control circuits 305a and 305b operate according to refresh cycle signal /Refcyc provided from refresh timer 301a so that first and second synchronous pseudo-SRAMs 300a and 300b are refreshed according to the same timing.

A WAIT control circuit 306a provides a WAIT signal via WAIT terminals 314a and 314, and a WAIT control circuit 306b provides a WAIT signal via WAIT terminals 314b and 314. Since refresh control circuits 305a and 305b perform the refresh according to the same timing, the respective WAIT signals change to "L" according to the same timing.

In the plurality of synchronous pseudo-SRAMs, as described above, the levels of WAITs notifying that an externally instructed operation cannot be accepted due to refreshing, which is being performed, can be changed according to the same timing.

Although the embodiment has been described in connection with an example of the package including the two synchronous pseudo-SRAMs, the plurality of synchronous pseudo-SRAMs more than one may be packaged.

In this embodiment, the plurality of synchronous pseudo-SRAMs shares refresh cycle signal /Refcyc, output their own refresh cycle signal /Refcyc via refresh timer output PADs, respectively, and each receive refresh cycle signal /Refcyc of the other synchronous pseudo-SRAM via the refresh timer input PAD. However, this is not restrictive. For example, the plurality of synchronous pseudo-SRAMs may share refresh flag signal Refflag, inverted AND signal /REFSF or refresh instructing signal /REFE, and may operate to transmit and receive these signal via refresh timer output PAD and refresh timer input PAD.

According to the embodiment, each of the synchronous pseudo-SRAMs provides the WAIT signal. However, this is not restrictive. For example, switches, which can be controlled by bonding option PADs, may be arranged between WAIT control circuit 306a and WAIT terminal 314a and between WAIT control circuit 306b and WAIT terminal 314b, respectively. These switches may be controlled such that only one of the switches connects the WAIT terminal and the WAIT control circuit, and thereby only one of the synchronous pseudo-SRAMs may output the WAIT signal.

Further, in a certain case, the plurality of synchronous pseudo-SRAMs do not output the WAIT signal, i.e., in the case where the timing of the self-refresh overlaps with the timing of externally applied read signal READ or write signal WRITE, read signal READ or write signal WRITE is held, and the read operation or the write operation will be performed after the end of the self-refresh. In this case, the plurality of synchronous pseudo-SRAMs may share only refresh cycle signal /Refcyc. Thus, the control of WAIT is not performed. Even in this case, since the plurality of synchronous pseudo-SRAMs performs the refresh at the same time, such a certain effect can be achieved that interference between signals can be suppressed.

This embodiment is not restrictively applied to the synchronous pseudo-SRAM, and may be applied to various synchronous pseudo-SRAM operating in synchronization with clocks.

Fourth Embodiment

A fourth embodiment relates to a synchronous pseudo-SRAM performing burst read/write in such a manner that several bits starting from the leading bit are read or written according to a first clock, at which the read or write signal is produced, and the remaining bits are read or written according to the second or later clocks defined by a command latency CL.

(Structure)

Figure 12:
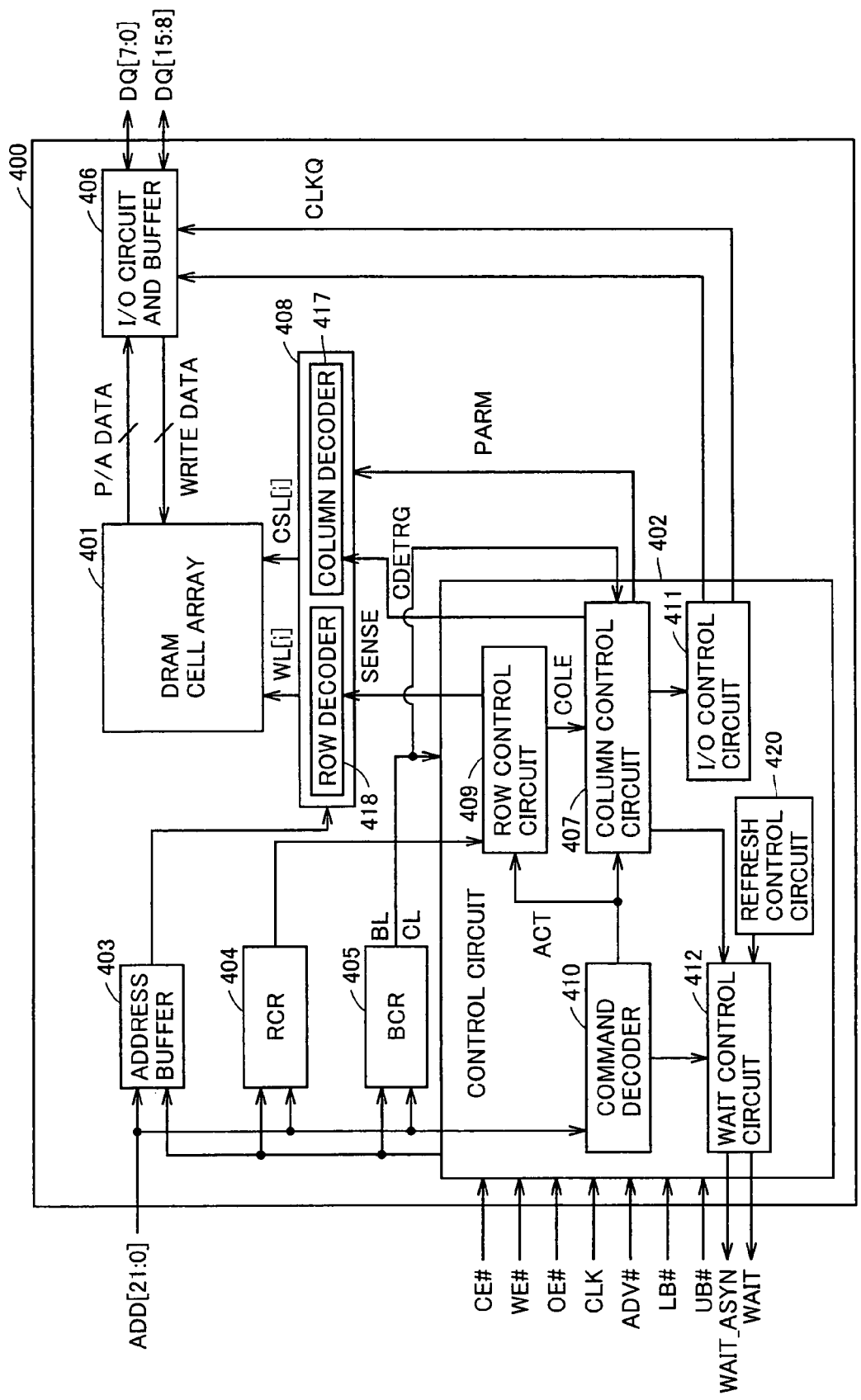
FIG. 12 shows a structure of a synchronous pseudo-SRAM 400 according to a fourth embodiment.

FIG. 12 shows a structure of a synchronous pseudo-SRAM 400 according to the embodiment. Referring to FIG. 12, synchronous pseudo-SRAM 400 includes a DRAM cell array 401, a control circuit 402, an address buffer 403, a RCR (Refresh Configuration Register) 404, a BCR (Bus Configuration Register) 405, and an I/O circuit and buffer 406.

DRAM cell array 401 is a memory array formed of cells of a Dynamic Random Access Memory (DRAM).

I/O circuit and buffer 406 performs input/output of data from and to an external system side via a data I/O terminal DQ. I/O circuit and buffer 406 provides data, which is output from the DRAM cells, in synchronization with a clock signal CLKQ applied from an I/O control circuit 411.

RCR 404 defines a manner of self-refresh.

BCR 405 stores an interface to the external systems, and thus stores, e.g., a burst length BL and command latency CL.

Address buffer 403 receives an external address signal ADD[21:0], and produces an internal address signal. According to the synchronous pseudo-SRAM, address buffer 403 takes in external address signal ADD[21:0] when an external address take-in signal ADV# is at "L". External address take-in signal ADV# attains "L" according to timing earlier than that of production of read signal READ or write signal WRITE. External address signal ADD[21:0] thus applied includes not only a row address but also a column address. Therefore, the row and column addresses are obtained prior to the production of read or write signal READ or WRITE.

As described above, since not only the row address but also the column address are obtained prior to production of the read or write signal READ or WRITE, the column access can be started after the row access without waiting for the input of the clock defined by command latency CL. This embodiment utilizes the above features, and the column access processing for reading the data from the leading column in the burst access is performed according to the clock (first clock), at which read or write signal READ or WRITE is produced. Also, column access processing for reading the data from the remaining columns in the burst access is performed according to a clock (second clock) defined by command latency CL.

Control circuit 402 includes a command decoder 410, an I/O control circuit 411, a row control circuit 409, a column control circuit 407, a WAIT control circuit 412 and a refresh control circuit 420.

Command decoder 410 produces row activating signal ACT, read signal READ and write signal WRITE according to a combination of logical levels of the internal control signals produced from the external control signals.

Figure 13:
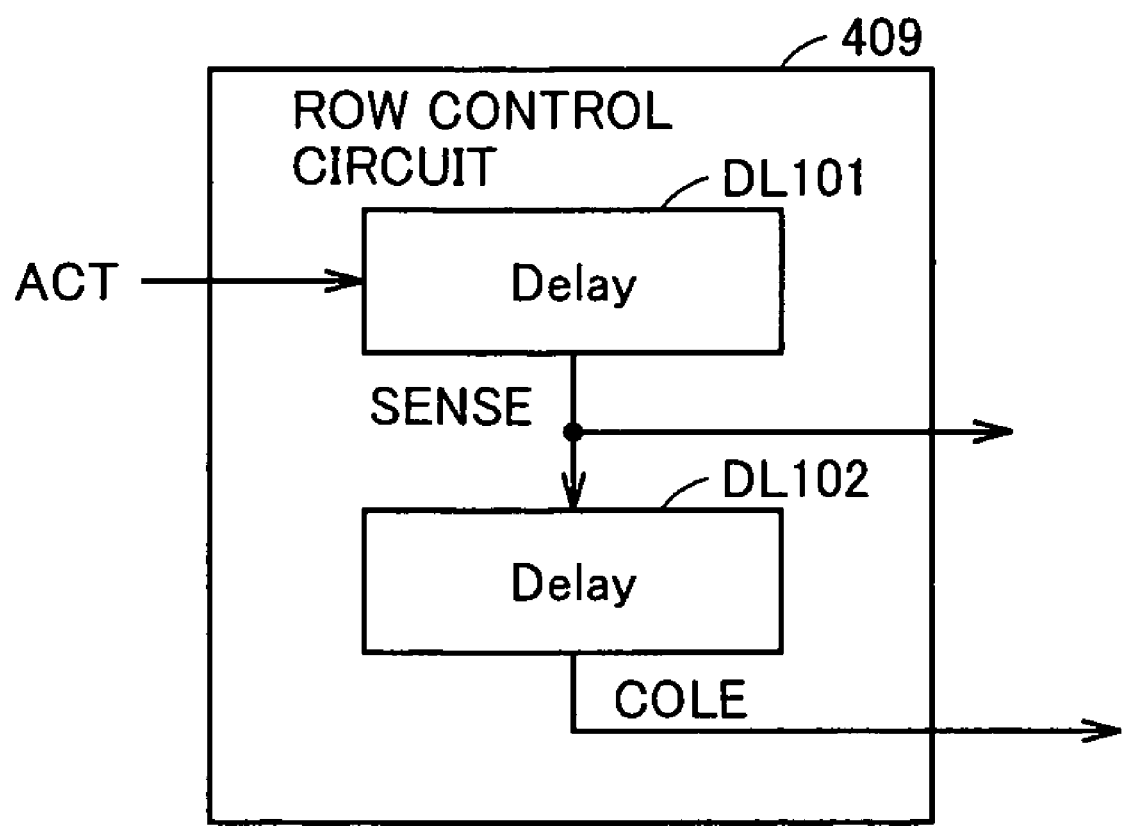
FIG. 13 shows a structure of a row control circuit 409.

Row control circuit 409 produces a column enable signal COLE as well as a sense amplifier activating signal SENSE activating the sense amplifier, which is connected to a bit line pair BL and ZBL arranged between the memory cells and global bit line pair GIO and ZGIO. FIG. 13 shows a structure of a row control circuit 409. Referring to FIG. 13, a delay circuit (Delay) DL101 receives row activating signal ACT to be activated in response to the rising of a first clock CLK0, i.e., a clock, at which read signal READ or write signal WRITE is produced. Delay circuit (Delay) DL101 provides sense amplifier activating signal SENSE by delaying row activating signal ACT. A delay circuit (Delay) DL102 receives sense amplifier activating signal SENSE, and produces column enable signal COLE by delaying sense amplifier activating signal SENSE.

Figure 14:
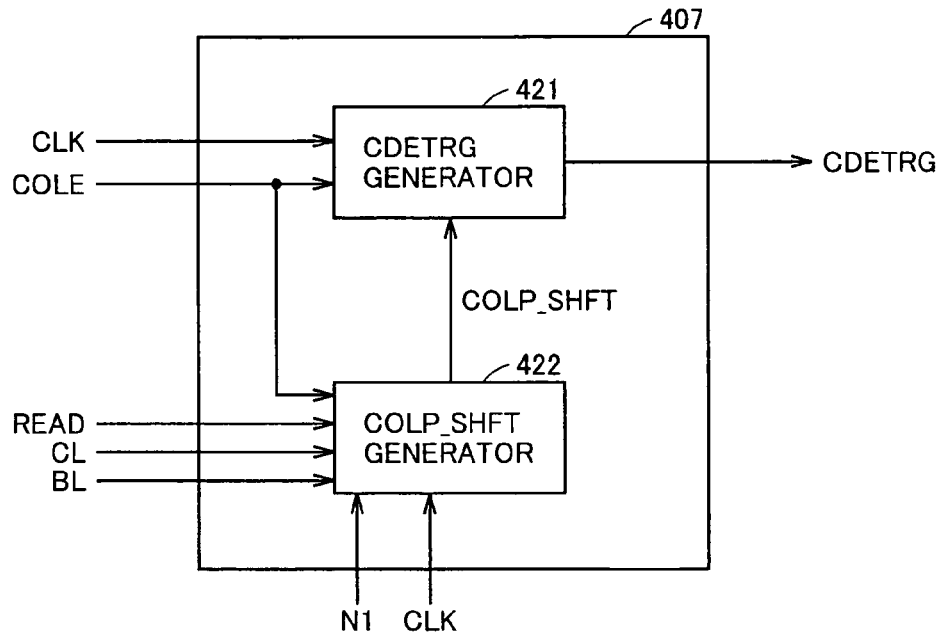
FIG. 14 shows a structure of a column control circuit 407.

Column control circuit 407 produces a preamplifier activating signal PRAM activating the preamplifier connected to global bit line pair GIO and ZGIO, and also produces a column decoder activation trigger signal CDETRG. FIG. 14 fragmentarily shows a structure of column control circuit 407. Referring to FIG. 14, column control circuit 407 includes a COLP_SHFT generator 422 and a CDETRG generator 421.

COLP_SHFT generator 422 produces a column shift signal COLP_SHFT based on external clock CLK, read signal READ (or write signal WRITE) and command latency CL as well as a number N1 (equal to one in this embodiment) of a bit(s) read at first clock CLK0, i.e., a clock, at which read signal READ (or write signal WRITE) is produced, and burst length BL. Thus, COLP_SHFT generator 422 activates column shift signal COLP_SHFT in accordance with falling of a (CL−N1)th clock CLK after the clock, at which read signal READ (or write signal WRITE) is produced. Also, COLP_SHFT generator 422 deactivates column shift signal COLP_SHFT in accordance with the fact that the count of the burst length counter attains burst length BL.

CDETRG generator 421 produces column decoder activation trigger signal CDETRG based on column shift signal COLP_SHFT, external clock CLK and column enable signal COLE.

Figure 15:
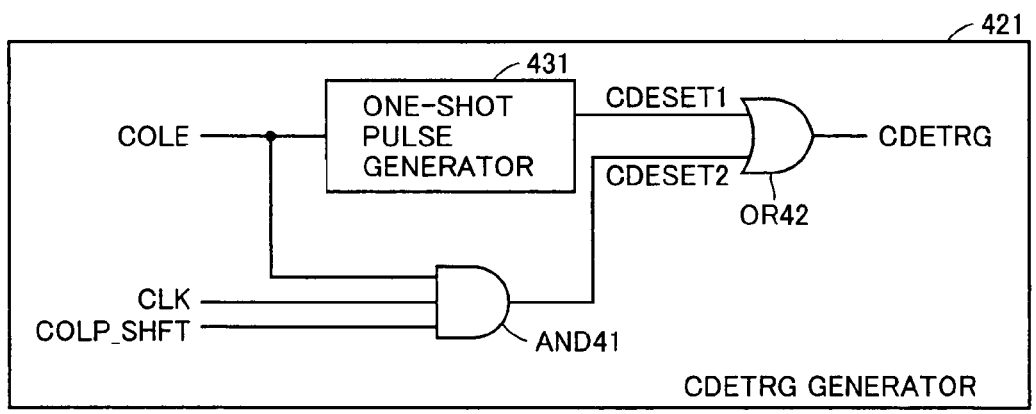
FIG. 15 shows a specific structure of a CDETRG generating circuit 421.

FIG. 15 shows a specific structure of CDETRG generator 421. Referring to FIG. 15, CDETRG generator 421 includes a one-shot pulse generator 431, an AND circuit AND41 and an OR circuit OR42. One-shot pulse generator 431 produces a one-shot pulse at a level of "H" in response to the rising of column enable signal COLE. This one-shot pulse forms a signal activating the first column to be accessed in synchronization with first clock CLK0.

AND circuit AND41 provides a clock pulse at the level of "H" when column enable signal COLE is at "H" and COLP_SHFT is at "H". This clock pulse forms a signal activating second to fourth columns to be accessed in synchronization with second clock CLK2 and subsequent clocks.

OR circuit OR42 combines the one-shot pulse provided from one-shot pulse generator 431 and the clock pulse provided from AND circuit AND41. The pulse thus combined forms a pulse of column decoder activation trigger signal CDETRG.

Figure 16:
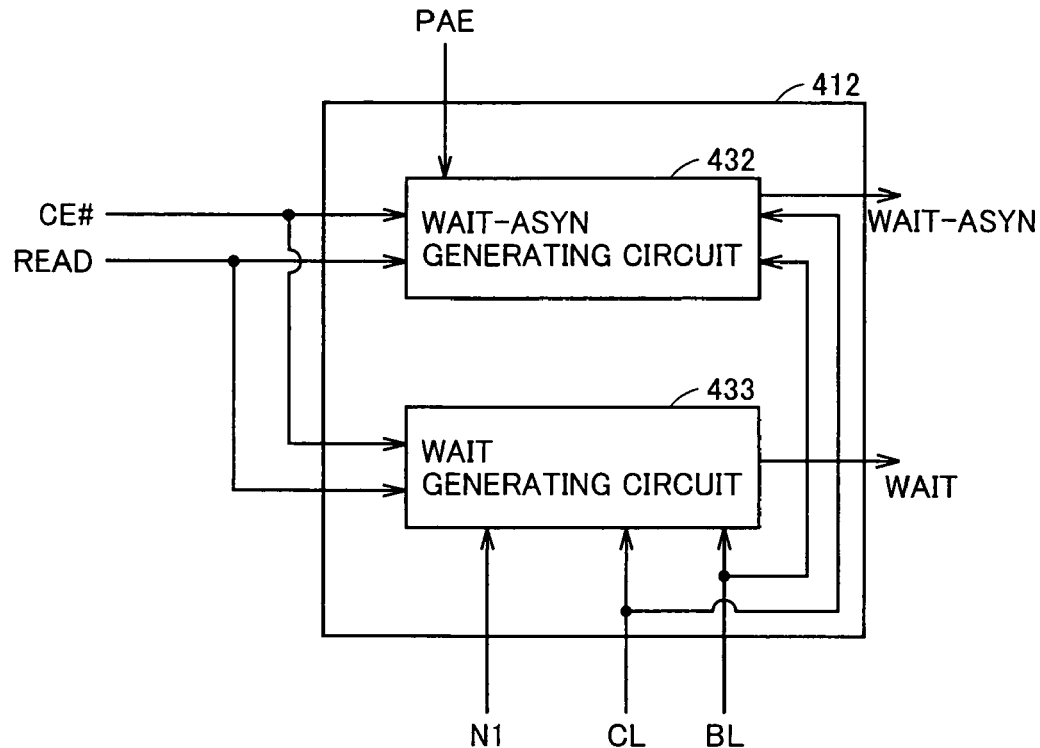
FIG. 16 shows a structure of a WAIT control circuit 412.

FIG. 16 shows a structure of WAIT control circuit 412. Referring to FIG. 16, WAIT control circuit 412 includes a WAIT_ASYN generating circuit 432 and a WAIT generating circuit 433.

WAIT_ASYN generating circuit 432 sets the WAIT_ASYN signal to "L" in response to the fact that read signal READ or write signal WRITE is provided from command decoder 410 and external chip enable signal CE# is active and thus at "L". Then, WAIT_ASYN generating circuit 432 sets the WAIT_ASYN signal to "H" after elapsing of a predetermined time, which is required for outputting data D0 of the first or leading bit from data output terminal DQ after reception of a preamplifier activating signal PAE. Thereafter, WAIT_ASYN generating circuit 432 sets the WAIT_ASYN signal to "Hi-Z" in response to deactivation of external chip enable signal CE#.

WAIT generating circuit 433 sets the WAIT signal to "L" in response to the fact that read signal READ or write signal WRITE is input from command decoder 410, and external chip enable signal CE# is active and thus at "L". Then, WAIT generating circuit 433 activates the WAIT signal to attain "H" after it receives the clocks equal in number to ((CL−1)+(number N1 of bits to be read at first clock CLK0, i.e., the clock, at which read signal READ or write signal WRITE is produced)). Thereafter, WAIT generating circuit 433 sets the WAIT signal to "Hi-Z" in response to the deactivation (i.e., "H") of external chip enable signal CE#.

Timing of WAIT Signal of Synchronous Pseudo-SRAM in the Background Art

Figure 17:
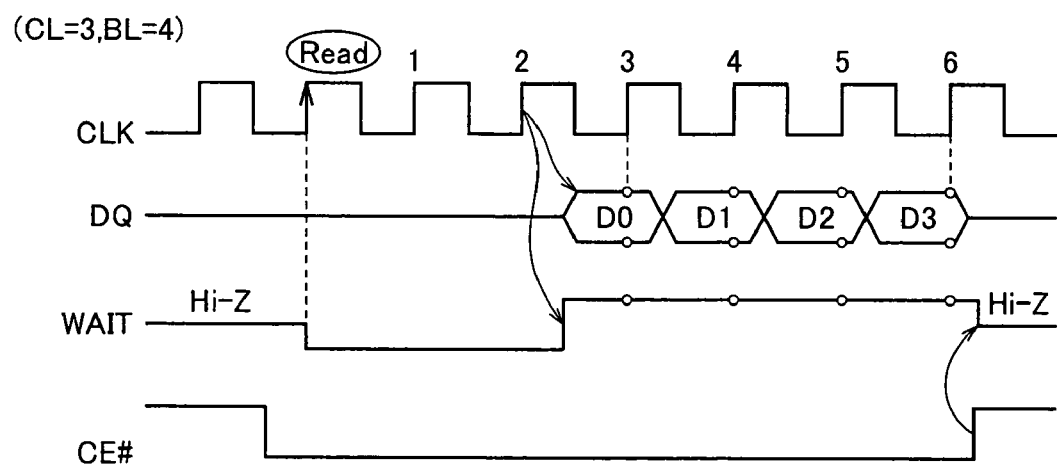
FIG. 17 illustrates timing of a WAIT signal of a synchronous pseudo-SRAM in a background art.

FIG. 17 illustrates timing of the WAIT signal of the synchronous pseudo-SRAM in the prior art. As illustrated in FIG. 17, the WAIT signal attains "L" in response to the fact that read signal READ is input and external chip enable signal CE# is active and thus at "L". Then, the WAIT signal attains "H" after receiving the clocks of (CL−1) in number, where CL is equal to 3. Then, the WAIT signal attains "Hi-Z" in response to the deactivation (i.e., setting to "H") of external chip enable signal CE#.

Figure 18:
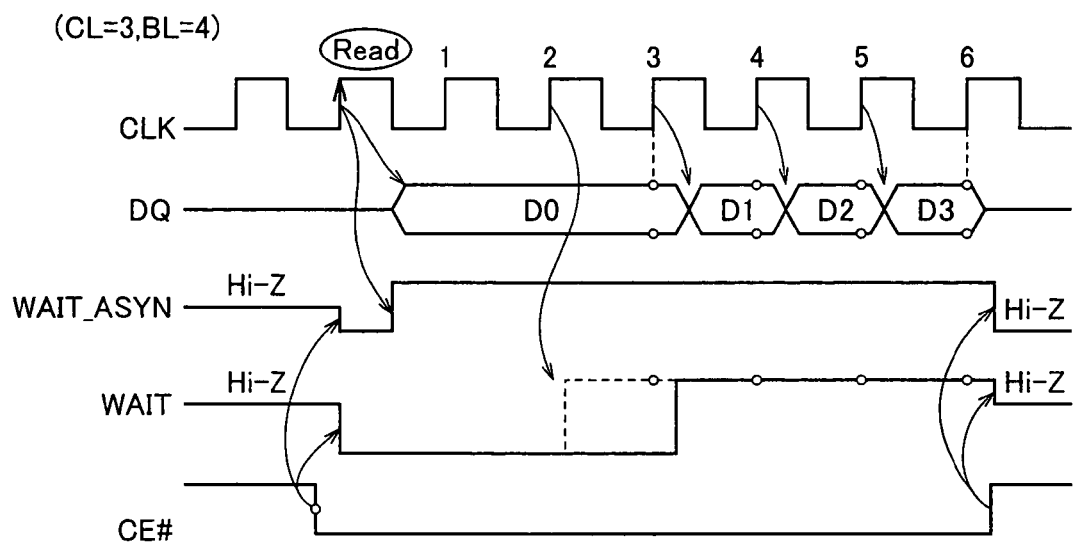
FIG. 18 illustrates timing of a WAIT_ASYN signal and a WAIT signal of synchronous pseudo-SRAM 400 according to a fourth embodiment.

Timing of WAIT_ASYN Signal and WAIT Signal of Synchronous Pseudo-SRAM 400 of the Embodiment FIG. 18 illustrates timing of the WAIT_ASYN signal and WAIT signal of synchronous pseudo-SRAM 400 of the embodiment. As illustrated in FIG. 18, the WAIT_ASYN signal attains "L" in response to the fact that read signal READ is input and external chip enable signal CE# is active and thus at "L". Then, the WAIT_ASYN signal attains "H" after elapsing of a predetermined time, which is required for outputting data D0 of the leading bit from data output terminal DQ after preamplifier activating signal PAE is received. Thereby, it is possible to notify the external system side of the timing of output of data D0 of the leading bit, which is column-accessed according to clock CLK0. Then, the WAIT_ASYN signal attains "Hi-Z" in response to the deactivation (i.e., setting to "H") of external chip enable signal CE#.

As illustrated in FIG. 18, the WAIT signal attains "L" in response to the fact that read signal READ is input and external chip enable signal CE# is active and thus at "L". Then, the WAIT signal attains "H" after receiving the clocks of (CL−1+N1) in number, where CL is equal to 3 and N1 is equal to one. Thereby, it is possible to notify the external system side of the timing of output of data D1 of the leading bit, which is column-accessed according to the clock determined based on command latency CL. Then, the WAIT signal attains "Hi-Z" in response to the deactivation (i.e., setting to "H") of external chip enable signal CE#.

Referring to FIG. 12 again, a peripheral circuit group 408 includes a row decoder 418, a column decoder 417, sense amplifiers (not shown) and preamplifiers (not shown).

Row decoder 418 activates the selected word line.

Figure 19:
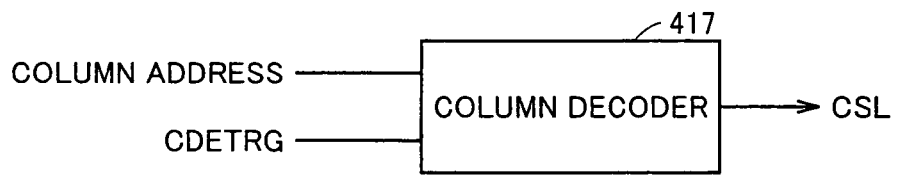
FIG. 19 shows a structure of a column decoder 417.

FIG. 19 shows a structure of column decoder 417. As shown in FIG. 19, when column decoder activation trigger signal CDETRG becomes active, column decoder 417 activates a column select signal CSL corresponding to the column address applied thereto.

The sense amplifier, which is not shown, is a first amplifier circuit, and amplifies a potential difference between paired bit lines BL and ZBL.

The preamplifier, which is not shown, is a second amplifier circuit, and increases a potential difference between paired global bit lines GIO and ZGIO connected to the plurality of paired bit lines BL and ZBL.

Refresh control circuit 420 in FIG. 12 controls the self-refresh operation of the DRAM cell array based on an internal refresh timer (not shown).

Operation of Synchronous Pseudo-SRAM of the Embodiment

Figure 20:
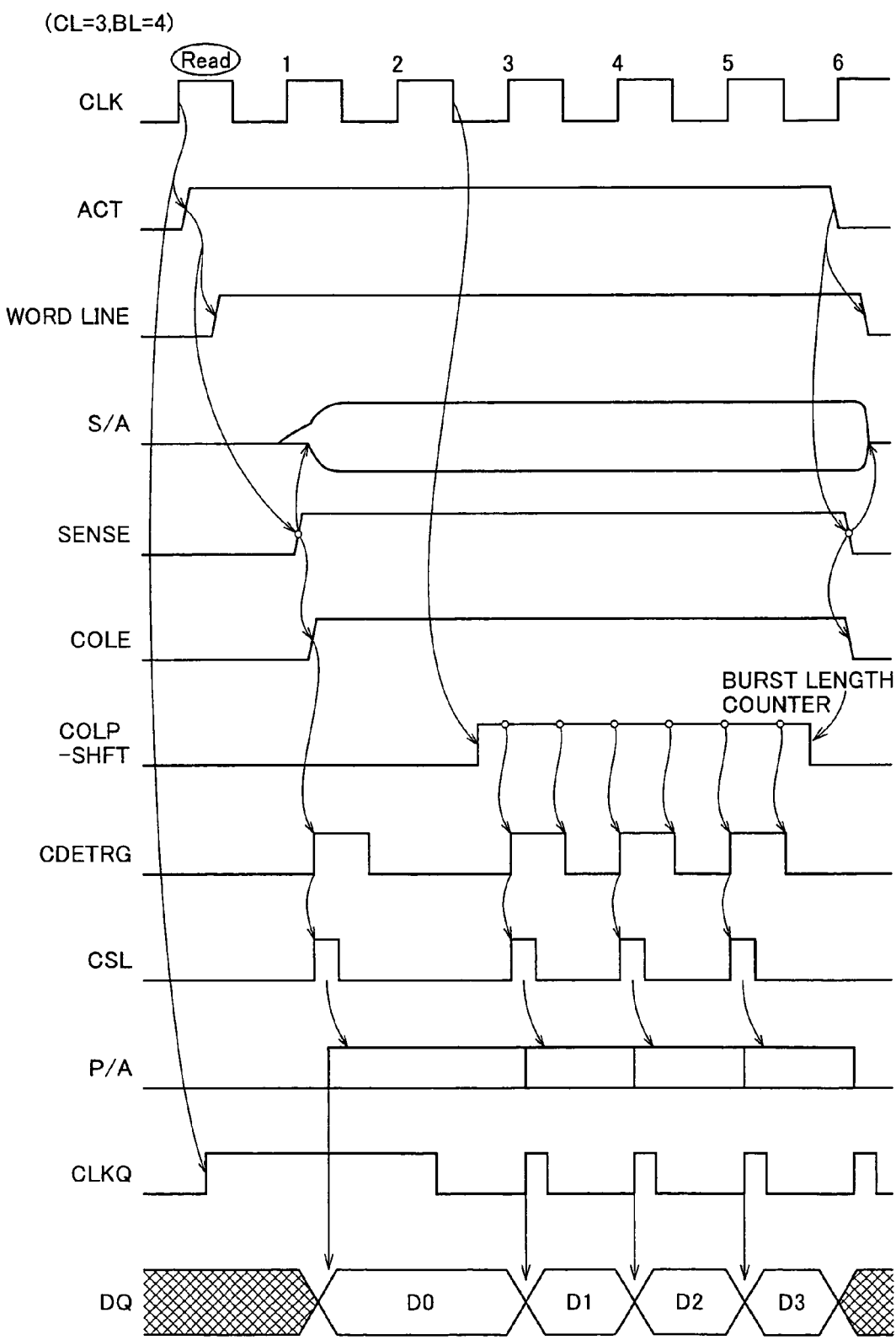
FIG. 20 is a timing chart illustrating an operation of synchronous pseudo-SRAM according to the fourth embodiment.

FIG. 20 is a timing chart illustrating an operation of the synchronous pseudo-SRAM of the embodiment. Referring to FIG. 20, row access processing is performed as follows in synchronization with the rising of clock CLK0 (first clock), at which read signal READ is produced.

Command decoder 410 provides a row activating signal ACT, which is activated in synchronization with clock CLK0.

Row decoder 418 selects and activates the word line based on the row address sent from address buffer 403.

Row control circuit 409 activates sense amplifier enable signal SENSE with a delay from row activating signal ACT. Thereby, the sense amplifier (not shown) in peripheral circuit group 408 amplifies the potentials on the bit line pair.

Row control circuit 409 activates column enable signal COLE with a delay from sense amplifier activating signal SENSE.

Then, column access processing is effected on the first column in synchronization with the rising of first clock CLK0.

CDETRG generator 421 produces a one-shot pulse at the rising of column enable signal COLE. This forms the first pulse of column decoder activation trigger signal CDETRG.

Column decoder 417 activates column select signal CSL corresponding to the column address of the first column applied thereto in accordance with the first pulse of column decoder activation trigger signal CDETRG.

The potentials on the bit line pair of the first column selected by column select signal CSL are sent to the preamplifier (not shown) in peripheral circuit group 408, and are amplified thereby.

The data of the first column amplified by the preamplifier is sent to the I/O circuit and buffer 406. I/O control circuit 411 receives external clock CLK, and provides internal clock signal CLKQ. In response to the rising of first clock CLK0, the pulse of leading clock signal CLKQ is produced.

I/O circuit and buffer 406 externally provides data D0, which is provided from the first column, via data output terminal DQ in synchronization with clock signal CLKQ.

Then, the column access processing is effected on the second to fourth columns in synchronization with the clocks starting from (CL−N1)th clock (i.e., second clock CLK2) after first clock CLK0.

COLP_SHFT generator 422 activates column shift signal COLP_SHFT in accordance with the falling of clock CLK2 (second clock), and deactivates column shift signal COLP_SHFT in accordance with the fact that the count of the burst length counter attains burst length BL.

CDETRG generator 421 extracts three clock pulses included in a period of "H" of column shift signal COLP_SHFT. These clock pulses form second to fourth pulses of column decoder activation trigger signal CDETRG, respectively.

Column decoder 417 activates column select signal CSL corresponding to the received column addresses of the second to fourth columns in accordance with the second to fourth pulses of column decoder activation trigger signal CDETRG.

The potentials on the bit line pairs of the second to fourth columns selected by column select signal CSL are sent to the preamplifier (not shown), and are amplified.

The data of the second to fourth columns amplified by the preamplifier are sent to I/O circuit and buffer 406. I/O control circuit 411 receives externally applied clock signal CLK, and provides internal clock signal CLKQ. The timing of the second to fourth pulses of clock signal CLKQ is ordinary timing.

I/O circuit and buffer 406 externally provide data D1-D3, which are provided from the second to fourth columns, via output terminal DQ in synchronization with second to fourth pulses of clock signal CLKQ, respectively.

According to the synchronous pseudo-SRAM of the embodiment, as described above, since the data is output according to the timing earlier than that defined by command latency CL, the system side can receive the data early, and can starts the processing early. Also, it is possible to reduce a time, for which the bus is unfixed.

According to the embodiment, one data is output in synchronization with first clock CLK0. However, this is not restrictive, and two or three data may be output in synchronization with first clock CLK0. The number of data, which are output in synchronization with first clock CLK0, can be determined depending on conditions or the like on the system side.

According to the embodiment, the WAIT_ASYN signal attains "Hi-Z" in response to "H" (i.e., deactivation) of external chip enable signal CE#. However, this is not restrictive. For example, the WAIT_ASYN signal may attain "Hi-Z" in response to "H" of the WAIT signal.

Number N1 of bit(s) read at first clock CLK0 may be a fixed value, or may be set in a register by an external signal.

According to the embodiment, since number N1 of bit(s) read at first clock CLK0 is one, one-shot pulse generator 431 is used to produce the signal, which activates one column to be accessed in synchronization with first clock CLK0. In the case where N1 is larger than one, processing can be performed by adding a circuit, which provides pulses of N1 in number formed of one-shot pulses shifted by one cycle from each other.

Figure 21:
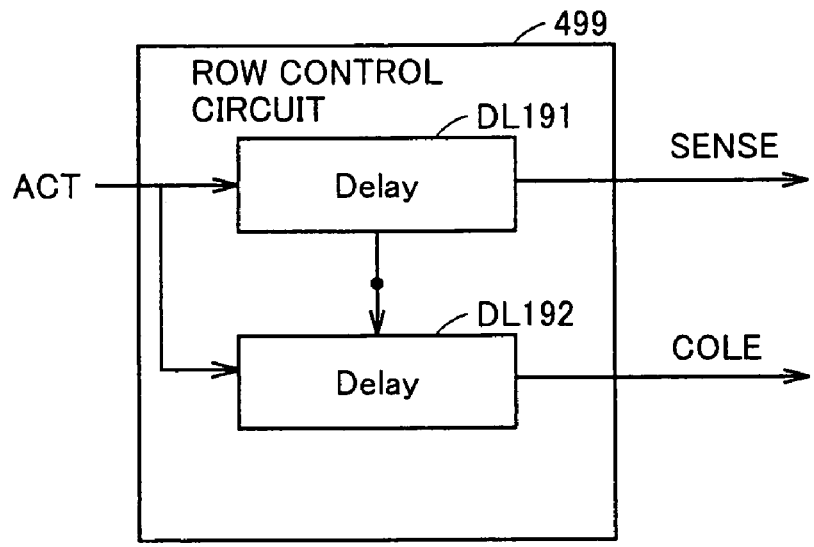
FIG. 21 shows a structure of a row control circuit 499.

The row control circuit is not restricted to that shown in FIG. 13, and may have a structure shown in FIG. 21. Referring to FIG. 21, delay circuits (Delay) DL191 and DL192 receive row activating signal ACT activated in response to the rising of first clock CLK0, i.e., clock, at which read signal READ or write signal WRITE is produced. Delay circuit (Delay) DL191 provides sense amplifier activating signal SENSE produced by delaying row activating signal ACT. Delay circuit (Delay) DL192 provides column enable signal COLE produced by delaying row activating signal ACT.

This embodiment is not restrictively applied to the synchronous pseudo-SRAM, and may be applied to various semiconductor memory devices such as a flash memory operating in synchronization with clocks. In particular, the embodiment can be appropriately applied to the synchronous pseudo-SRAMs, which are strongly required to achieve high packaging densities and fast operations.

The operation example of this embodiment has been described in connection with the case where the external signal produces read signal READ. However, the device operates similarly when the external signal produces write signal WRITE.

Modification of Fourth Embodiment

This modification relates to a synchronous pseudo-SRAM operating as follows. Even when read signal READ or write signal WRITE is produced during the refresh operation, the burst read and write are performed similarly to the fourth embodiment. More specifically, several bits starting from the leading bit are read/written according to the first clock, and the remaining bits are read/written according to the second and following clocks defined by command latency CL.

According to this modification, a command shift circuit 480 is added to control circuit 402 of the fourth embodiment for dealing with the situation, in which read signal READ or write signal WRITE is produced during the refresh operation.

Figure 22:
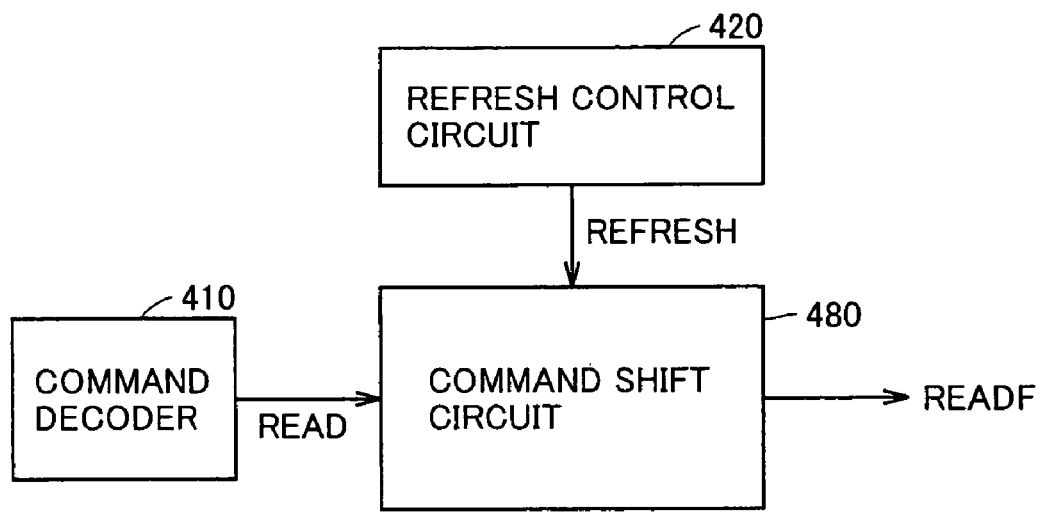
FIG. 22 illustrates input and output signals of a command shift circuit 480.

FIG. 22 illustrates I/O signals of command shift circuit 480. Command shift circuit 480 receives read signal READ provided from command decoder 410 and refresh operation signal REFRESH provided from refresh control circuit 420, and provides a corrected read signal READF. Corrected read signal READF is sent to the circuits, which receive read signal READ in the foregoing structures, instead of read signal READ.

Figure 23:
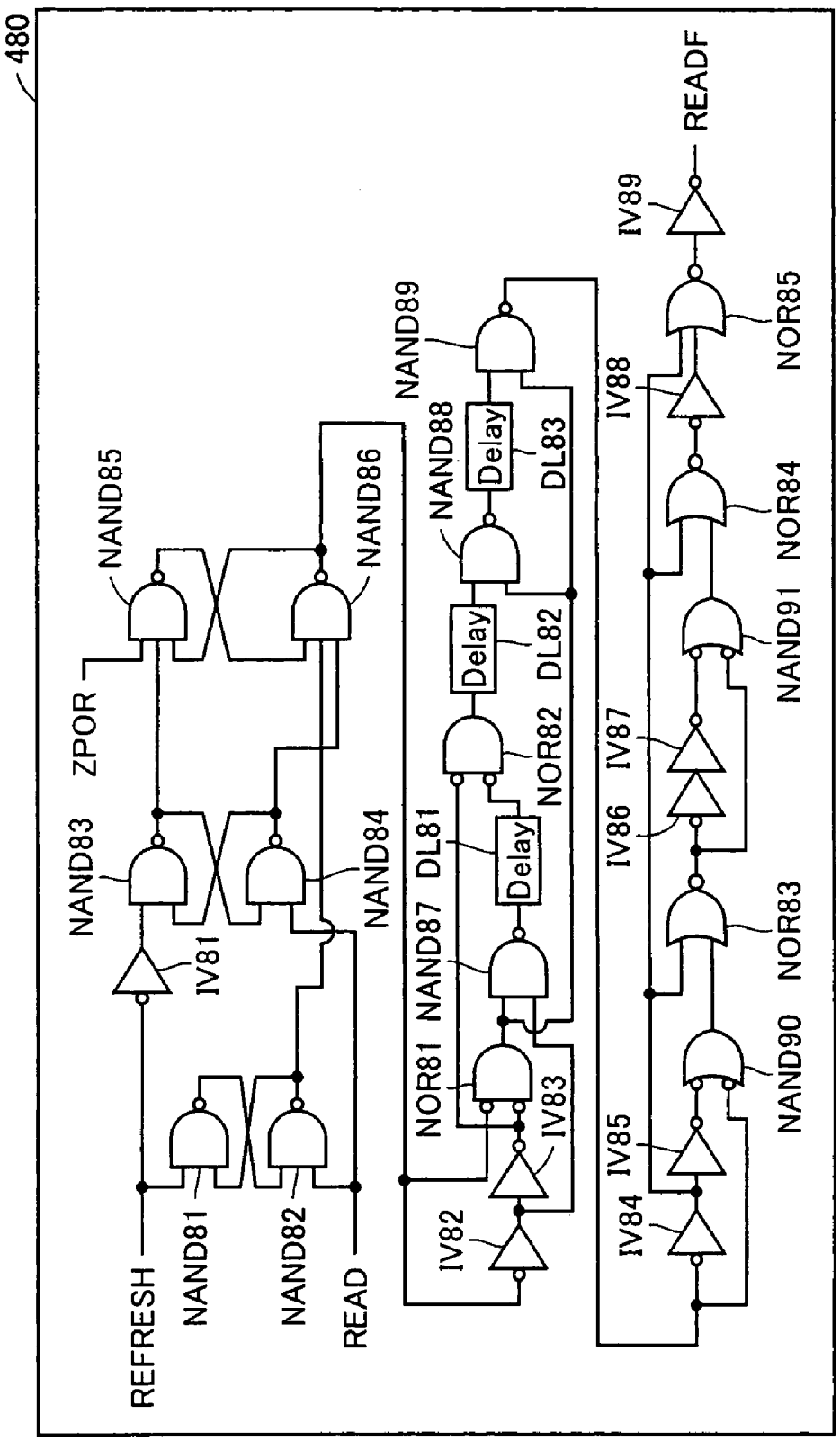
FIG. 23 shows a specific structure of command shift circuit 480.

FIG. 23 shows a specific structure of command shift circuit 480. Referring to FIG. 23, a NAND circuit NAND81 receiving refresh operation signal REFRESH and a NAND circuit NAND82 receiving read signal READ form a flip-flop. An inverter IV81 inverts refresh operation signal REFRESH.

A NAND circuit NAND83 receiving the output of inverter IV81 and a NAND circuit NAND84 receiving read signal READ form a flip-flop.

A NAND circuit NAND85, which receives the output of NAND circuit NAND83 and a reset signal ZPOR, and a NAND circuit NAND86 receiving outputs of NAND circuits NAND82 and NAND84 form a flip-flop. Reset signal ZPOR becomes active to attain "H" in response to turn-on of the power.

An inverter IV82 receives the output of NAND circuit NAND86. An inverter IV83 receives the output of inverter IV82. A NOR circuit NOR81 receives the outputs of NAND circuit NAND86 and inverter IV83.

A NAND circuit NAND87 receives the outputs of NOR circuit NOR81 and inverter IV82. Delay circuit DL81 delays the output of NAND circuit NAND87. A NOR circuit NOR82 receives the outputs of inverter IV83 and delay circuit DL81. Delay circuit DL82 delays the output of NOR circuit NOR82.

A NAND circuit NAND88 receives the outputs of delay circuit DL82 and NOR circuit NOR81. A delay circuit DL83 delays the output of NAND circuit NAND83. A NAND circuit NAND89 receives the outputs of delay circuit DL83 and NOR circuit NOR81.

An inverter IV84 receives the output of NAND circuit NAND89. An inverter IV85 receives the output of inverter IV84. A NAND circuit NAND90 receives the outputs of inverter IV85 and NAND circuit NAND89. A NOR circuit NOR83 receives the outputs of NAND circuit NAND90 and inverter IV84. An inverter IV86 inverts the output of NOR circuit NOR83. An inverter IV87 inverts the output of inverter IV86.

A NAND circuit NAND91 receives the outputs of NOR circuit NOR83 and inverter IV87. NOR circuit NOR84 receives the outputs of NAND circuit NAND91 and inverter IV84. An inverter IV88 inverts the output of NOR circuit NOR84. NAND circuit NAND85 receives the outputs of inverters IV84 and IV88. An inverter IV89 inverts the output of NAND circuit NAND85 to provide corrected read signal READF.

Figure 24A:
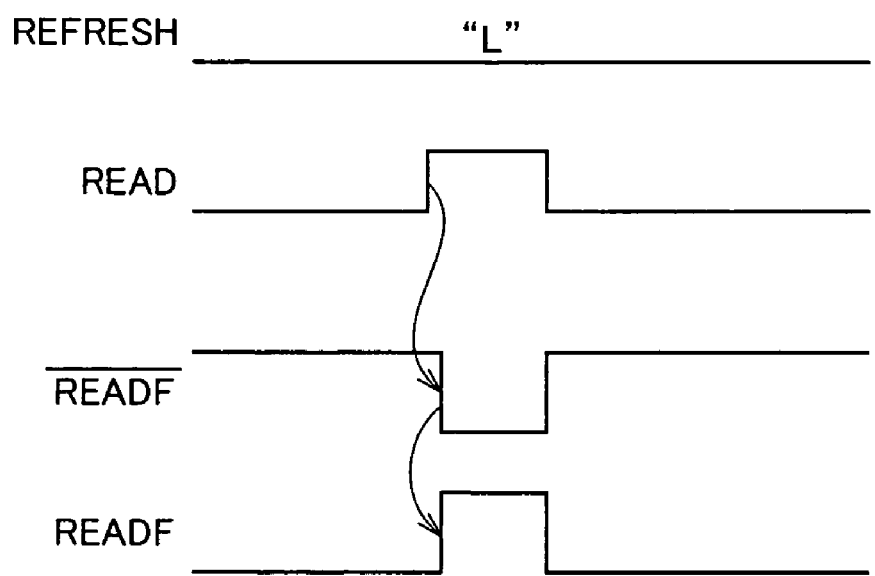
FIG. 24A illustrates a corrected read signal READF appearing when a read signal READ is input while a refresh operation is not being performed.

FIG. 24A illustrates corrected read signal READF appearing when read signal READ is input while the refresh operation is not performed. As shown in FIG. 24A, when the refresh operation is not being performed, refresh operation signal REFRESH is at "L". Corrected read signal READF produced by command shift circuit 480 is activated according to the same timing of as the activation of read signal READ. Therefore, operations similar to those in the fourth embodiment can be performed even when corrected read signal READF is used instead of read signal READ.

Figure 24B:
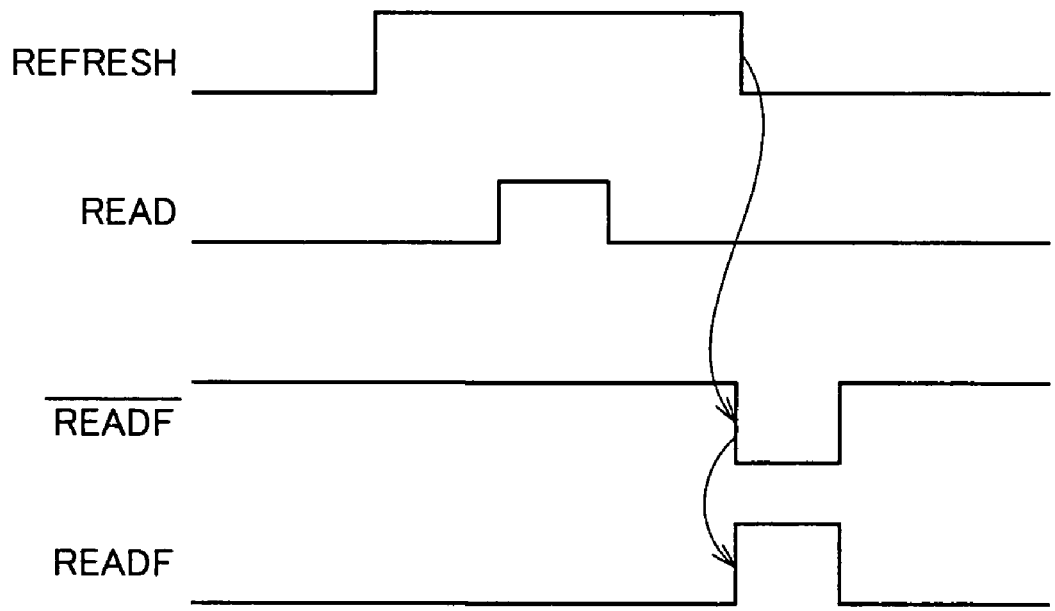
FIG. 24B illustrates corrected read signal READF appearing when read signal READ is input during the refresh operation.

FIG. 24B illustrates corrected read signal READF appearing when read signal READ is input during the refresh operation. As illustrated in FIG. 24B, refresh operation signal REFRESH is at "H" when the refresh operation is being performed. When the refresh operation ends, refresh operation signal REFRESH attains "L". Corrected read signal READF produced by command shift circuit 480 is activated immediately after refresh operation signal REFRESH falls and the refresh operation ends. Thereby, by using corrected read signal READF instead of read signal READ, the operation similar to that in the fourth embodiment can be performed immediately after the end of the refresh. In FIG. 20, a series of the processing starts from clock CLK0, at which read signal READ is produced. In contrast to this, a series of the operation according to this modification starts from the clock, at which corrected read signal READF is input.

This modification has been described in connection with the case where read signal READ or write signal WRITE is produced during the refresh operation. However, the modification can be similarly applied to the case where read signal READ or write signal WRITE is newly produced during an operation such as read or write operation. In particular, when the word line handled as a target of the new reading or writing is different from the word line, which is the target of the last reading or writing, processing such as deactivation of the word line of the last target, activation of the word line of the new target and amplification by the sense amplifier is required, and therefore, this modification is effective.

According to this modification, command shift circuit 480 produces corrected read signal READF from read signal READ. However, this is not restrictive, and corrected write signal WRITEF may be produced from write signal WRITE.

Fifth Embodiment

A fifth embodiment relates to a synchronous pseudo-SRAM, which has both the synchronous mode and the asynchronous mode, and has a preamplifier formed of a second amplifier circuit suitable for both the modes. The sense amplifier forming the first amplifier circuit amplifies the potentials on bit line pair BL and ZBL, and the preamplifier forming the second amplifier circuit amplifies the potentials on global bit line pair GIO and ZGIO connected to the plurality of bit line pairs BL and ZBL.

(Structure)

Figure 25:
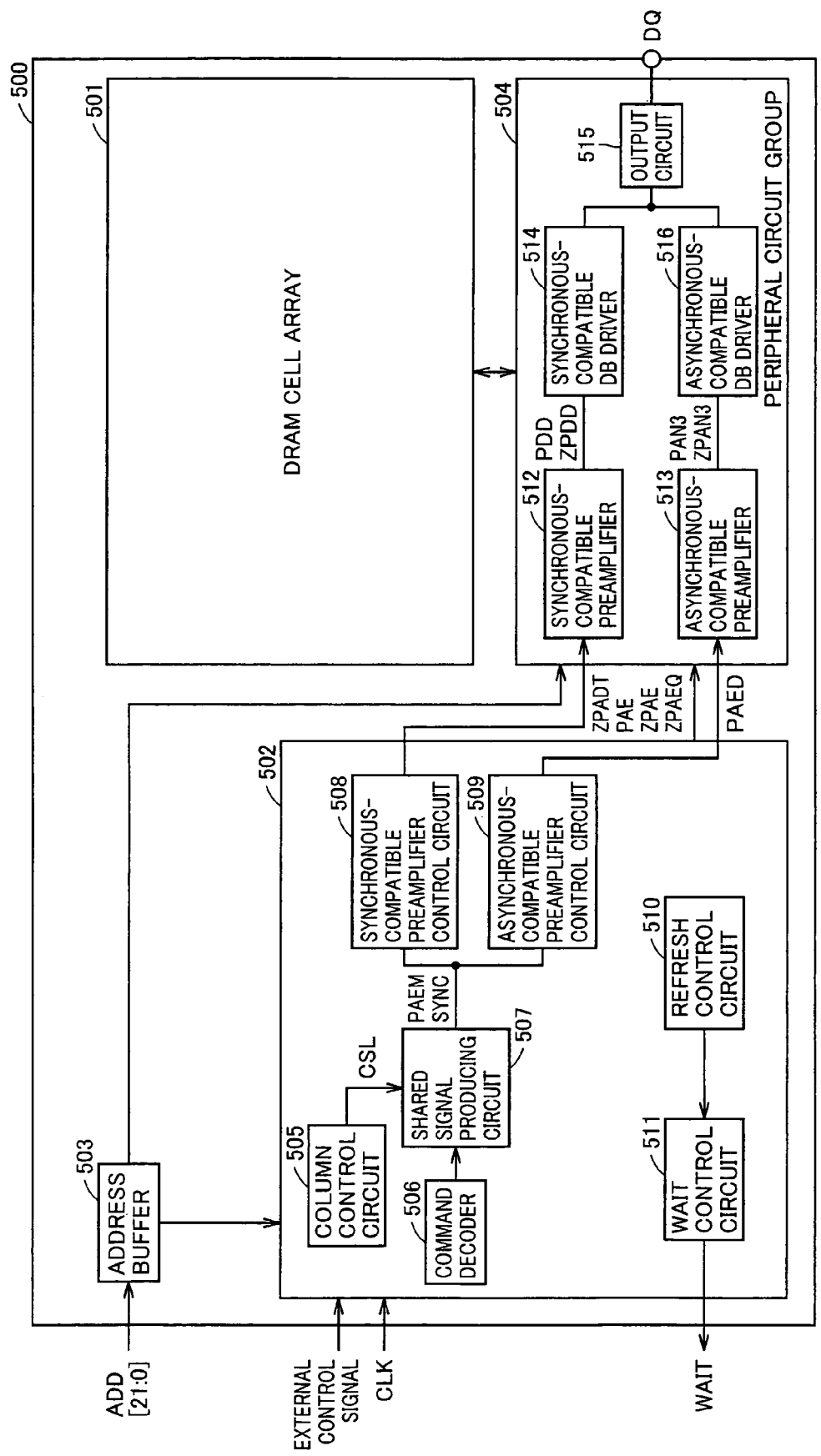
FIG. 25 shows a structure of a synchronous pseudo-SRAM 500 according to a fifth embodiment.

FIG. 25 shows a structure of a synchronous pseudo-SRAM 500 according to the embodiment. Referring to FIG. 25, synchronous pseudo-SRAM 500 includes a DRAM cell array 501, a control circuit 502, a peripheral circuit group 504 and an address buffer 503.

DRAM cell array 501 is a memory array formed of cells of a Dynamic Random Access Memory (DRAM).

Address buffer 503 receives external address signal ADD [21:0], and produces an internal address signal.

Control circuit 502 includes a column control circuit 505, a command decoder 506, a shared signal producing circuit 507, a synchronous-compatible preamplifier control circuit 508, an asynchronous-compatible preamplifier control circuit 509, a refresh control circuit 510 and a WAIT control circuit 511.

Column control circuit 505 provides column select signal CSL based on the address applied thereto.

Refresh control circuit 510 controls the self-refresh operation of the DRAM cell array based on an internal refresh timer (not shown).

WAIT control circuit 511 keeps the WAIT signal, which is output via a WAIT terminal, at the level of "L" while the refresh control is being performed under the control of refresh control circuit 510.

Command decoder 506 produces row activating signal ACT, read signal READ and write signal WRITE according to the combination of the logical levels of the internal control signals produced from the external control signals.

Figure 26:
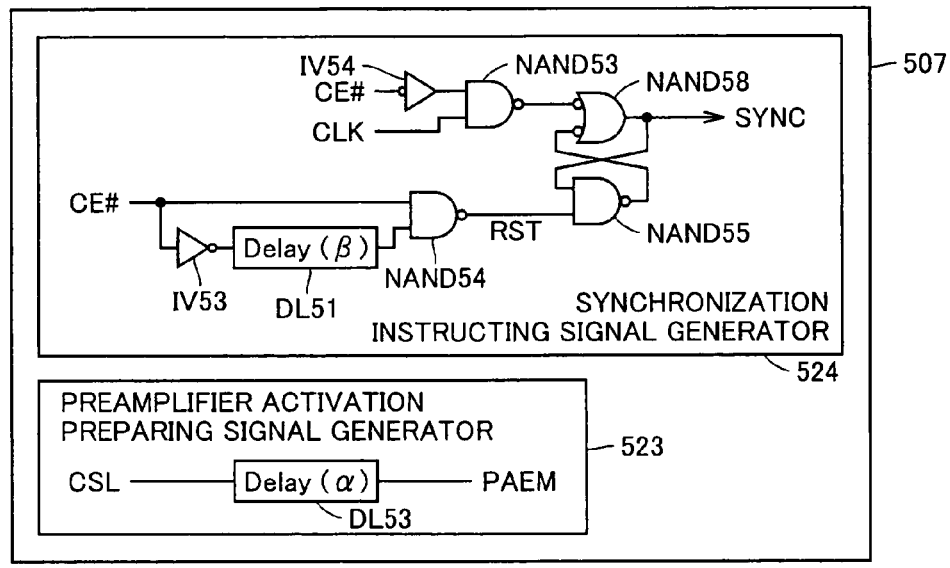
FIG. 26 shows a structure of a shared signal producing circuit 507.

FIG. 26 shows a structure of shared signal producing circuit 507. Referring to FIG. 26, shared signal producing circuit 507 includes a preamplifier activation preparing signal generator 523 and a synchronization instructing signal generator 524. As shown in FIG. 26, a preamplifier activation preparing signal PAEM is produced by delaying column select signal CSL, which is sent from column control circuit 505, by a time of $\alpha$ by a delay circuit (Delay) DL53. Preamplifier activation preparing signal PAEM is sent to synchronous-compatible preamplifier control circuit 508 and asynchronous-compatible preamplifier control circuit 509.

Synchronization instructing signal generator 524 includes an inverter IV54 receiving external chip enable signal CE#, a NAND circuit NAND53 receiving the output of inverter IV54 and external clock CLK, an inverter IV53 receiving external chip enable signal CE#, a delay circuit (Delay) DL51 delaying the output of inverter IV53 by a time $\beta$, a NAND circuit NAND54 receiving external chip enable signal CE# and the output of delay circuit (Delay) DL51, a NAND circuit NAND58 receiving the outputs of NAND circuits NAND 53 and 55, and NAND circuit NAND55 receiving the outputs of NAND circuits NAND54 and NAND58.

Figure 27A:
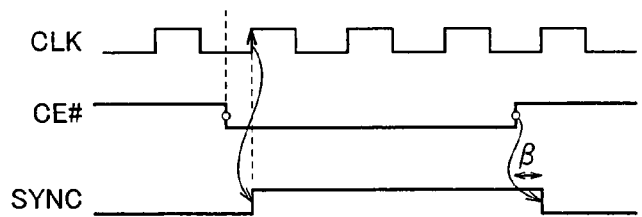
FIG. 27A is a timing chart illustrating production of a synchronization instructing signal SYNC in the case where an external clock CLK is input.
Figure 27B:
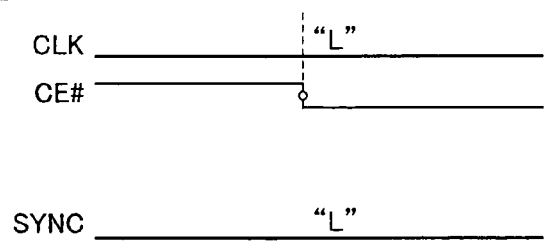
FIG. 27B is a timing chart illustrating production of synchronization instructing signal SYNC in the case where external clock CLK is not input.

FIGS. 27A and 27B are timing charts illustrating a synchronization instructing signal SYNC.

Referring to FIG. 27A, when external clock CLK is input, synchronization instructing signal SYNC attains "H" indicating the synchronous mode in response to the first rising of the clock after external chip enable signal CE# becomes active to attain "L". Then, synchronization instructing signal SYNC attains "L" when a time of β set by delay circuit (Delay) DL51 elapses after external chip enable signal CE# becomes inactive to attain "H".

Referring to FIG. 27B, when external clock CLK is not input, synchronization instructing signal SYNC is at "L" indicating the asynchronous mode.

Synchronization instructing signal SYNC is sent to synchronous-compatible preamplifier control circuit 508 and asynchronous-compatible preamplifier control circuit 509.

Figure 28:
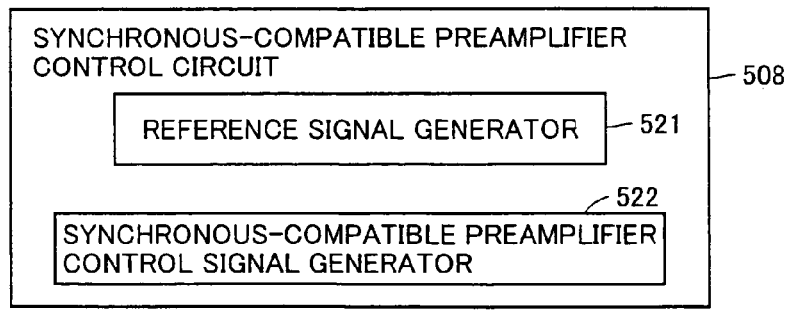
FIG. 28 shows a structure of a synchronous-compatible preamplifier control circuit 508.

FIG. 28 shows a structure of a synchronous-compatible preamplifier control circuit 508. As shown in FIG. 28, synchronous-compatible preamplifier control circuit 508 includes a reference signal generator 521 and a synchronous-compatible preamplifier control signal generator 522 for the synchronous operation.

Figure 29:
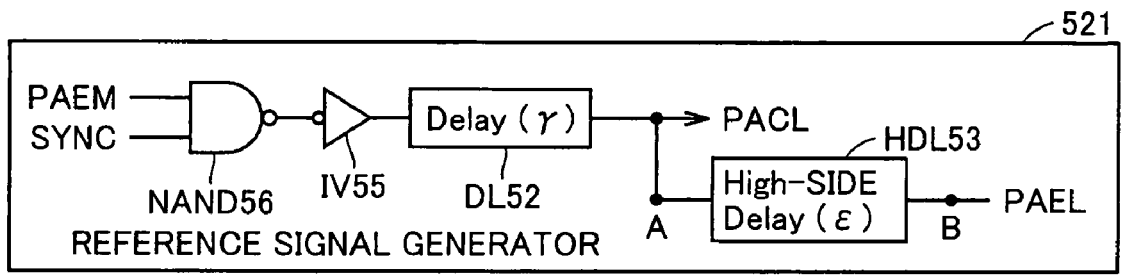
FIG. 29 shows a structure of a reference signal generator 521.

FIG. 29 shows a structure of reference signal generator 521. As shown in FIG. 29, reference signal generator 521 includes a NAND circuit NAND56 receiving preamplifier activation preparing signal PAEM and synchronization instructing signal SYNC, an inverter IV55 receiving the output of NAND circuit NAND56, a delay circuit (Delay) DL52 delaying the output of inverter IV55 by a time of γ, and a delay circuit (High-side Delay) HDL53 delaying the "H" level side of output of delay circuit (Delay) DL52 by a time of ε. The output of delay circuit (Delay) DL52 is a first reference signal PACL, and the output of delay circuit (High-side Delay) HDL53 is a second reference signal RAEL.

Figure 30:
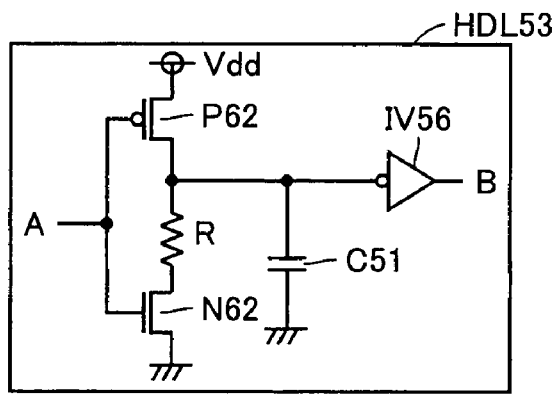
FIG. 30 shows an example of a High-side Delay.

FIG. 30 shows an example of the High-side Delay. The High-side Delay includes a P-channel MOS transistor P62, an N-channel MOS transistor N62, a resistance R, a capacitor C51 and an inverter IV56. A node B of the High-side delay changes from "L" to "H" according to timing delayed from timing, according to which a node A changes from "L" to "H". However, node B changes from "H" to "L" according to the same timing as the change of node A from "H" to "L".

Figure 31:
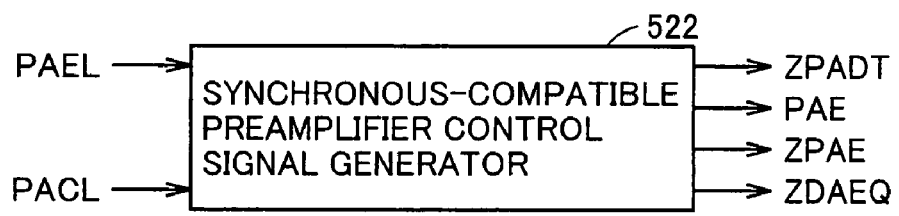
FIG. 31 shows a structure of a synchronous-compatible preamplifier control signal generator 522.

FIG. 31 shows a structure of synchronous-compatible preamplifier control signal generator 522. As shown in FIG. 31, synchronous-compatible preamplifier control signal generator 522 receives first and second reference signals RAEL and PACL, and produces an inverted preamplifier connection signal ZPADT, preamplifier activating signal PAE, inverted preamplifier activating signal ZPAE and an inverted preamplifier equalizing signal ZPAEQ.

Figure 32:
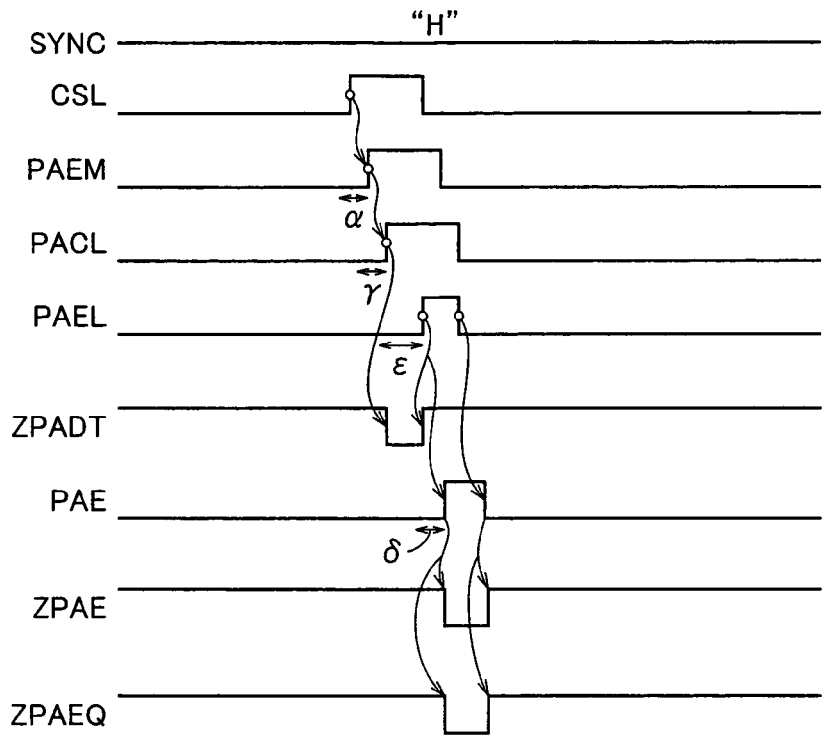
FIG. 32 illustrates timing of production of signals related to a synchronous-compatible preamplifier 512.

FIG. 32 illustrates timing of production of the signals related to a synchronous-compatible preamplifier 512. Referring to FIG. 32, when the synchronous mode is to be instructed, synchronization instructing signal SYNC attains "H" as already described with reference to FIG. 27A. Column select signal CSL becomes activate to attain "H" according to appropriate timing.

Preamplifier activation preparing signal PAEM delays column select signal CSL by the time of α.

Preamplifier activation preparing signal PAEM and synchronization instructing signal SYNC are provided to NAND circuit NAND56 of reference signal generator 521 so that first reference signal PACL is produced by delaying preamplifier activation preparing signal PAEM by the time of γ.

Further, second reference signal PAEL, which is delayed from the leading pulse of first reference signal PACL by the time of ε, is produced.

Synchronous-compatible preamplifier control signal generator 522 activates inverted preamplifier connection signal ZPADT to attain "L" when first and second reference signals PACL and PAEL are at "H" and "L", respectively. Also, synchronous-compatible preamplifier control signal generator 522 delays second reference signal PAEL by a time of δ to produce preamplifier activating signal PAE. Further, synchronous-compatible preamplifier control signal generator 522 inverts preamplifier activating signal PAE to produce inverted preamplifier activating signal ZPAE and inverted preamplifier equalizing signal ZPAEQ.

When synchronization instructing signal SYNC is at "L" indicating the asynchronous mode, first and second reference signals PACL and PAEL do not become active so that inverted preamplifier connection signal ZPADT, preamplifier activating signal PAE, inverted preamplifier activating signal ZPAE and inverted preamplifier equalizing signal ZPAEQ do not become active.

Figure 33:
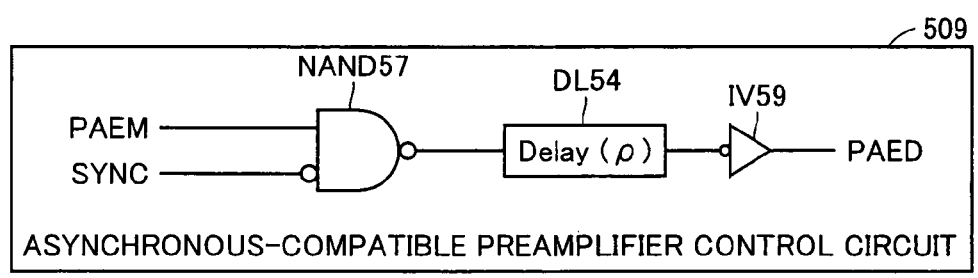
FIG. 33 shows a structure of an asynchronous-compatible preamplifier control circuit 509.

FIG. 33 shows a structure of asynchronous-compatible preamplifier control circuit 509. As shown in FIG. 33, asynchronous-compatible preamplifier control circuit 509 includes a NAND circuit NAND57 receiving preamplifier activation preparing signal PAEM and an inverted signal of synchronization instructing signal SYNC, a delay circuit (Delay) DL54 delaying the output of NAND circuit NAND57 by a time of ρ, and an inverter IV59 receiving the output of delay circuit (Delay) DL54. The output of inverter IV59 forms preamplifier activating signal PAED.

Figure 34:
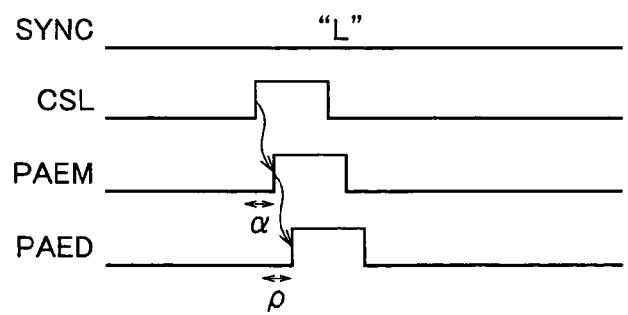
FIG. 34 showing timing of production of signals related to an asynchronous-compatible preamplifier 513.

FIG. 34 illustrates timing of production of signals related to asynchronous-compatible preamplifier 513. Referring to FIG. 34, when the asynchronous mode is to be instructed, synchronization instructing signal SYNC attains "L" as illustrated in FIG. 27B. Column select signal CSL is activated to attain "H" according to appropriate timing.

Preamplifier activation preparing signal PAEM is produced by delaying column select signal CSL by the time of α.

Preamplifier activation preparing signal PAEM and synchronization instructing signal SYNC are sent to asynchronous-compatible preamplifier control circuit 509, and preamplifier activating signal PAED is produced by delaying preamplifier activation preparing signal PAEM by the time of ρ.

When synchronization instructing signal SYNC is at "H" indicating the synchronous mode, preamplifier activating signal PAED is not activated.

Referring to FIG. 25 again, peripheral circuit group 504 includes synchronous-compatible preamplifier 512, asynchronous-compatible preamplifier 513, a synchronous-compatible DB driver 514, an asynchronous-compatible DB driver 516 and an output circuit 515.

(Synchronous-Compatible Preamplifier 512)

Figure 35:
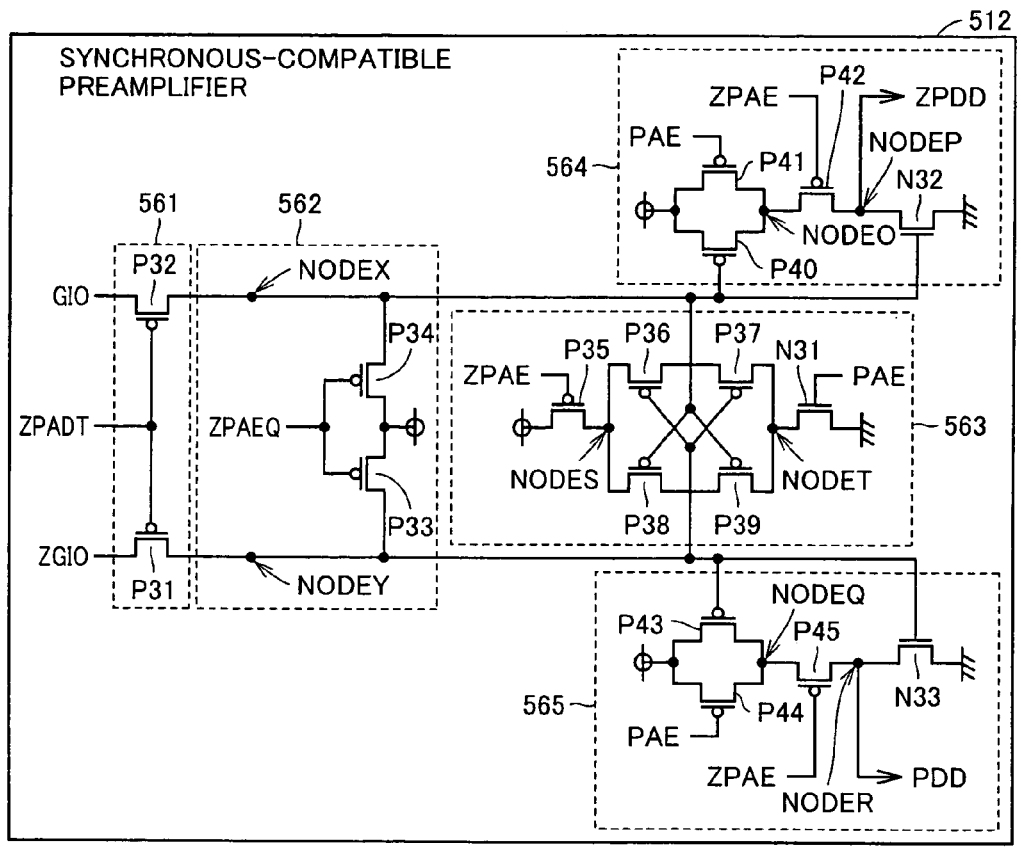
FIG. 35 shows a structure of synchronous-compatible preamplifier 512.

FIG. 35 shows a structure of a synchronous-compatible preamplifier 512. As shown in FIG. 35, synchronous-compatible preamplifier 512 includes a switch unit 561 controlled by inverted preamplifier connection signal ZPADT, an equalizing unit 562 controlled by inverted preamplifier equalizing signal ZPAEQ, an amplifier unit 563 controlled by preamplifier activating signal PAE and inverted preamplifier activating signal ZPAE, and buffer units 564 and 565 controlled by preamplifier activating signal PAE and inverted preamplifier activating signal ZPAE.

Switch unit 561 includes P-channel MOS transistors P32 and P31. P-channel MOS transistor P32 is arranged between global I/O line GIO and a NODEX. P-channel MOS transistor P31 is arranged between inverted global I/O line ZGIO and a NODEY. P-channel MOS transistors P32 and P31 are supplied on their gates with inverted preamplifier connection signal ZPADT.

Equalizing unit 562 includes P-channel MOS transistors P34 and P33. P-channel MOS transistor P34 is arranged between NODEX and the power supply. P-channel MOS transistor P33 is arranged between NODEY and the power supply. P-channel MOS transistors P34 and P33 are supplied on their gates with inverted preamplifier equalizing signal ZPAEQ.

Amplifier unit 563 includes P-channel MOS transistors P35-P39 and an N-channel MOS transistor N31. Between NODES and NODET, P-channel MOS transistors P36 and P37 are arranged in series, and P-channel MOS transistors P38 and P39 are arranged in series and in parallel with P-channel MOS transistors P36 and P37. P-channel MOS transistors P36 and P37 have gates connected to NODEY. P-channel MOS transistors P38 and P39 have gates connected to NODEX. P-channel MOS transistor P35 is arranged between the power supply and NODES. N-channel MOS transistor N31 is arranged between NODET and the ground. P-channel MOS transistor P35 is supplied on its gate with inverted preamplifier activating signal ZPAE, and N-channel MOS transistor N31 is supplies on its gate with preamplifier activating signal PAE.

Buffer 564 includes P-channel MOS transistors P40-P42 and an N-channel MOS transistor N32. P-channel MOS transistors P40 and P41 are arranged between the power supply and a NODEO. P-channel MOS transistor P40 has a gate connected to NODEX. P-channel MOS transistor P41 is supplied on its gate with preamplifier activating signal PAE. P-channel MOS transistor P42 is arranged between NODEO and NODEP. P-channel MOS transistor P42 receives on its gate with inverted preamplifier activating signal ZPAE. N-channel MOS transistor N32 is arranged between NODEP and the ground. N-channel MOS transistor N32 has a gate connected to NODEX. Inverted preamplifier output data ZPDD is output from NODEX.

Buffer 565 includes P-channel MOS transistors P43-P45 and an N-channel. MOS transistor N33. P-channel MOS transistors P43 and P44 are arranged between the power supply and a NODEQ. P-channel MOS transistor P43 has a gate connected to NODEY. P-channel MOS transistor P44 is supplied on its gate with preamplifier activating signal PAE. P-channel MOS transistor P45 is arranged between NODEQ and NODER. P-channel MOS transistor P45 is supplied on its gate with inverted preamplifier activating signal ZPAE. N-channel MOS transistor N33 is arranged between NODER and the ground. N-channel MOS transistor N33 has a gate connected to NODEY. Preamplifier output data PDD is output from NODEY.

Since synchronous-compatible preamplifier 512 has switch unit 561, it can isolate global I/O line pair GIO and ZGIO from amplifier unit 563 according to inverted preamplifier connection signal ZPADT. Thereby, amplifier unit 563, which has taken into the potentials on global I/O line pair GIO and ZGIO, can perform the amplification without being affected by a change, which may occur thereafter, and thus can perform a so-called confined amplification so that amplifier unit 563 can perform fast amplification. Since global I/O line pair GIO and ZGIO is isolated from amplifier unit 523, equalizing unit 562 can perform the precharge processing at the same time as the amplification by amplifier unit 563 so that the whole processing of the preamplifier can be performed fast.

In particular, when the read processing synchronized with the clock is to be performed, the address changes according to constant timing, and does not change according to random timing. Therefore, by operating switch unit 561 to perform the isolation according to timing not overlapping with the change in address, data on global I/O line pair GIO and ZGIO can be handled without missing it.

For the above reasons, it can be considered that synchronous-compatible preamplifier 512 is suitable for the read operation synchronized with the clock.

As described above, synchronous-compatible preamplifier 512 is not suitable for an asynchronous read operation, which is not synchronized with the clock.

Figure 36:
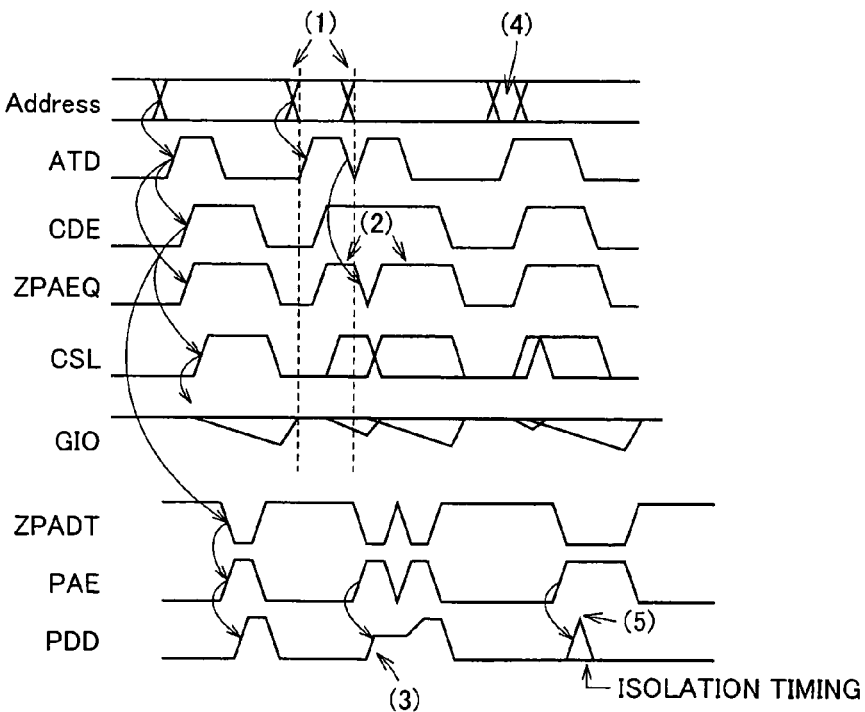
FIG. 36 is a diagram illustrating that synchronous-compatible preamplifier 512 is not suitable for asynchronous reading.

FIG. 36 is a diagram for illustrating the fact that synchronous-compatible preamplifier 512 is not suitable for asynchronous reading. According to the asynchronous reading, as illustrated in FIG. 36, the read operation is performed in accordance with change in address.

As indicated at (1) in FIG. 36, when the column address changes after a short period from the last change in column address, an inverted preamplifier equalizing signal ZPAQ is activated corresponding to the respective changes, but such, activation occurs with a relatively short interval. Consequently, the precharging cannot be performed sufficiently. Since the amplifier is performed without precharging, distortion occurs in output data PDD of the preamplifier as indicated at (3) in FIG. 36. For avoiding this problem, it is necessary to keep a sufficient precharge period before the next column access. This results in slow processing of synchronous-compatible preamplifier 512.

As indicated at (4) in FIG. 36, when illegal address change occurs due to noises or the like, global I/O line pair GIO and ZGIO is supplied with the data of the column corresponding to the illegal column address change, and then will be supplied with the column data corresponding to the correct address change. In this case, if global I/O line pair GIO and ZGIO is isolated from amplifier unit 563 according to excessively early timing, illegal data is amplified as indicated at (5) in FIG. 36, and correct data is not amplified. For avoiding this problem, global I/O line pair GIO and ZGIO must be isolated from amplifier unit 563 according to delayed timing. This decreases the processing speed of synchronous-compatible preamplifier 512.

If synchronous-compatible preamplifier 512 is used for the asynchronous reading as described above, the processing becomes slow. Therefore, such use is not appropriate.

(Asynchronous-Compatible Preamplifier 513)

Figure 37:
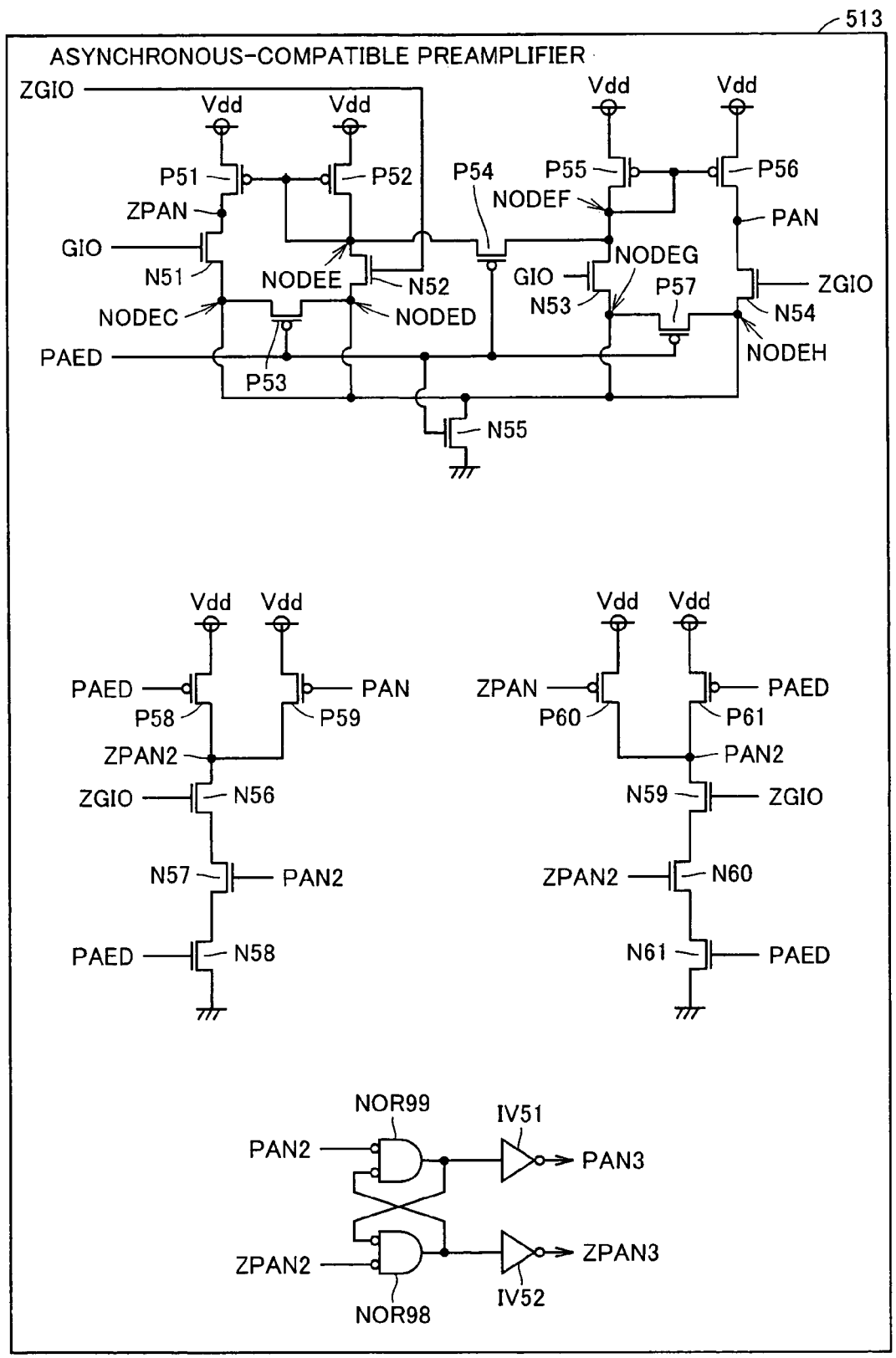
FIG. 37 shows a structure of asynchronous-compatible preamplifier 513.

FIG. 37 shows a structure of asynchronous-compatible preamplifier 513. As shown in FIG. 37, this asynchronous-compatible preamplifier 513 is an amplifier of a differential current mirror type.

Referring to FIG. 37, P-channel MOS transistors P51 and P52 form a current mirror circuit. An N-channel MOS transistor N51 is arranged between nodes ZPAN and NODEC. An N-channel MOS transistor N52 is arranged between NODEE and NODED. N-channel MOS transistor N51 has a gate connected to global I/O line GIO. N-channel MOS transistor N52 has a gate connected to inverted global I/O line ZGIO. A P-channel MOS transistor P53 is arranged between NODEC and NODED. P-channel MOS transistor P53 is supplied on its gate with preamplifier activating signal PAED.

P-channel MOS transistors P55 and P56 form a current mirror circuit. An N-channel MOS transistor N54 is arranged between nodes PAN and NODEG. An N-channel MOS transistor N53 is arranged between NODEF and NODEG. N-channel MOS transistor N54 has a gate connected to inverted global I/O line ZGIO. N-channel MOS transistor N53 has a gate connected to global I/O line GIO. A P-channel MOS transistor P57 is arranged between NODEG and NODEH. P-channel MOS transistor P57 is supplied on its gate with preamplifier activating signal PAED.

An N-channel MOS transistor N55 is arranged between NODED and the ground. N-channel MOS transistor N55 is supplied on its gate with preamplifier activating signal PAED. A P-channel MOS transistor P54 is arranged between NODEE and NODEF. P-channel MOS transistor P54 is supplied on its gate with preamplifier activating signal PAED.

P-channel MOS transistors P58 and P59 are arranged in parallel between the power supply and a node ZPAN2. P-channel MOS transistor P58 receives preamplifier activating signal PAED on its gate, and P-channel MOS transistor P59 has a gate connected to node PAN.

Between node ZPAN2 and the ground, N-channel MOS transistors N56, N57 and N58 are connected in series. N-channel MOS transistor N56 has a gate connected to inverted global I/O line ZGIO. N-channel MOS transistor N57 has a gate connected to a node PAN2. N-channel MOS transistor N58 is supplied on its gate with preamplifier activating signal PAED.

Further, P-channel MOS transistors P60 and P61 are arranged in parallel between the power supply and node PAN2. P-channel MOS transistor P61 is supplied on its gate with preamplifier activating signal PAED. P-channel MOS transistor P60 has a gate connected to node ZPAN.

N-channel MOS transistors N59, N60 and N61 are connected in series between node PAN2 and the ground. N-channel MOS transistor N59 has a gate connected to inverted global I/O line ZGIO. N-channel MOS transistor N60 has a gate connected to node ZPAN2. N-channel MOS transistor N61 is supplied on its gate with preamplifier activating signal PAED.

A NOR circuit NOR99 connected to node PAN2 and a NOR circuit NOR98 connected to node ZPAN2 form a flip-flop. An inverter IV51 inverts the output of NOR circuit NOR99 to provide a preamplifier output signal PAN3. An inverter IV52 inverts the output of NOR circuit NOR98 to output an inverted preamplifier output signal ZPAN3.

Figure 38:
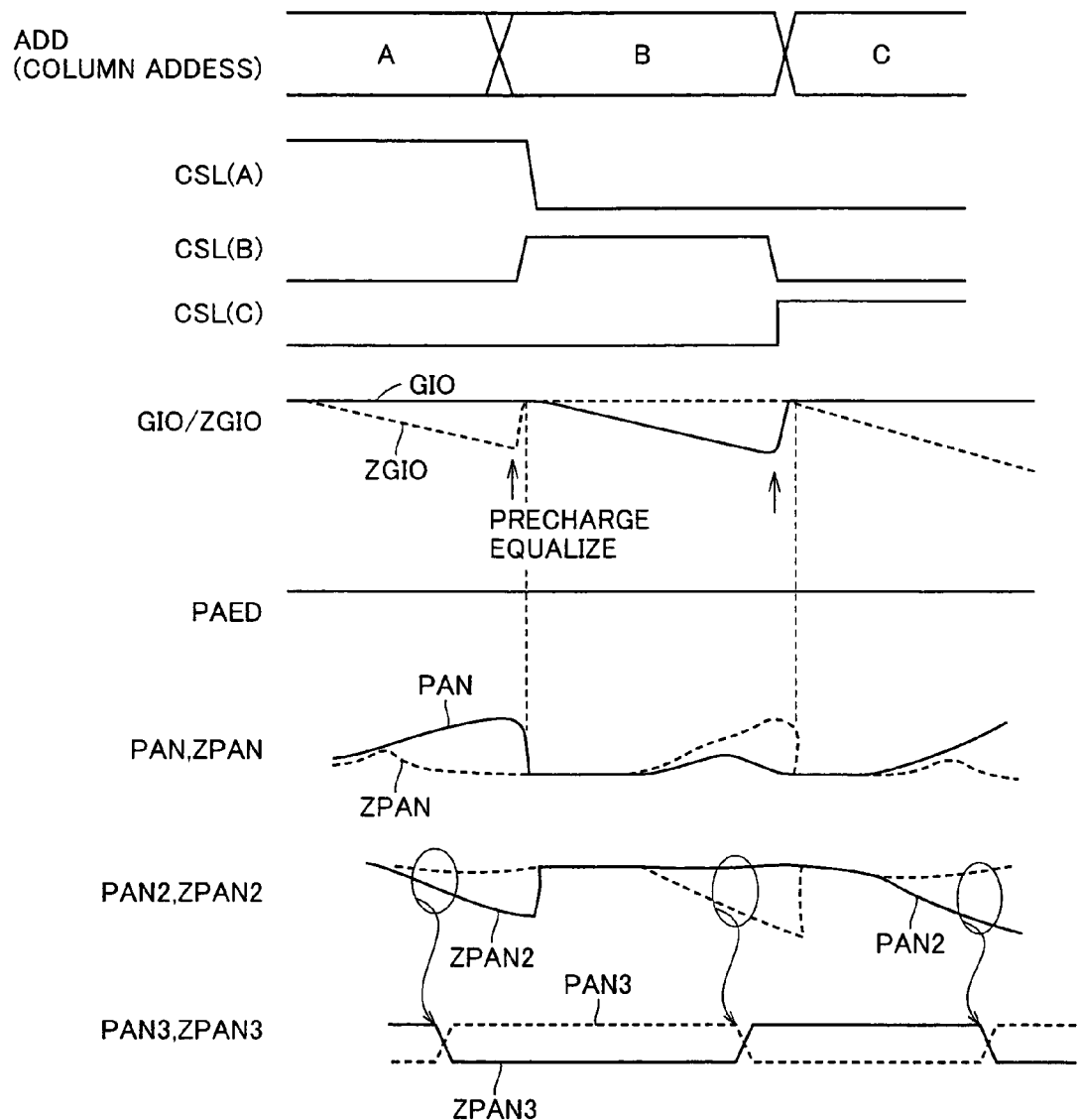
FIG. 38 illustrates changes on potentials on nodes of asynchronous-compatible personal computer 513 over time.

FIG. 38 illustrates changes of potentials on various nodes of asynchronous-compatible preamplifier 513 over time.

Asynchronous-compatible preamplifier 513 does not have a switch unit in contrast to synchronous-compatible preamplifier 512, and is a preamplifier of a non-confined type. Therefore, asynchronous-compatible preamplifier 513 is not isolated from global I/O lines GIO and ZGIO during amplification, and therefore is suitable for asynchronous reading, which is performed according to change in address.

Figure 39:
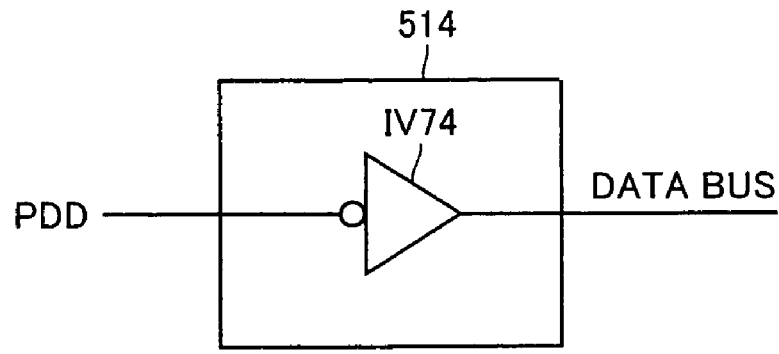
FIG. 39 shows a structure of a synchronous-compatible DB driver 514.

Referring to FIG. 25 again, synchronous-compatible DB driver 514 provides the potential received thereby onto a data bus DB. FIG. 39 shows a structure of synchronous-compatible DB driver 514. As shown in FIG. 39, synchronous-compatible DB driver 514 is formed of an inverter IV74, which receives an output PDD of synchronous-compatible preamplifier 512, and inverts it to provide the inverted output onto data bus DB.

Figure 40:
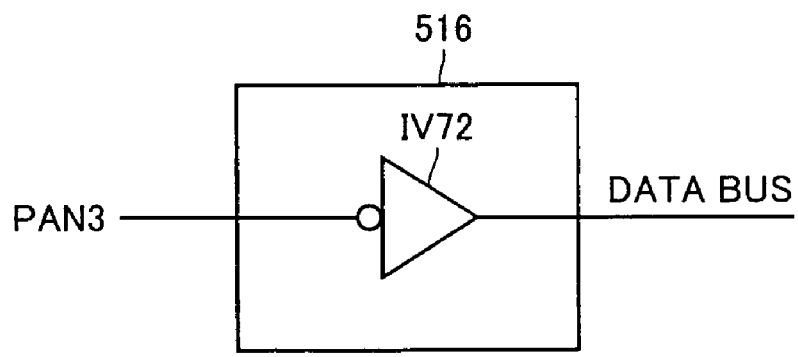
FIG. 40 shows a structure of an asynchronous-compatible DB driver 516.

Asynchronous-compatible DB driver 516 provides the received potential onto data bus DB. FIG. 40 shows a structure of asynchronous-compatible DB driver 516. Asynchronous-compatible DB driver 516 is formed of an inverter IV72, which receives and inverts an output PAN3 of asynchronous-compatible preamplifier 513 to provide the inverted output onto data bus DB.

Output circuit 515 in FIG. 25 receives data from data bus DB, and externally provides the data via data output terminal DQ.

As described above, since the synchronous pseudo-SRAM according to the embodiment has the preamplifier operating appropriately in the synchronous mode as well as the preamplifier operating appropriately in the asynchronous mode, the potential difference on global I/O line pair GIO and ZGIO can be correctly amplified in all the modes.

In this embodiment, the different preamplifiers are employed for the synchronous operation and the asynchronous operation, respectively. However, this is not restrictive, and different preamplifiers may be employed for the burst mode and the random access, respectively. In this case, the semiconductor memory device does not have the synchronous mode and the asynchronous mode, but has the burst mode and the random access mode. For the burst mode, a preamplifier such as preamplifier 512, which can perform the confined-type amplification, is suitable so that a pre-read operation and a pipeline operation can be executed efficiently.

According to the embodiment, synchronization instructing signal SYNC switches the mode between the synchronous and asynchronous modes. However, this is not restrictive, and a bonding option PAD may be employed such that a potential applied thereto can switch the mode between the synchronous and asynchronous modes.

Although the embodiment employs synchronous-compatible DB driver 514 and asynchronous-compatible DB driver 516, a DB driver corresponding to the synchronous and asynchronous modes may be used.

Figure 41:
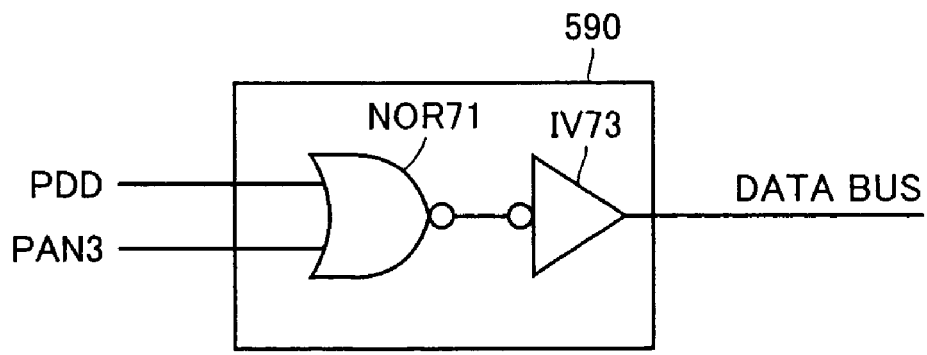
FIG. 41 shows a structure of a shared DB driver 590 serving as synchronous- and asynchronous compatible DB drivers 514 and 515.

FIG. 41 shows a structure of a shared DB driver 590 serving as both synchronous- and asynchronous-compatible DB drivers 514 and 516. As shown in FIG. 41, shared DB driver 590 is formed of a NOR circuit NOR71, which receives output PDD of synchronous-compatible preamplifier 512 and output PAN3 of asynchronous-compatible preamplifier 513, and an inverter IV73 inverting the output of NOR circuit NOR71 and providing the inverted output onto data bus DB.

Figure 42:
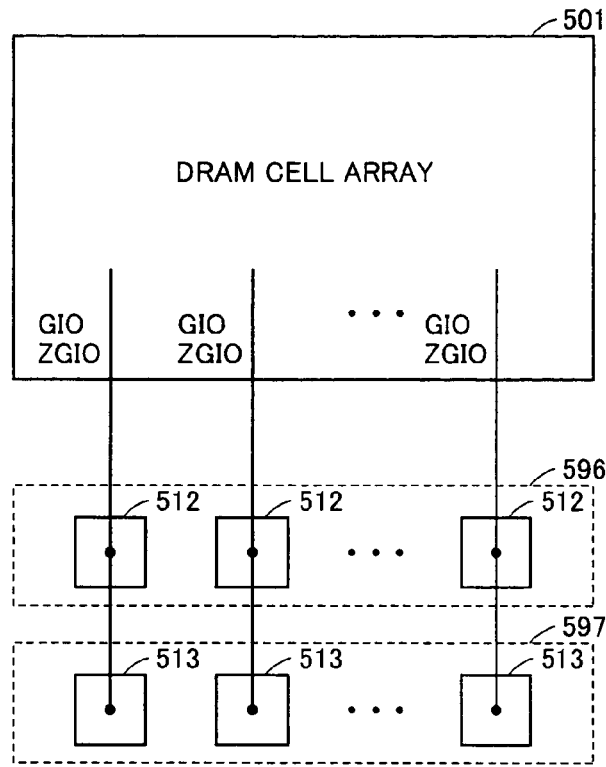
FIG. 42 shows an arrangement of synchronous- and asynchronous-compatible preamplifiers 512 and 513.

FIG. 42 shows a layout of synchronous- and asynchronous-compatible preamplifiers 512 and 513. As shown in FIG. 42, synchronous-compatible preamplifiers 512 are arranged in a synchronous-compatible preamplifier arrangement region 596, and asynchronous-compatible preamplifiers 513 are arranged in an asynchronous-compatible preamplifier arrangement region 597.

Synchronous- and asynchronous-compatible preamplifiers 512 and 513 connected to the same global I/O line pair GIO and ZGIO are aligned in the column direction. An arrangement layer of global I/O line pair GIO and ZGIO is different from an arrangement layer of the preamplifiers, and global I/O line pair GIO and ZGIO does not have a diverging point, and connects synchronous- and asynchronous-compatible preamplifiers 512 and 513 together.

According to the layout shown in FIG. 42, as described above, it is not necessary to diverge global I/O line pair GIO and ZGIO, which facilitates the arrangement of global I/O line pair GIO and ZGIO. This layout is suitable for the case where synchronous pseudo-SRAM 500 can have a large size in the column direction.

Figure 43:
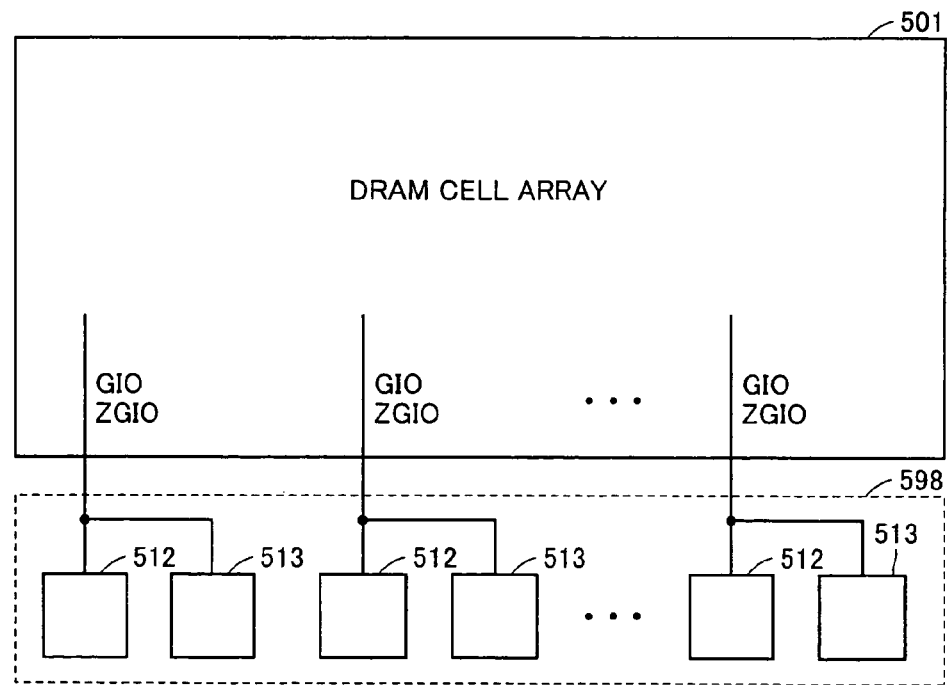
FIG. 43 shows another arrangement of synchronous- and asynchronous-compatible preamplifiers 512 and 513.

FIG. 43 shows another layout of synchronous-compatible preamplifiers 512 and asynchronous-compatible preamplifiers 513. As shown in FIG. 43, synchronous-compatible preamplifiers 512 and asynchronous-compatible preamplifiers 513 are arranged in a synchronous/asynchronous-compatible preamplifier arrangement region 598.

Synchronous- and asynchronous-compatible preamplifiers 512 and 513 connected to each global I/O line pair GIO and ZGIO are aligned in the row direction. Global I/O line pair GIO and ZGIO has diverged portions, which are connected to synchronous- and asynchronous-compatible preamplifiers 512 and 513, respectively.

According to the layout shown in FIG. 43, as described above, global I/O line pair GIO and ZGIO must be diverged. This layout is suitable for the synchronous pseudo-SRAM 500, which can have a large size in the row direction.

Sixth Embodiment

A sixth embodiment relates to a synchronous pseudo-SRAM having a byte mask function. In this synchronous pseudo-SRAM, a higher byte or a lower byte may be masked making it possible to prohibit external output of data read from memory cells. The burst mode contains a no-wrap mode. According to the no-wrap mode, when the last column is processed during the course of the burst reading or writing, a next row is then processed. In this case, it is necessary to perform deactivation of the word line already selected, activation of the word line to be newly selected and row access processing such as amplifying processing by the sense amplifier. While the row access processing is being performed, the WAIT signal is externally output. A byte mask signal can be applied from the external system side after this WAIT signal is released. For some systems, however, it is desired to allow setting of the byte mask in the same method, regardless of whether row access processing for changing to the next row is performed or not. This embodiment provides the synchronous pseudo-SRAM, which allows external application of the byte mask signal in the same manner as the case of not effecting the burst reading or burst writing over two rows, even when the burst reading or burst writing is to be effected over two rows, i.e., first and second rows, and the processing target changes to the second row after processing is effected on the last column in the first row during the course of the processing.

(Structure)

Figure 44:
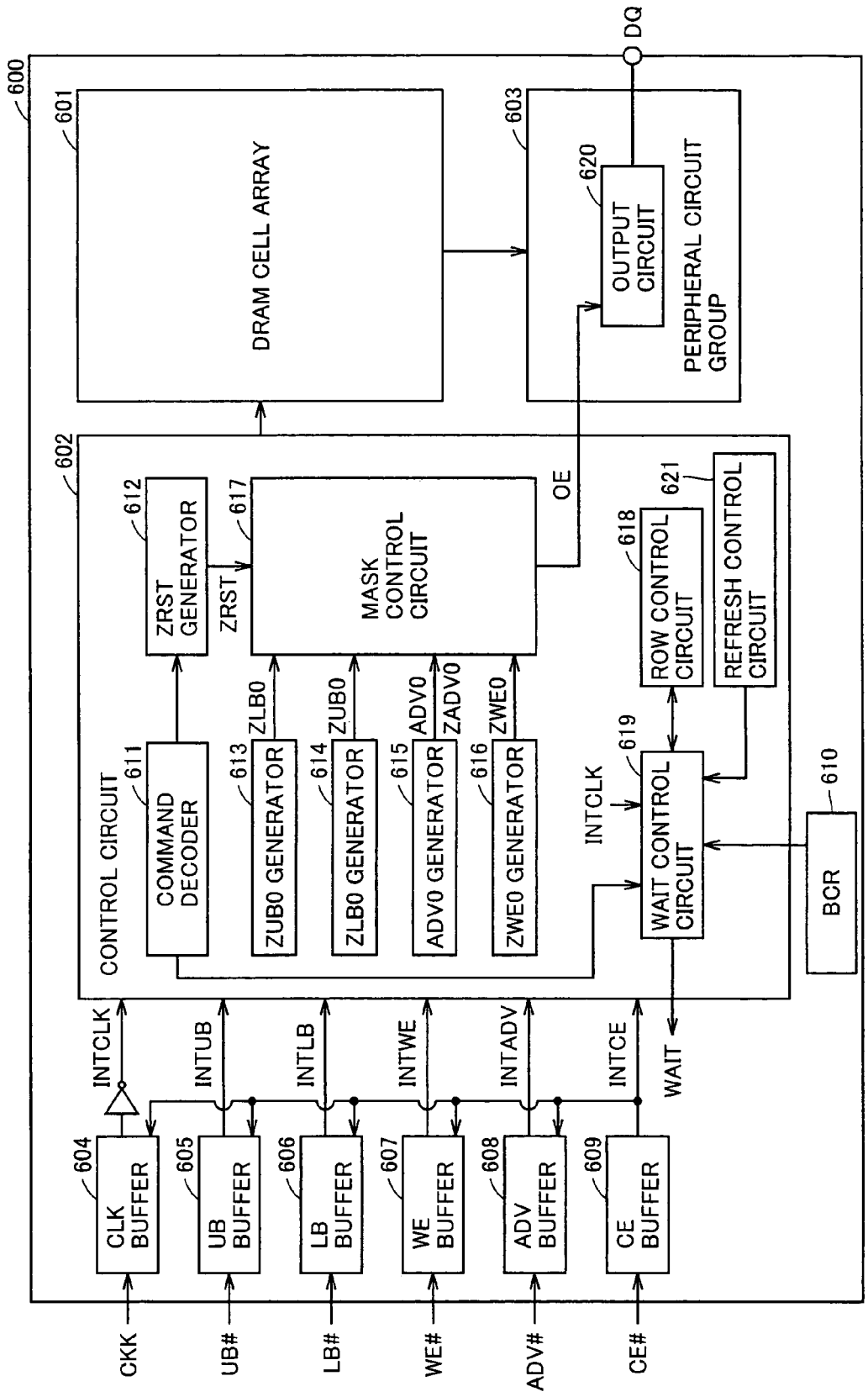
FIG. 44 shows a structure of a synchronous pseudo-SRAM 600 according to a sixth embodiment.

FIG. 44 shows a structure of a synchronous pseudo-SRAM 600 according to this embodiment. Referring to FIG. 44, synchronous pseudo-SRAM 600 includes a DRAM cell array 601, a CLK buffer 604, a UB buffer 605, an LB buffer 606, a WE buffer 607, an ADV buffer 608, a control circuit 602, a peripheral circuit group 603 and a BCR (Bus Configuration Register) 610.

DRAM cell array 601 is a memory array formed of cells of a Dynamic Random Access Memory (DRAM).

Peripheral circuit group 603 includes global I/O line pair GIOP (GIO and /GIO), which is not shown, as well as column select lines provided corresponding to the respective columns, column select gates, sense amplifiers, preamplifiers, a write driver, a row decoder, a column decoder and others. Peripheral circuit group 603 further includes an output circuit 620.

Output circuit 620 holds data provided from DRAM cell array 601. Output circuit 620 receives an output enable signal OE for higher bytes as well as output enable signal OE for lower bytes. When output enable signal OE for the higher bytes is at "H" indicating "Enable", output circuit 620 externally provides the higher bytes in the held data via data I/O terminal DQ. When output enable signal OE for the lower bytes is at "H" indicating "Enable", output circuit 620 externally provides the lower bytes in the held data via data I/O terminal DQ.

BCR 610 stores an interface to the external system such as burst length BL and command latency CL.

Figure 45:
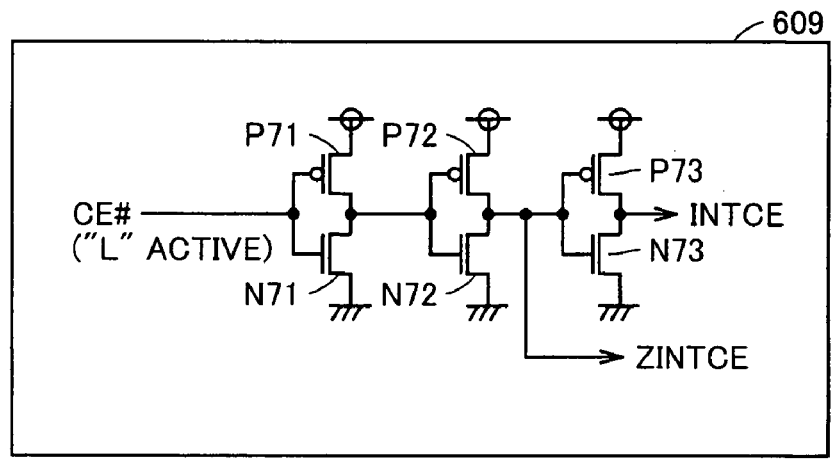
FIG. 45 shows a specific structure of a CE buffer 609.

FIG. 45 shows a specific structure of a CE buffer 609. Referring to FIG. 45, a CE buffer 608 includes an inverter 1 formed of P- and N-channel MOS transistors P71 and N71 receiving external chip enable signal CE#, an inverter 2 formed of P- and N-channel MOS transistors P72 and N72 connected to inverter 1, and an inverter 3 formed of P- and N-channel MOS transistors P73 and N73 connected to inverter 2. The output of inverter 2 forms an inverted internal chip enable signal ZINTCE, and the output of inverter 3 forms an internal chip enable signal INTCE.

Figure 46:
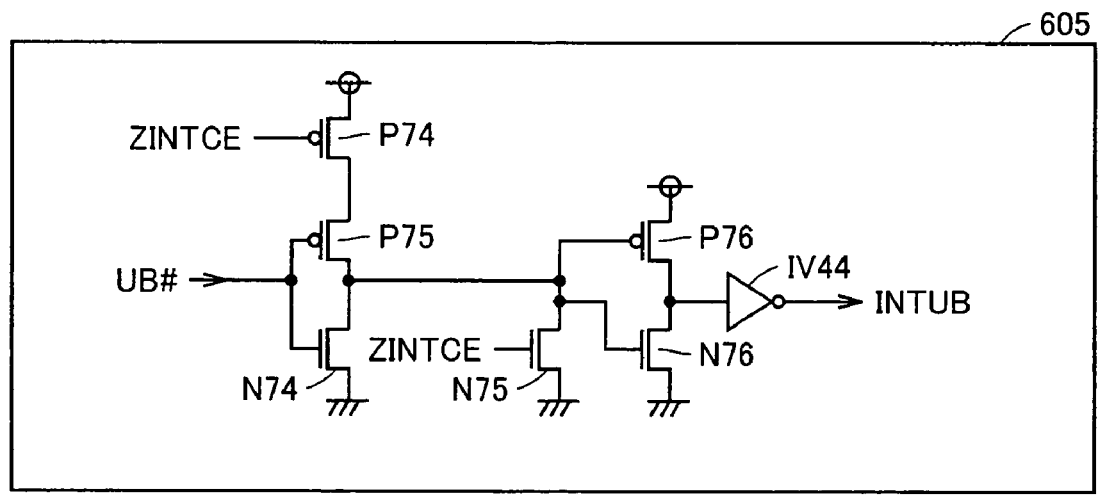
FIG. 46 shows a specific structure of a UB buffer 605.

FIG. 46 shows a specific structure of UB buffer 605. Referring to FIG. 46, UB buffer 605 includes an inverter 1 formed of P- and N-channel MOS transistors P75 and N74 receiving an external high byte mask signal UB#, an inverter 2 formed of P- and N-channel MOS transistors P76 and N76 connected to inverter 1, and an inverter IV44 connected to inverter 2. The output of inverter IV44 forms an internal higher byte mask signal INTUB. Further, a P-channel MOS transistor P74 is arranged between the power supply and P-channel MOS transistor P75. An N-channel MOS transistor N75 is arranged between a connection node, which is formed between inverters 1 and 2, and the ground.

Gates of P- and N-channel MOS transistors P74 and N75 receive inverted internal chip enable signal ZINTCE. When the chip is active, inverted internal chip enable signal ZINTCE attains "L". In this state, P-channel MOS transistor P75 is connected to the power supply, and the connection node between inverters 1 and 2 is not grounded. Therefore, a normal operation is performed.

When the chip is inactive, inverted internal chip enable signal ZINTCE attains "H". In this state, P-channel MOS transistor P75 is isolated from the power supply, and the connection node between inverters 1 and 2 is grounded. Therefore, internal higher byte mask signal INTUB is always at "L".

Other input buffers, i.e., CLK buffer 604, LB buffer 606, WE buffer 607 and ADV buffer 608 have the same structures as UB buffer 605, and therefore description thereof is not repeated.

Referring to FIG. 44 again, control circuit 602 includes a command decoder 611, a ZRST producing circuit 612, a ZUB0 producing circuit 613, a ZLB0 producing circuit 614, an ADV0 producing circuit 615, a ZWE0 producing circuit 616, a mask control circuit 617, a row control circuit 618, a WAIT control circuit 619 and a refresh control circuit 621.

Command decoder 611 produces row activating signal ACT and read signal READ according to the combination of the logical levels of the internal control signals produced from the external control signals.

Figure 47:
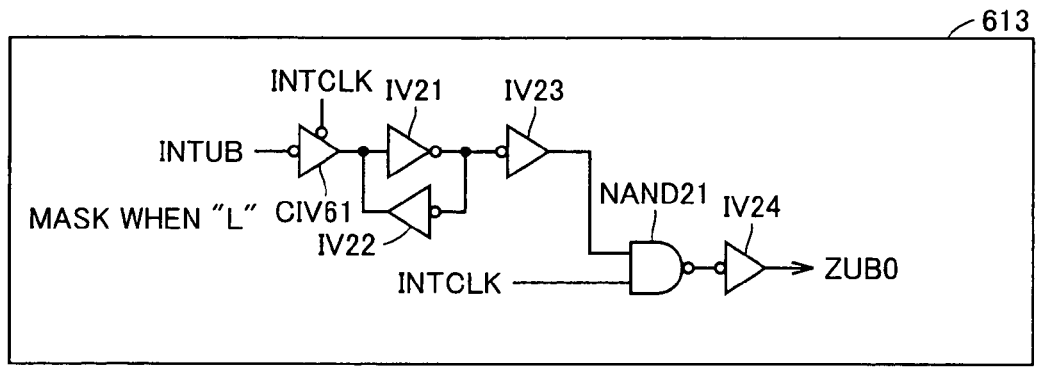
FIG. 47 shows a specific structure of a ZUB0 producing circuit 613.

FIG. 47 shows a specific structure of ZUB0 producing circuit 613. Referring to FIG. 47, a clocked inverter CIV61 receives internal higher byte mask signal INTUB. Clocked inverter CIV61 provides its output to a bistable circuit formed of inverters IV21 and IV22. The bistable circuit provides its output to an inverter IV23. The output of inverter IV23 and an internal clock INTCLK are sent to a NAND circuit NAND21. NAND circuit NAND21 provides its output to an inverter IV24, and the output of inverter IV24 forms ZUB0.

Figure 48:
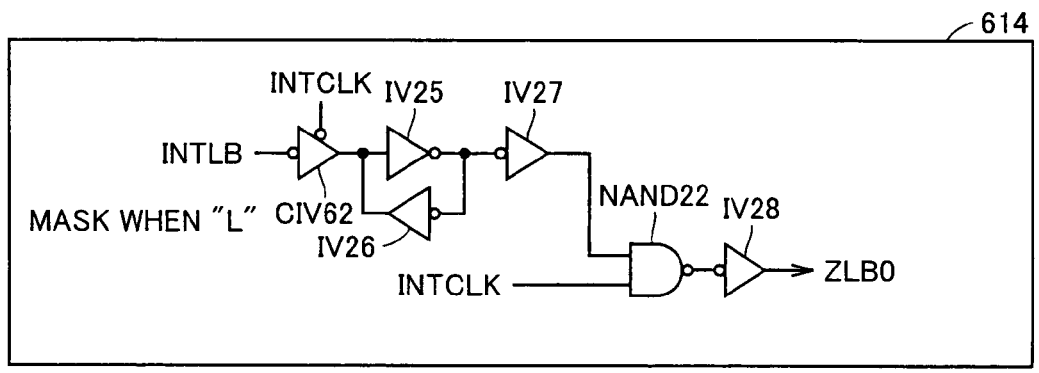
FIG. 48 shows a specific structure of a ZLB0 producing circuit 614.

FIG. 48 shows a specific structure of ZLB0 producing circuit 614. Referring to FIG. 48, a clocked inverter CIV62 receives internal lower byte mask signal INTLB. Clocked inverter CIV62 provides its output to a bistable circuit formed of inverters IV25 and IV26. The bistable circuit provides its output to an inverter IV27. The output of inverter IV27 and internal clock INTCLK are provided to a NAND circuit NAND22. NAND circuit NAND22 provides its output to an inverter IV28, of which output forms ZLB0.

Figure 49:
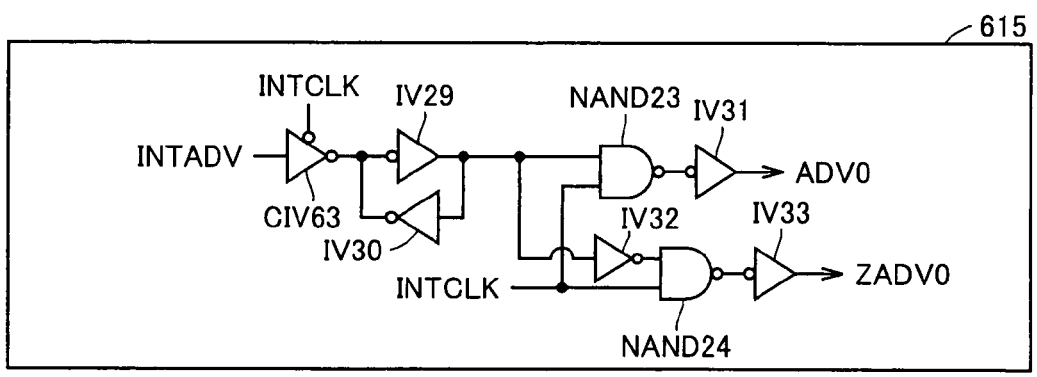
FIG. 49 shows a specific structure of an ADV0 producing circuit 615.

FIG. 49 shows a specific structure of ADV0 producing circuit 615. Referring to FIG. 49, a clocked inverter CIV63 receives an internal address take-in signal INTADV. Clocked inverter CIV63 provides its output to a bistable circuit formed of inverters IV29 and IV30. The output of the bistable circuit and internal clock INTCLK are provided to a NAND circuit NAND23. The output of NAND circuit NAND23 is sent to an inverter IV31, of which output forms ADV0. The output of the bistable circuit is sent to an inverter IV32. The output of inverter IV32 and internal clock INTCLK are sent to a NAND circuit NAND24. The output of NAND circuit NAND24 is sent to an inverter IV33, of which output forms ZADV0.

Figure 50:
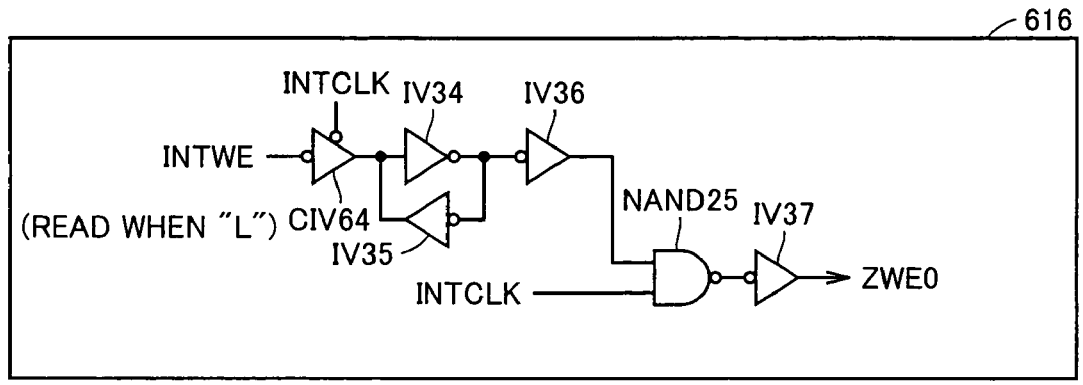
FIG. 50 shows a specific structure of a ZWE0 producing circuit 616.

FIG. 50 shows a specific structure of ZWE0 producing circuit 616. Referring to FIG. 50, a clocked inverter CIV64 receives an internal write enable signal INTWE. Clocked inverter CIV64 provides its output to a bistable circuit formed of inverters IV34 and IV35. The output of the bistable circuit is sent to an inverter IV36. The output of inverter IV36 and internal clock INTCLK are sent to NAND circuit NAND25. NAND circuit NAND25 provides its output to an inverter IV37, of which output forms ZWE0.

Figure 51:
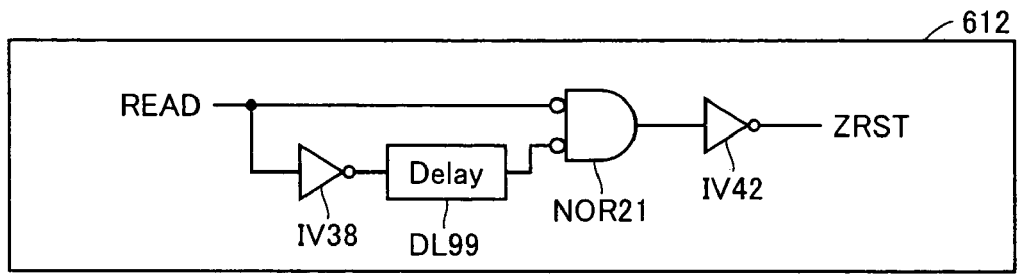
FIG. 51 shows a specific structure of a ZRST producing circuit 612.

FIG. 51 shows a specific structure of ZRST producing circuit 612. Referring to FIG. 51, an inverter IV38 receives read signal READ. A delay circuit (Delay) DL99 delays an output of an inverter IV99. A NOR circuit NOR21 receives read signal READ and the output of delay circuit (Delay) DL99. An inverter IV42 receives the output of NOR circuit NOR21. The output of inverter IV42 forms an inverted reset signal ZRST.

Figure 52:
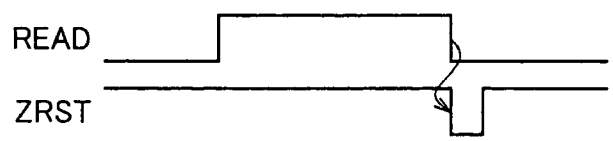
FIG. 52 illustrates timing of production of a ZRST.

FIG. 52 illustrates timing of production of inverted reset signal ZRST. AS shown in FIG. 52, inverted reset signal ZRST is activated to become a pulse at "L" level when read signal READ is deactivated to attain "L".

Figure 53:
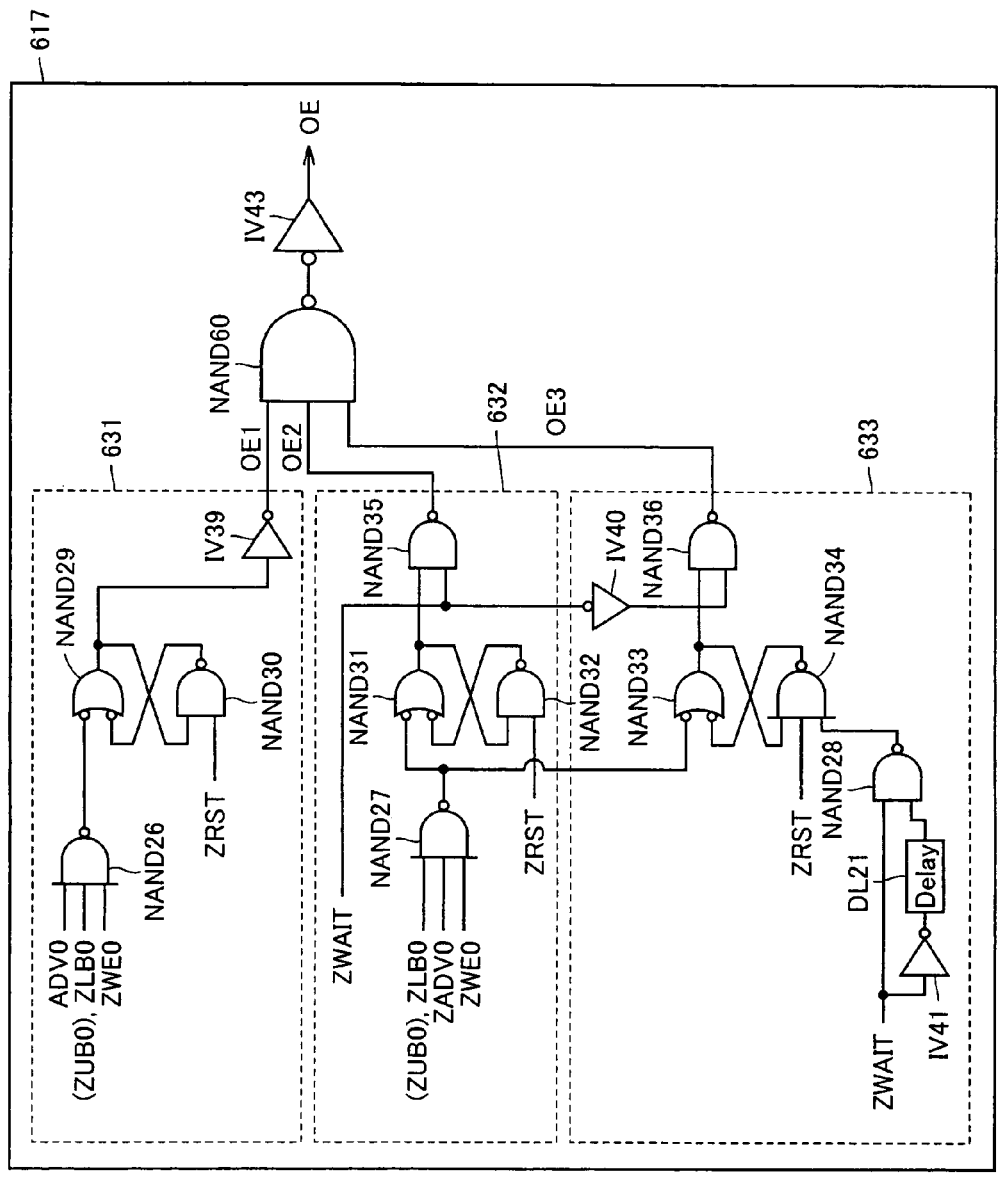
FIG. 53 shows a specific structure of a mask control circuit 617.

FIG. 53 shows a specific structure of mask control circuit 617. Although FIG. 53 shows only a lower side (LB), an upper side (UB) have substantially the same structure. Referring to FIG. 53, a NAND circuit NAND26 in a first control circuit 631 receives ADV0, ZLB0 and ZWE0. NAND circuits NAND29 and NAND30 form a flip-flop. NAND circuit NAND29 receives the output of NAND circuit NAND26. NAND circuit NAND30 receives inverted reset signal ZRST. An inverter IV39 receives the output of NAND circuit NAND29. The output of inverter IV39 forms a first output enable signal OE1. According to this structure, if an external byte mask signal LB# indicates that the byte mask is to be effected on the leading bit in the burst access, first control circuit 631 keeps first output enable signal OE1 at "L" from clock CLK, at which external byte mask signal LB# attains "H", to the point in time including the timing of output of the leading bit from output circuit 620.

In a second control circuit 632, a NAND circuit NAND27 receives ZADV0, ZLB0 and ZWE0. NAND circuits NAND31 and NAND32 form a flip-flop. NAND circuit NAND31 receives the output of NAND circuit NAND27. NAND circuit NAND31 receives inverted reset signal ZRST. A NAND circuit NAND35 receives a ZWAIT signal and the output of NAND circuit NAND31. The output of NAND circuit NAND35 forms a second output enable signal OE2. According to this structure, a second control circuit 632 operates as follows in the case where external byte mask signal LB# indicates that the byte mask is to be effected on the bit other than the leading bit, and the row access processing is not performed for change to a next row. In the above case, if the WAIT signal is at "H" when the bit in question is to be output to output circuit 620, second control circuit 632 sets second output enable signal OE2 to "L", as is usually done. If WAIT signal is at "L", second control circuit 632 does not set second output enable signal OE2 to "L", and provides a signal produced based on the byte mask signal (i.e., the output of NAND circuit NAND27) to a third control circuit 633.

In third control circuit 633, an inverter IV41 receives the ZWAIT signal. A delay circuit (Delay) DL21 delays the output of inverter IV41. A NAND circuit NAND28 receives the ZWAIT signal and the output of delay circuit (Delay) DL21. NAND circuits NAND33 and NAND34 form a flip-flop. NAND circuit NAND33 receives the output of NAND circuit NAND27. NAND circuit NAND34 receives inverted reset signal ZRST and the output of NAND circuit NAND28. An inverter IV40 receives the ZWAIT signal. A NAND circuit NAND36 receives the output of inverter IV40 and the output of NAND circuit NAND33. The output of NAND circuit NAND36 forms a third output enable signal OE3. According to the above structure, third control circuit 633 receives and holds a signal produced based on the byte mask signal. When the WAIT signal changes from "L" to "H", third control circuit 633 changes third output enable signal OE3 to "L".

A NAND circuit NAND60 receives first, second and third output enable signals OE1, OE2 and OE3. An inverter IV43 receives the output of NAND circuit NAND60, and provides output enable signal OE. NAND circuit NAND60 and inverter IV43 set output enable signal OE to "L" when at least one of first, second and third output enable signals OE1, OE2 and OE3 is at "L".

Referring to FIG. 44 again, row control circuit 618 controls the row access processing such as activation of the word line and amplification by the sense amplifier.

Refresh control circuit 621 controls the self-refresh operation of the DRAM cell array based on an internal refresh timer (not shown).

During the refresh control by refresh control circuit 621, and during the course of the burst reading in the no-wrap mode, the row access processing (deactivation of the word line in the last row, activation of the word line in the new row, and amplification by the sense amplifier) is performed for change to the next row after the processing is effected on the last column. In this case, WAIT control circuit 619 sets the level of the WAIT signal, which is to be output via the WAIT terminal, to "L". Thus, the WAIT signal set to "L" externally notifies that a waiting state is kept until the output of data.

(Access Operation without Change to the Next Row)

Figure 54:
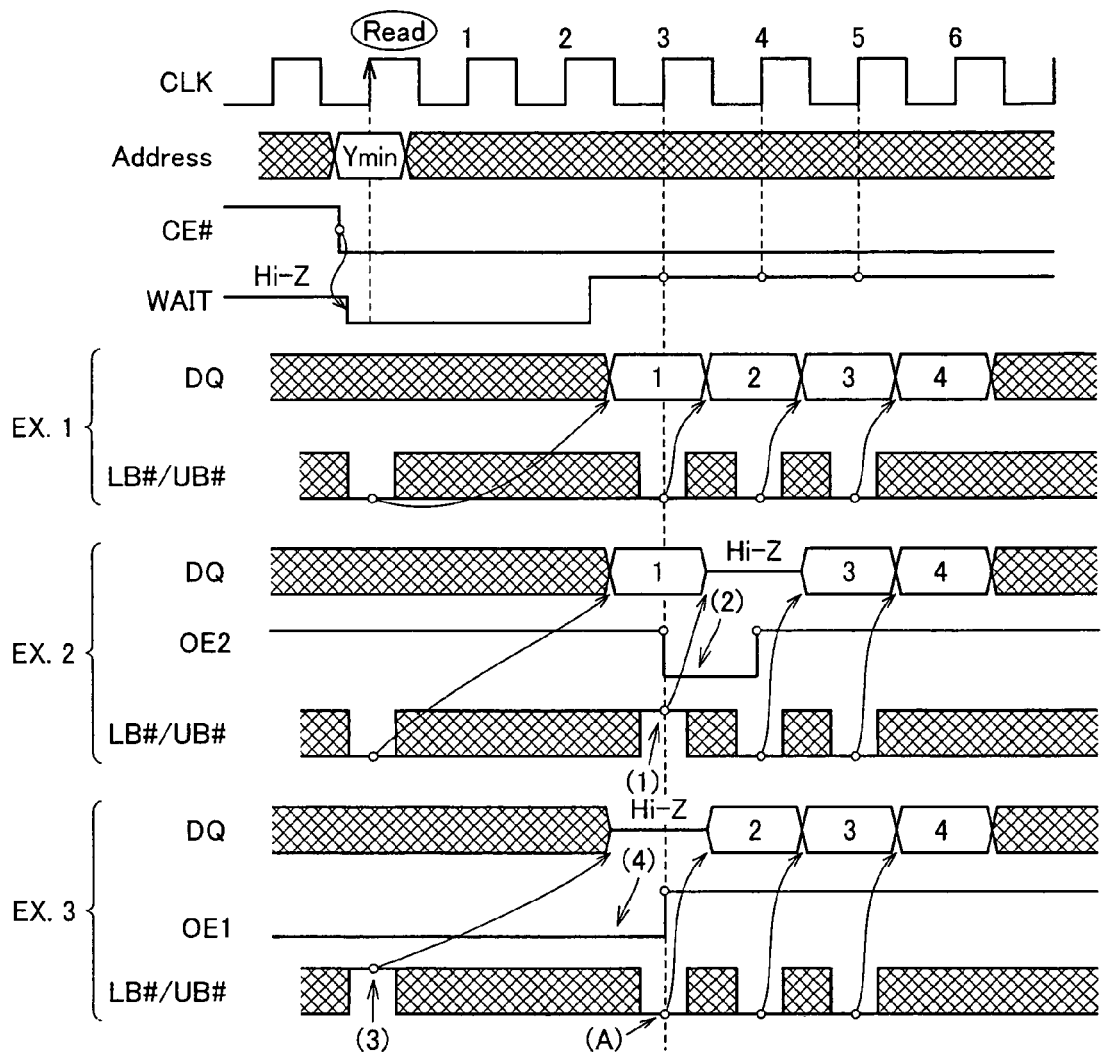
FIG. 54 is a timing chart illustrating changes of signals occurring in the case where change to a next row is not performed during a burst read operation in synchronous pseudo-SRAM 600 according to the sixth embodiment.

FIG. 54 is a timing chart illustrating changes in signal, which occur when change to the next row is not performed during the burst reading in synchronous pseudo-SRAM 600 according to the embodiment. Referring to FIG. 54, examples 1-3 of the operation will now be described.

Example 1

Masking is Not Performed

External byte mask signals LB# and UB# do not attain "H" in any case. In this case, first, second and third output enable signals OE1, OE2 and OE3 are at "H" over the whole period.

Example 2

Second Bit is Masked

External byte mask signals LB# and UB# are at "H" during (1) in FIG. 54. In this case, first and third output enable signals OE1 and OE3 are at "H" over the whole period. As indicated at (2) in FIG. 54, second output enable signal OE2 is at "L" according to timing of output the second bit from output circuit 620 (i.e., from rising of clock CLK3 to rising of clock CLK4).

Example 3

First Bit is Masked

External byte mask signals LB# and UB# are at "H" during (3) in FIG. 54. In this case, second and third output enable signals OE2 and OE3 are at "H" over the whole period. As indicated at (4) in FIG. 54, first output enable signal OE1 is at "L" from clock CLK, at which external byte mask signals LB# and UB# attain "H", to the point in time of output of the first bit from output circuit 620 (i.e., from rising of clock CLK0 to rising of clock CLK3).

(Access Operation Accompanied with Change to the Next Row in the No-Wrap Mode)

Figure 55:
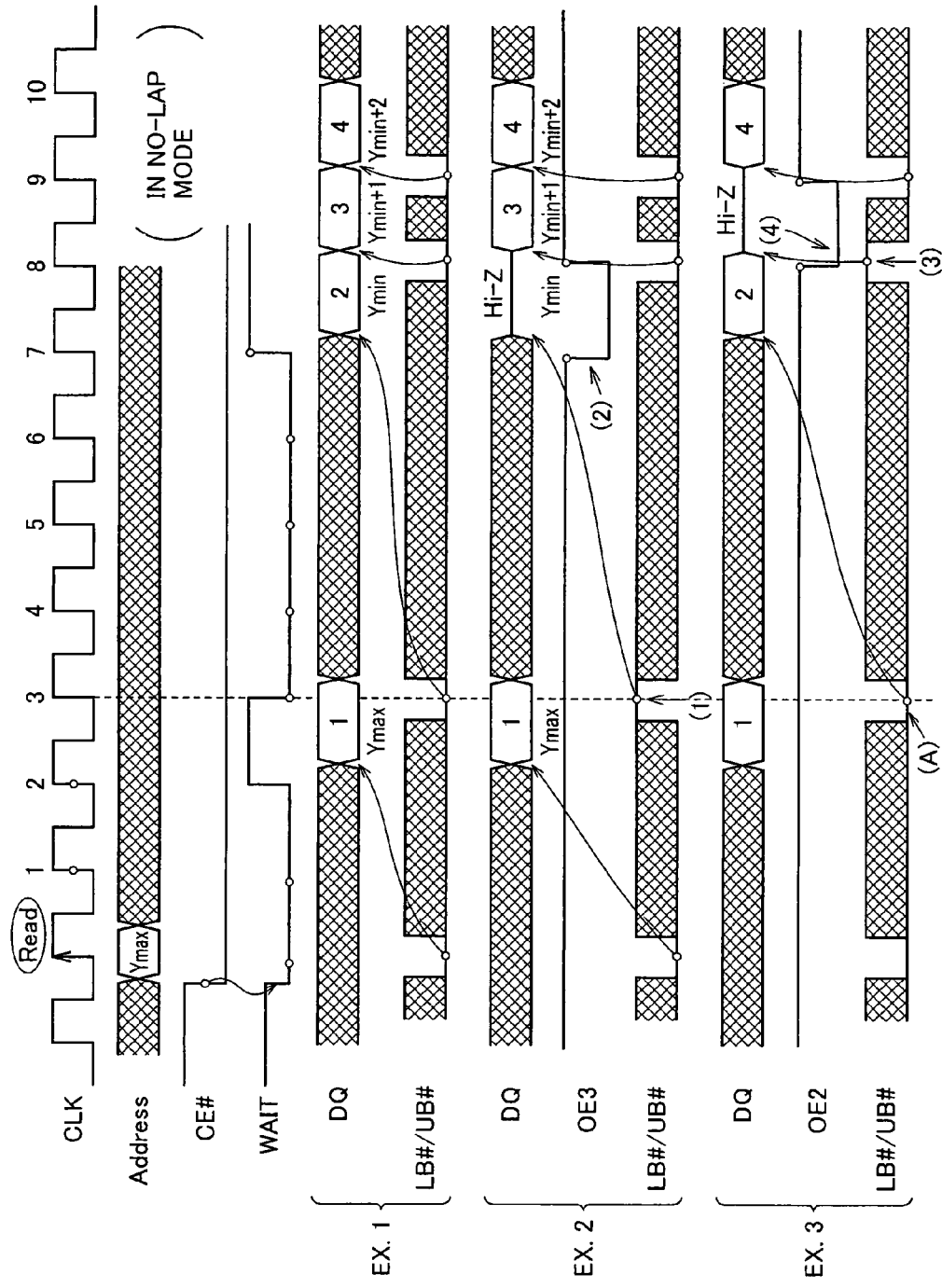
FIG. 55 is a timing chart illustrating changes of signals occurring in the case where change to a next row is performed during the burst read operation when synchronous pseudo-SRAM 600 according to the sixth embodiment is in a no-wrap mode.

FIG. 55 is a timing chart illustrating changes in the case where change to the next row is performed in the burst reading when synchronous pseudo-SRAM 600 of this embodiment is in the no-wrap mode. Referring to FIG. 55, examples 1-3 of the operations will now be described.

Example 1

Masking is Not Performed

External byte mask signals LB# and UB# do not attain "H". First, second and third output enable signals OE1, OE2 and OE3 are at "H" over the whole period.

Example 2

Second Bit is Masked, and Change to Next Row is Performed

External byte mask signals LB# and UB# are at "H" during (1) in FIG. 55. In this case, first and second output enable signals OE1 and OE2 are at "H" over the whole period. As indicated at (3) in FIG. 55, third output enable signal OE3 is at "L" according to timing of the operation, in which the WAIT signal attains "H" (i.e., from rising of a clock CLK7 to rising of a clock CLK8).

Thereby, the processing of masking the second bit is deferred until the WAIT signal attains "H" after the end of the processing of accessing the next row.

Example 3

Third Bit is Masked

External byte mask signals LB# and UB# are at "H" during (3) in FIG. 55. In this case, first and third output enable signals OE1 and OE3 at "H" over the whole period. As indicated at (4) in FIG. 55, second output enable signal OE1 is at "L" according to timing of output of the third bit from output circuit 620 (i.e., from rising of clock CLK8 to rising of clock CLK9).

Example 4

First Bit is Masked

Although not illustrated in the drawings, the signals change in the same manner as the example 3 in FIG. 54.

As is apparent from the above description, the timing of setting the byte mask signal of the second bit, i.e., the timing of applying external byte mask signals LB# and UB# is the timing indicated at (A) in FIG. 54 or 55. Therefore, even in the case of changing to the next row during the burst reading or burst writing, it is possible to apply externally the byte mask signal in the substantially same manner as the case where change to the next row is not performed.

This embodiment can be applied not only to the no-wrap mode, but can also be effectively applied to a continuous mode, in which read/write is continuously performed until the chip enable signal becomes inactive.

This embodiment is not restrictively applied to the synchronous pseudo-SRAM, and may be applied to various semiconductor memory devices operating in synchronization with clocks.

Seventh Embodiment

A seventh embodiment relates to a dual-purpose mobile/cellular RAM 700 having both functions of a mobile RAM and the cellular RAM. The cellular RAM is a synchronous pseudo-SRAM disclosed in the foregoing reference "CellularRAM® Memory". The mobile RAM is a synchronous pseudo-SRAM having a function peculiar to a cellular phone.

(Structure)

Figure 56:
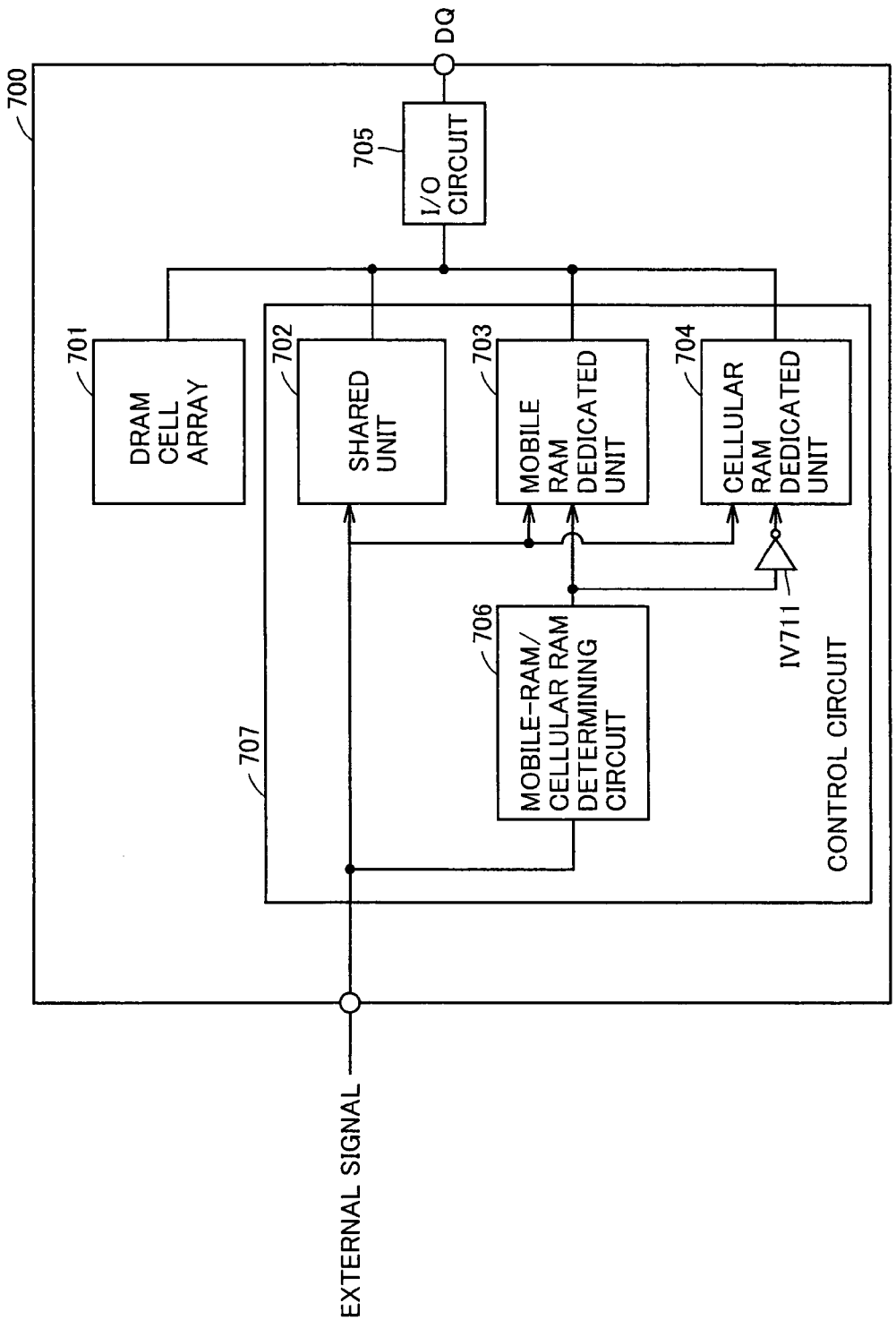
FIG. 56 shows a structure of a RAM 700 according to a seventh embodiment.

FIG. 56 shows a structure of a dual-purpose mobile/cellular RAM 700 of this embodiment. Referring to FIG. 56, dual-purpose mobile/cellular RAM 700 includes a DRAM cell array 701, a control circuit 707 and an I/O circuit 705.

DRAM cell array 701 is a memory array formed of cells of a Dynamic Random Access Memory (DRAM).

I/O circuit 705 receives externally applied data via data output terminal DQ, and externally provides data.

Control circuit 707 includes a shared unit 702, a mobile RAM dedicated unit 703, a cellular RAM dedicated unit 704, and a mobile-RAM/cellular RAM determining circuit 706.

Mobile-RAM/cellular RAM determining circuit 706 determines, according to the external signals, the unit to be operated among shared unit 702, mobile RAM dedicated unit 703 and cellular RAM dedicated unit 704, and operates it.

Shared unit 702 executes the functions to be executed in both the mobile RAM and the cellular RAM.

Mobile RAM dedicated unit 703 executes the function to be executed only by the mobile RAM.

Cellular RAM dedicated unit 704 executes the function to be executed only by the cellular RAM.

Figure 57:
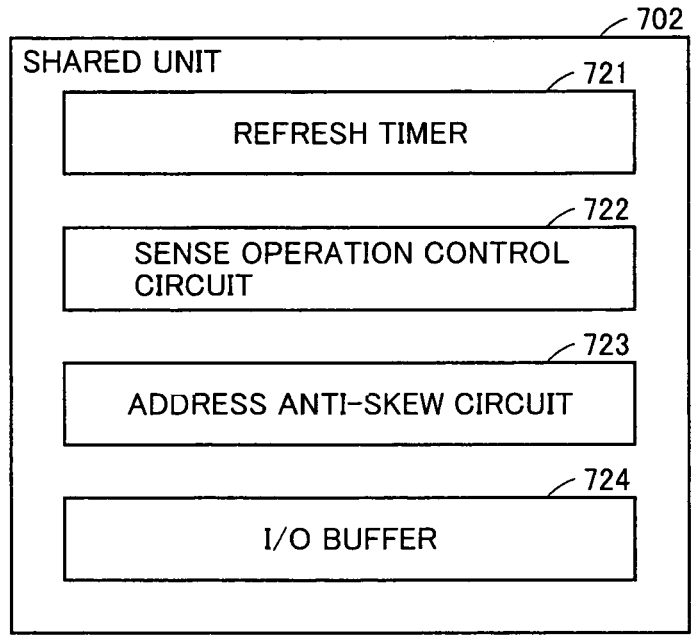
FIG. 57 illustrates a structure of a shared unit 702.

FIG. 57 illustrates a structure of shared unit 702. As illustrated in FIG. 57, shared unit 702 includes a refresh timer 721, a sense operation control circuit 722, an address anti-skew circuit 723 and an I/O buffer 724.

Refresh timer 721 provides a timing signal for performing the self-refresh.

Sense operation control circuit 722 controls the operation of the sense amplifier.

Address anti-skew circuit 723 performs control to prevent address skew.

I/O buffer 724 receives and holds the external control signals, external address signals and external clocks, and produces the internal control signals, internal address signals and internal clocks. Also, I/O buffer 724 holds the data to be externally output.

Figure 58:
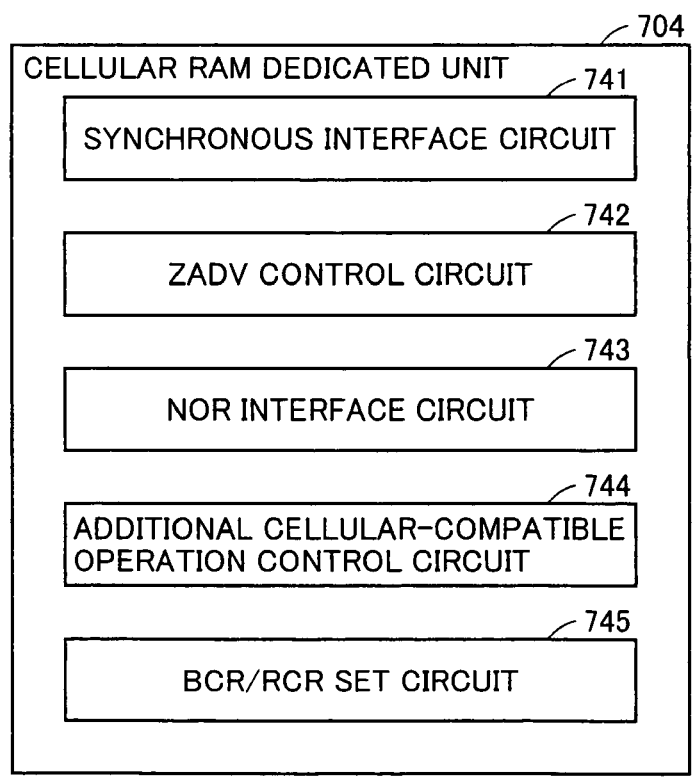
FIG. 58 illustrates a structure of a cellular RAM dedicated unit 704.

FIG. 58 illustrates a structure of a cellular RAM dedicated unit 704. As illustrated in FIG. 58, cellular RAM dedicated unit 704 includes a synchronous interface circuit 741, a ZADV control circuit 742, a NOR interface circuit 743, an additional Cellular-compatible operation control circuit 744 for control of other operations, and a BCR/RCR set circuit 745.

Synchronous interface circuit 741 controls operations synchronized with the clock.

ZADV control circuit 742 controls an operation of taking in the external address based on external address take-in signal ADV#.

NOR interface circuit 743 controls an interface to a NOR-type flash memory,

Additional Cellular-compatible operation control circuit 744 controls, e.g., an SRAM-compatible interface.

BCR/RCR set circuit 745 sets BCR and RCR.

Figure 59:
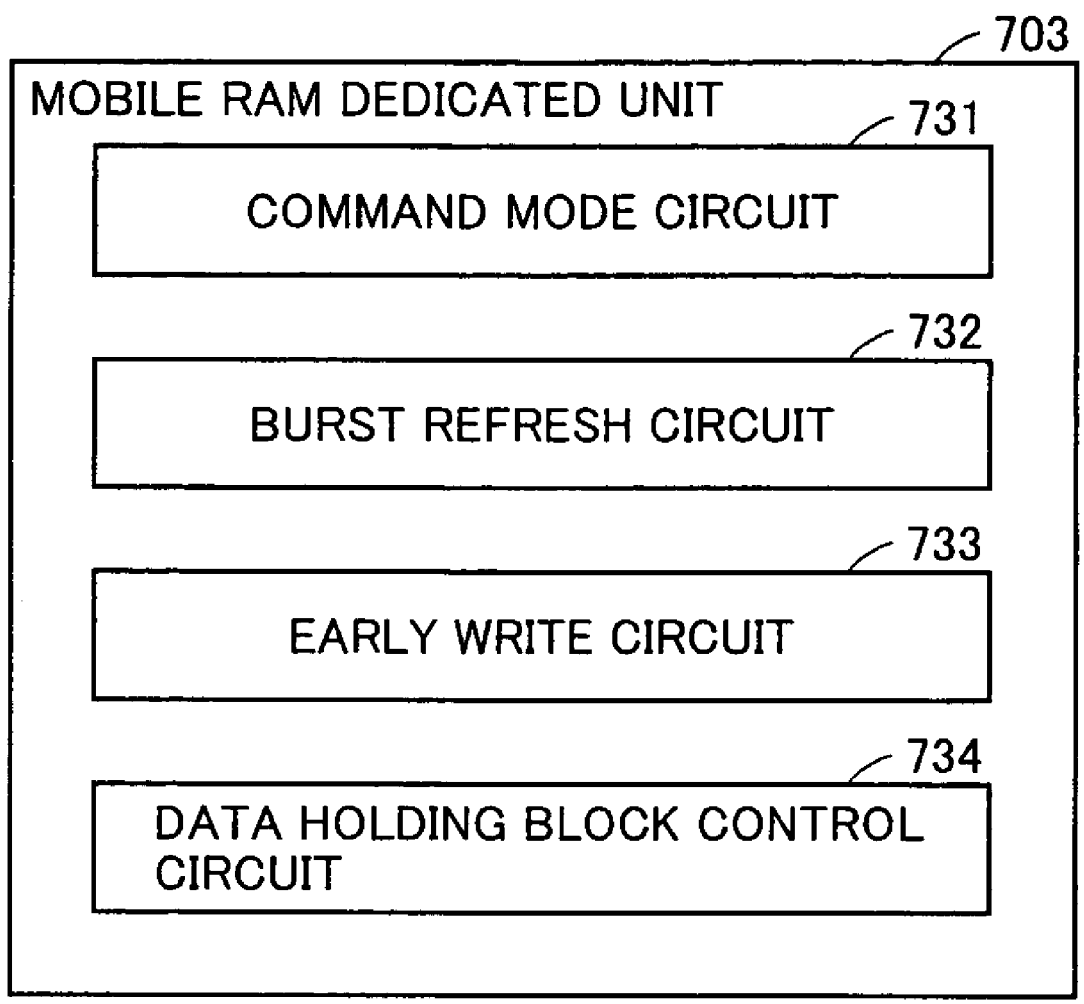
FIG. 59 illustrates a structure of a mobile RAM dedicated unit 703.

FIG. 59 illustrates a structure of a mobile RAM dedicated unit 703. As illustrated in FIG. 59, mobile RAM dedicated unit 703 includes a command mode circuit 731, a burst refresh circuit 732, an early write circuit 733 and a data holding block control circuit 734.

Command mode circuit 731 sets and resets internal registers according to a combination of external signals.

Burst refresh circuit 732 holds a refresh request in an internal counter, and will continuously perform the refresh operation in response to application of certain constant timing.

Early write circuit 733 controls an early write operation, i.e., the write operation to be performed according to early timing.

Data holding block control circuit 734 performs the control to refresh only the selected block, and thereby holds only the data in the selected block.

As described above, since the RAM according to this embodiment is configured to achieve efficiently both the functions of the cellular RAM and the mobile RAM, production management can be performed efficiently, and inventories can be reduced at the time of changeover of products. Also, it is possible to reduce a development cost.

Eighth Embodiment

An eighth embodiment relates to a synchronous pseudo-SRAM, which uses a burst length counter for executing precharging.

(Structure)

Figure 60:
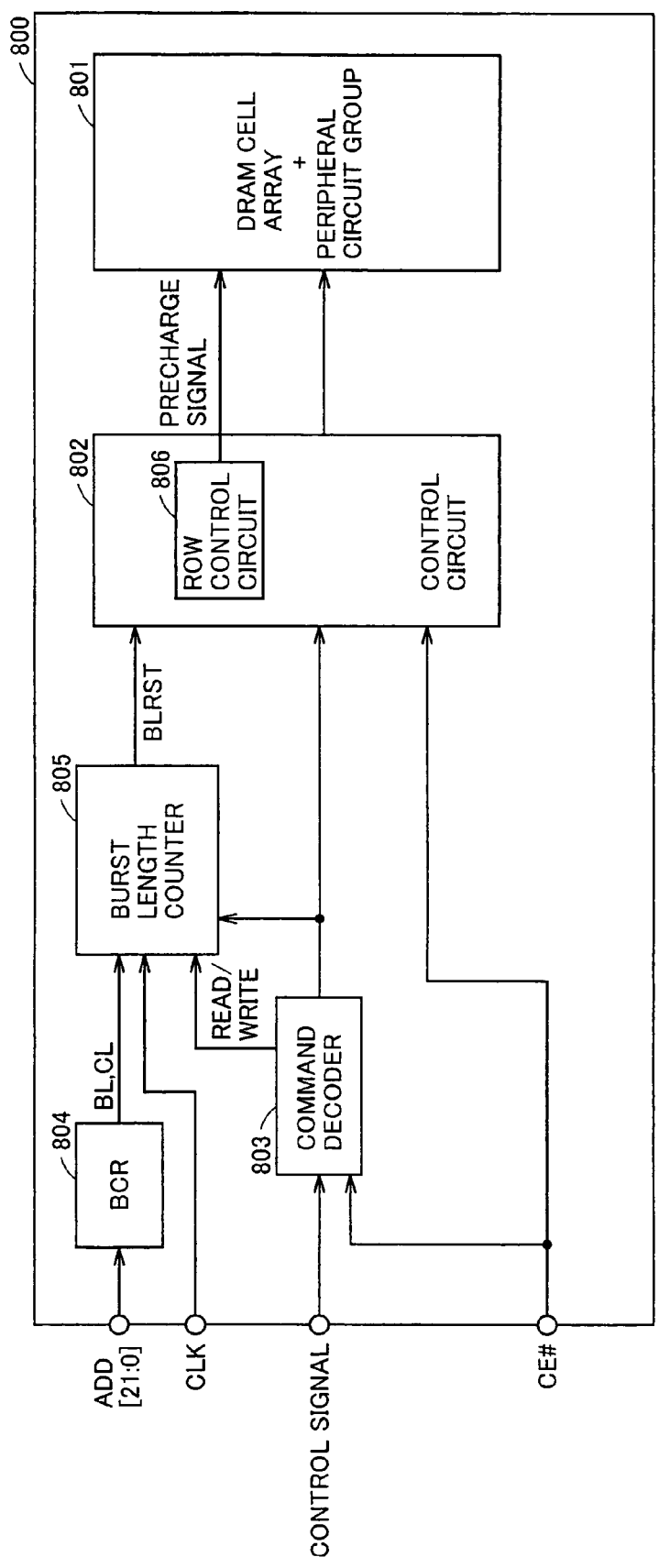
FIG. 60 shows a structure of a synchronous pseudo-SRAM 800 according to an eighth embodiment.

FIG. 60 shows a structure of a synchronous pseudo-SRAM 800 according to the embodiment. Referring to FIG. 60, synchronous pseudo-SRAM 800 includes a DRAM cell array and peripheral circuit group 801, a control circuit 802, a command decoder 803, a BCR (Burst Configuration Register) 804 and a burst length counter 805.

The DRAM cell array in DRAM cell array and peripheral circuit group 801 is a memory array formed of cells of a Dynamic Random Access Memory (DRAM). The peripheral circuit group includes global I/O line pair GIOP (GIO and /GIO) as well as column select lines provided corresponding to the respective columns, column select gates, sense amplifiers, preamplifiers, a write driver, a row decoder, a column decoder and others.

Command decoder 803 produces row activating signal ACT, read signal READ and write signal WRITE according to the combination of the logical levels of the internal control signals produced from the external control signals.

BCR 804 stores an interface to the external system such as burst length BL, command latency CL and others.

Figure 61:
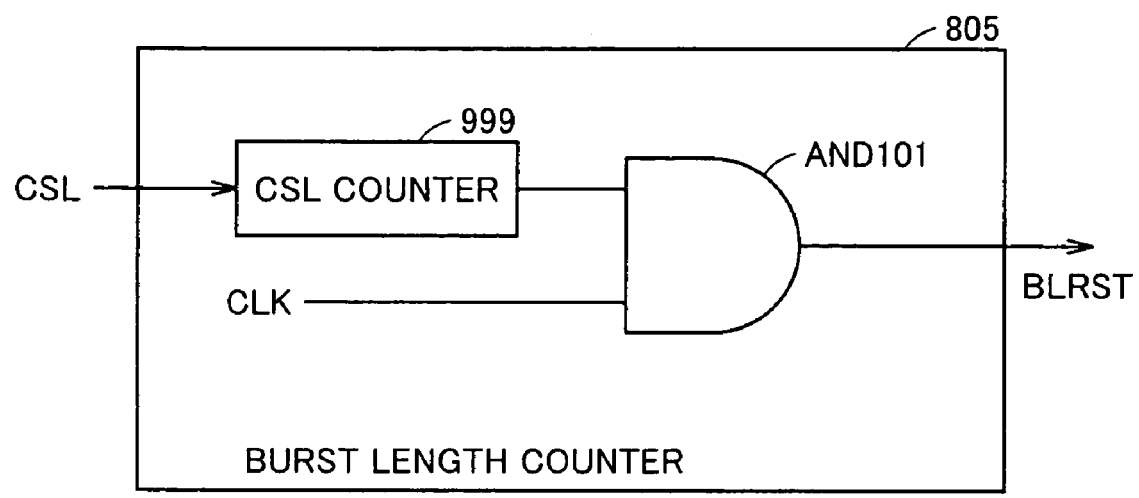
FIG. 61 shows a specific structure of a burst length counter 805.

FIG. 61 shows a specific structure of burst length counter 805. Referring to FIG. 61, burst length counter 805 includes a CSL counter 999 and an AND circuit AND101. CSL counter 999 receives column select signal CSL. When CSL counter 999 counts the pulses of column select signal CSL, which are equal in number to the value of burst length BL, it provides "H". AND circuit AND101 receives external clock CLK and the output of CSL counter 999, and activates a burst length reset signal BLRST to attain "H" according to timing of first input of clock CLK after the output of CSL counter 999 attains "H".

Control circuit 802 includes a row control circuit 806. When row control circuit 806 receives burst length reset signal BLRST, it activates a precharge signal PRC. This precharge signal PRC deactivates the word line, and precharges the bit line pair.

(Operation)

Figure 62:
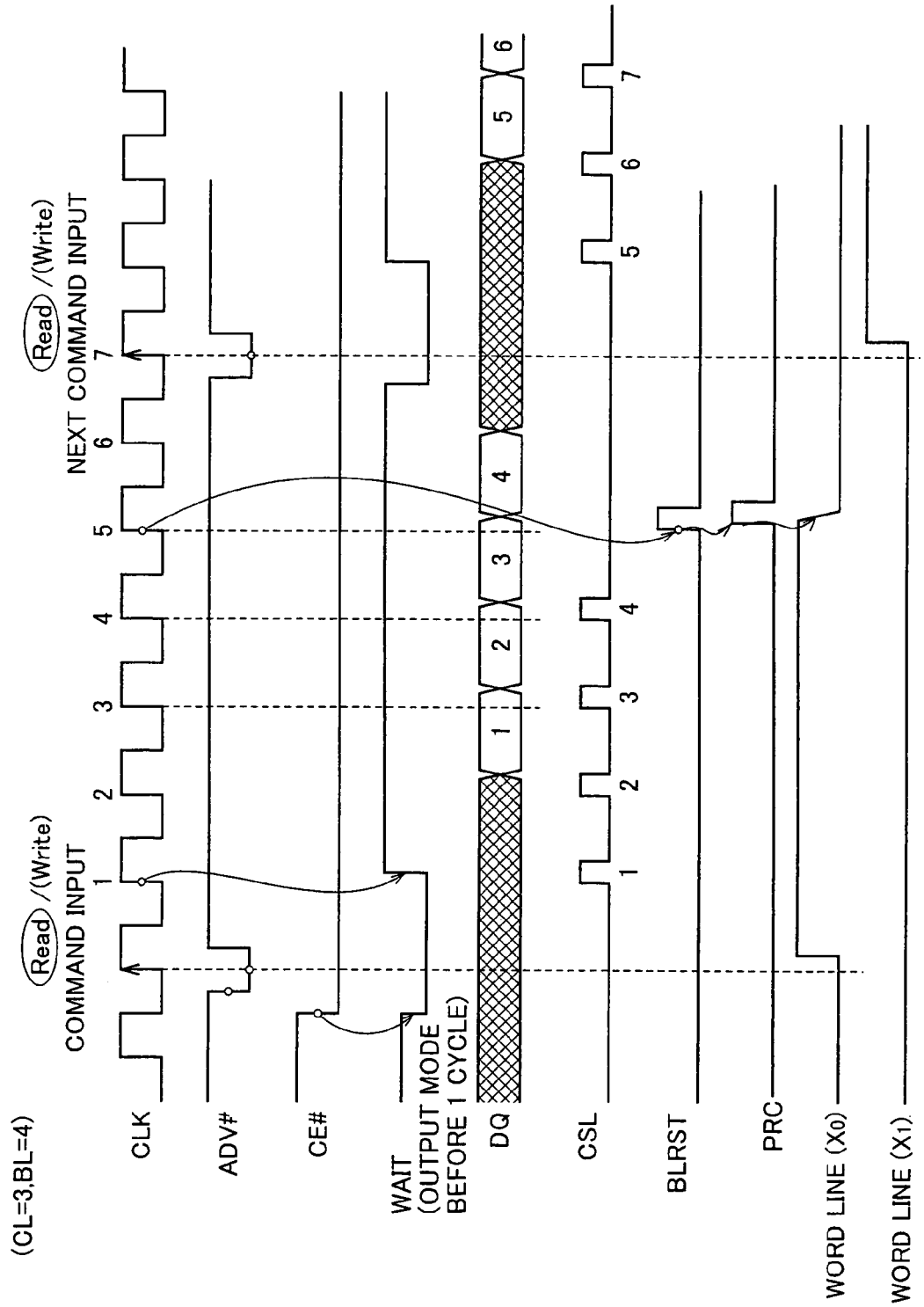
FIG. 62 is a timing chart illustrating deactivation of word lines.

FIG. 62 is a timing chart illustrating deactivation of the word line. As illustrated in FIG. 62, when read signal READ and write signal WRITE are received at clock CLK0, and column select signal CSL for selecting the last column in the burst access becomes active at clock CLK CLK4 owing to command latency CL equal to 2 and burst length BL equal to 4. Burst length counter 805 activates burst length reset signal BLRST to attain "H" at clock CLK5, i.e., fifth clock corresponding to (CL+BL−1=5) after clock CLK0. Based on this burst length reset signal BLRST, precharge signal PRC is activated so that the selected word line ($X_0$) is deactivated, and the bit line pair is precharged.

According to the synchronous pseudo-SRAM of the embodiment, as described above, when burst length counter 805 counts the pulses of column select signal CSL, which are equal in number to the value of burst length BL, it activates burst length reset signal BLRST so that the word line can be deactivated without returning external chip enable signal CE# to "H".

According to the synchronous pseudo-SRAM of the embodiment, as described above, the word line is not deactivated according to external control, but is deactivated according to internal control so that the control can be simple.

Such a manner may be employed that the reset signal is generated in response to the falling of external address take-in signal ADV#, and precharge signal PRC may be generated in response to this reset signal.

According to this embodiment, although the word line is deactivated based on burst length reset signal BLRST, this is not restrictive. For example, a standby state, in which neither reading nor writing is performed, may be attained based on burst length reset signal BLRST.

This embodiment is not restrictively applied to the synchronous pseudo-SRAM, and may be applied to various semiconductor memory devices operating in synchronization with clocks.

Ninth Embodiment

A ninth embodiment relates to a synchronous pseudo-SRAM having a mode, in which a synchronous mode is fixed.

(Setting of Synchronous/Asynchronous Mode in the Background Art)

First, description will be given on setting of synchronous/asynchronous mode of the CellularRAM® in the background art.

FIG. 63 illustrates a manner of setting the synchronous/asynchronous mode in the background art. As illustrated in FIG. 63, when tCSP is equal to or greater than 20 ns, the asynchronous-fixed mode is set regardless of a value of BCR[15], which is a 15th bit in the BCR (Bus Configuration Register). When tCSP is smaller than 20 ns, the mode is set depending on the value of BCR[15]. tCSP is a time from the falling of external chip enable signal CE# to the rising of external clock CLK.

FIGS. 64A and 64B illustrate the setting of the modes according to the value of tCSP. In FIG. 64A, tCSP is 7.5 ns. In this case, since tCSP is smaller than 20 ns, reference is made to the value of BCR[15]. When the value is zero, synchronous/asynchronous mixed mode is set. When the value is one, asynchronous-fixed mode is set.

In FIG. 64B, tCSP is 22.5 ns. In this case, tCSP is equal to or greater than 20 ns. Therefore, when 20 ns elapses from the falling of external clock CLK, asynchronous-fixed mode is set.

As is apparent from the above description and FIG. 64B, when the clock frequency is low, the asynchronous-fixed mode is forcedly set. Therefore, the operation in the synchronous mode cannot be performed with a low clock frequency.

Therefore, the embodiment provides the synchronous pseudo-SRAM, which can be set to the synchronous mode even when tCSP is equal to or smaller than 20 ns, and thus, even when the clock frequency is low.

Setting of Synchronous/Asynchronous Mode of the Embodiment

FIG. 65 illustrates a manner of setting the synchronous/asynchronous mode in this embodiment. As illustrated in FIG. 65, when the value of BCR[16] is zero, the synchronous-fixed mode is set regardless of the values of tCSP and BCR[15]. When the value of BCR[16] is one, the mode is set similarly to the conventional manner depending on the values of tCSP and BCR[15].

(Structure)

Figure 66:
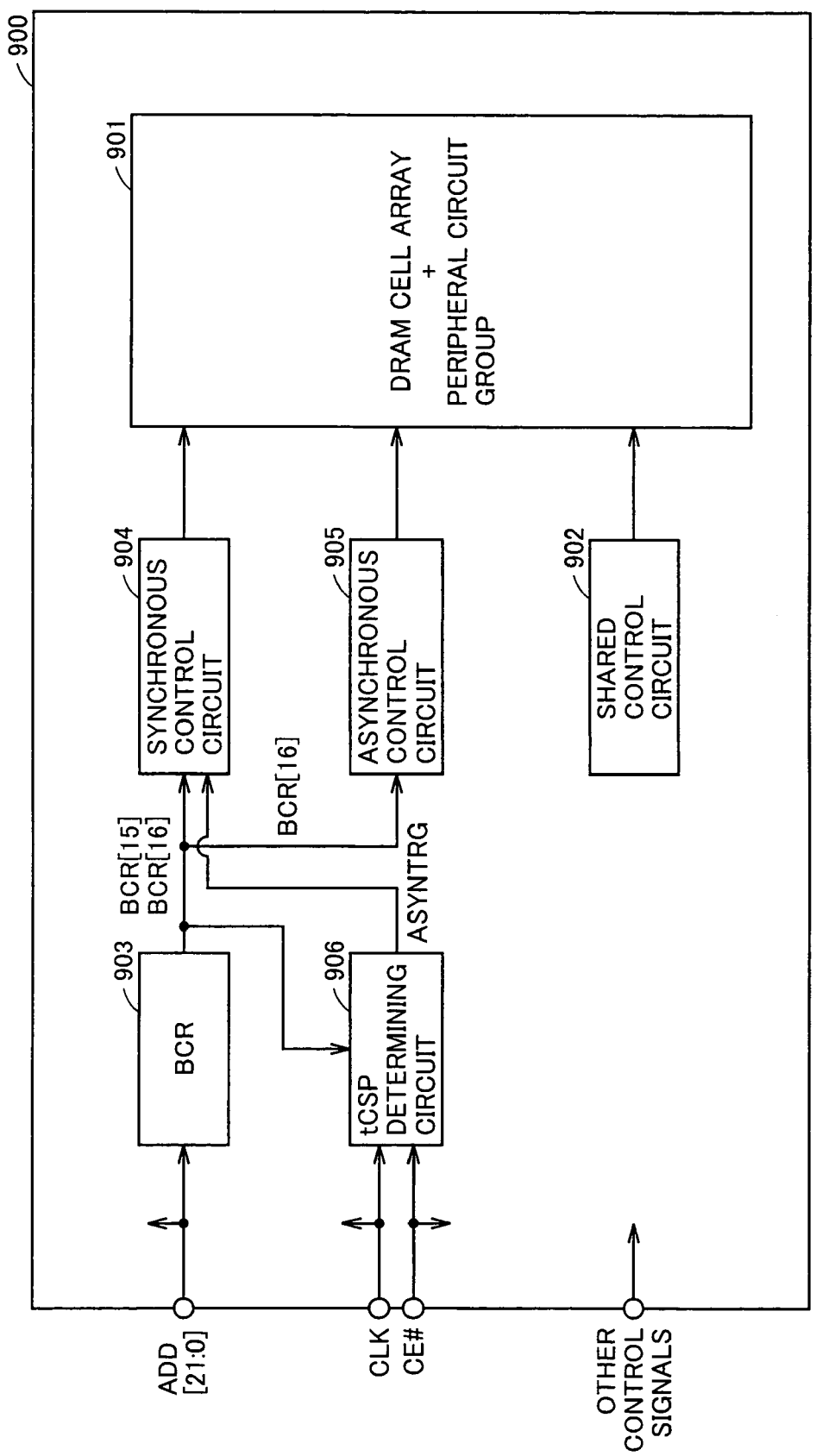
FIG. 66 shows a structure of a synchronous pseudo-SRAM 900 according to the ninth embodiment.

FIG. 66 shows a structure of a synchronous pseudo-SRAM 900 according to the embodiment. Referring to FIG. 66, synchronous pseudo-SRAM 900 includes a DRAM cell array and peripheral circuit group 901, a BCR (Bus Configuration Register) 903, a tCSP determining circuit 906, a synchronous control circuit 904, an asynchronous control circuit 905 and a shared control circuit 902.

The DRAM cell array in DRAM cell array and peripheral circuit group 901 is a memory array formed of cells of a Dynamic Random Access Memory (DRAM). The peripheral circuit group includes global I/O line pair GIOP (GIO and /GIO) as well as column select lines provided corresponding to the respective columns, column select gates, sense amplifiers, preamplifiers, a write driver, a row decoder, a column decoder and others.

BCR 903 defines an interface to the external system.

tCSP determining circuit 906 asserts asynchronous control signal ASYNTRG when a time of 20 ns or greater elapses from the falling of external chip enable signal CE# to the rising of external clock CLK. tCSP determining circuit 906 receiving BCR[15] and BCR[16] does not perform the processing of determining tCSP when BCR[15] is equal to one, or BCR[16] is equal to zero. In these cases, it is not necessary to determine tCSP because the synchronous-fixed mode is set when BCR[16] is equal to zero, and the asynchronous-fixed mode is set when BCR[16] is equal to one and BCR[15] is equal to one.

Synchronous control circuit 904 receives BCR[16], asynchronous control signal ASYNTRG and BCR[15], and becomes active when the combination of them indicates the synchronous-fixed mode or the synchronous/asynchronous-mixed mode illustrated in FIG. 65. More specifically, when BCR[16] is equal to zero, or when BCR[16] is equal to one, asynchronous control signal ASYNTRG is inactive and BCR[15] is equal to zero, synchronous control circuit 904 becomes active. In other cases, synchronous control circuit 904 becomes inactive. When synchronous control circuit 904 is active, it controls the operations of synchronous pseudo-SRAM 900 synchronized with external clock CLK.

Asynchronous control circuit 905 receives BCR[16], asynchronous control signal ASYNTRG and BCR[15], and becomes active when the combination of them indicates the synchronous/asynchronous mixed mode illustrated in FIG. 65. In the cases, it becomes inactive. More specifically, when BCR[16] is equal to one, asynchronous control circuit 905 becomes active. When BCR[16] is equal to zero, asynchronous control circuit 905 becomes inactive. When it is active, asynchronous control circuit 905 controls the operations not synchronized with external clock CLK of synchronous pseudo-SRAM 900.

Shared control circuit 902 controls operations independent of synchronization and non-synchronization with external clock CLK.

According to the synchronous pseudo-SRAM of the embodiment, as described above, the synchronous-fixed mode can be set independently of the value of tCSP so that the operation synchronized with the clock can be performed even with a low clock frequency.

According to the embodiment, the synchronous/asynchronous modes are set by using neighboring bits such as BCR[15] and BCR[16], this facilitates the circuit connection.

According to this embodiment, the synchronous-fixed mode is set according to the value of BCR[16]. However, this is not restrictive. For example, the synchronous-fixed mode may be set according to, e.g., another bit of BCR, a bit of another register, a bonding option or an external signal.

This embodiment is not restrictively applied to the synchronous pseudo-SRAM, and may be applied to various semiconductor memory devices having the synchronous mode for operation in synchronization with a clock and an asynchronous mode for operation asynchronous to the clock.

Tenth Embodiment

A tenth embodiment relates to a synchronous pseudo-SRAM, which uses external chip enable signal CE# for controlling activation/deactivation of the input buffer, and avoids a problem, which may arise when external chip enable signal CE# is activated without synchronization with the clock.

(Structure)

Figure 67:
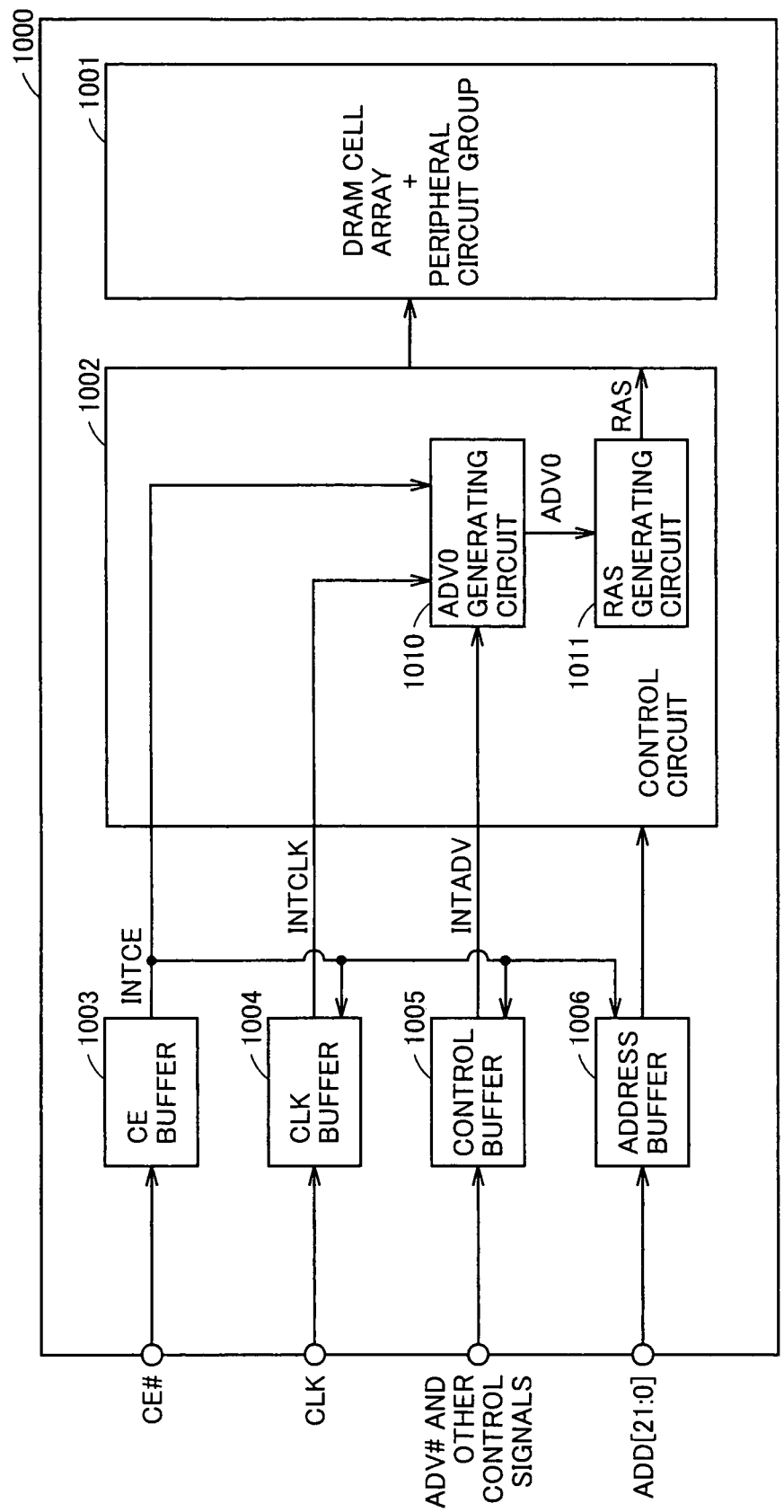
FIG. 67 shows a structure of a synchronous pseudo-SRAM 1000 according to a tenth embodiment.

FIG. 67 shows a structure of synchronous pseudo-SRAM 1000 according to this embodiment. Referring to FIG. 67, synchronous pseudo-SRAM 1000 includes a DRAM cell array and peripheral circuit group 1001, a control circuit

1002, a CE buffer 1003, a CLK buffer 1004, a control buffer 1005 and an address buffer 1006.

The DRAM cell array in DRAM cell array and peripheral circuit group 1001 is a memory array formed of cells of a Dynamic Random Access Memory (DRAM). The peripheral circuit group includes global I/O line pair GIOP (GIO and /GIO) as well as column select lines provided corresponding to the respective columns, column select gates, sense amplifiers, preamplifiers, a write driver, a row decoder, a column decoder and others.

Address buffer 1006 receives external address signal ADD[21:0], and produces the internal address signal.

CE buffer 1003 receives external chip enable signal CE#, and produces internal chip enable signal INTCE. Internal chip enable signal INTCE is sent to CLK buffer 1004, control buffer 1005 and address buffer 1006. These input buffers stop the operations when internal chip enable signal INTCE is at "L" indicating deactivation of the chip. When internal chip enable signal INTCE is at "H" indicating activation of the chip, these input buffers operate normally. During the stop of operations, these input buffers cannot hold external signals applied thereto, and cannot provide internal signals.

CLK buffer 1004 receives external clock CLK, holds it as a buffer clock BUFFCLK and produces internal clock INTCLK.

Control buffer 1005 receives control signals (including address take-in signal ADV#) other than external chip enable signal CE#, and produces internal control signals. For example, when control buffer 1005 receives external address take-in signal ADV#, it produces internal address take-in signal INTADV.

Control circuit 1002 includes an ADV0 generating circuit 1010 and a RAS generating circuit 1011.

ADV0 generating circuit 1010 produces address take-in trigger signal ADV0 from internal chip enable signal INTCE, internal clock INTCLK and an inverted internal address take-in signal ZINTADV.

RAS generating circuit 1011 produces a row address strobe signal RAS from address take-in trigger signal ADV0.

(ADV0 Generating Circuit in the Background Art)

Figure 68:
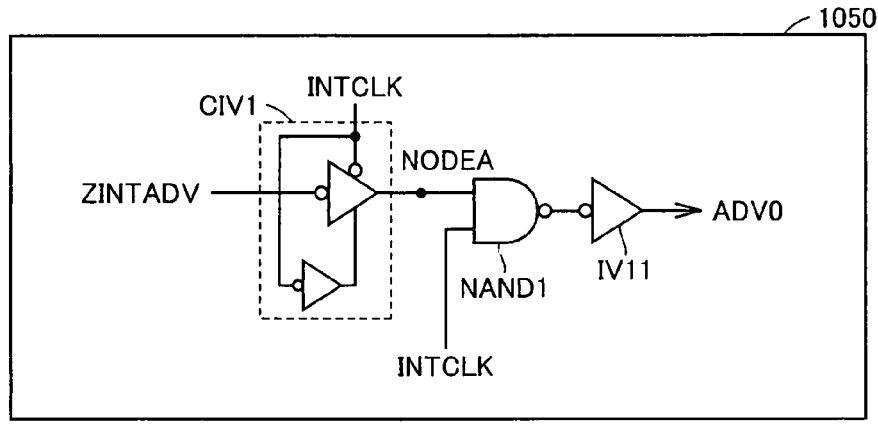
FIG. 68 shows a structure of an ADV0 generating circuit 1050 in the background art.

FIG. 68 shows a structure of an ADV0 generating circuit 1050 in the background art. Referring to FIG. 68, a clocked inverter CIV1 receives inverted internal address take-in signal ZINTADV. A NAND circuit NAND1 receives the output of clocked inverter CIV1 and internal clock INTCLK, and inverter IV1 receives the output of NAND circuit NAND1. The output of inverter IV1 forms address take-in trigger signal ADV0.

(Operation in the Background Art)

If the ADV0 generating circuit in the background art is used, the following problem arise when external chip enable signal CE# is changed asynchronously to external clock CLK.

Figure 69:
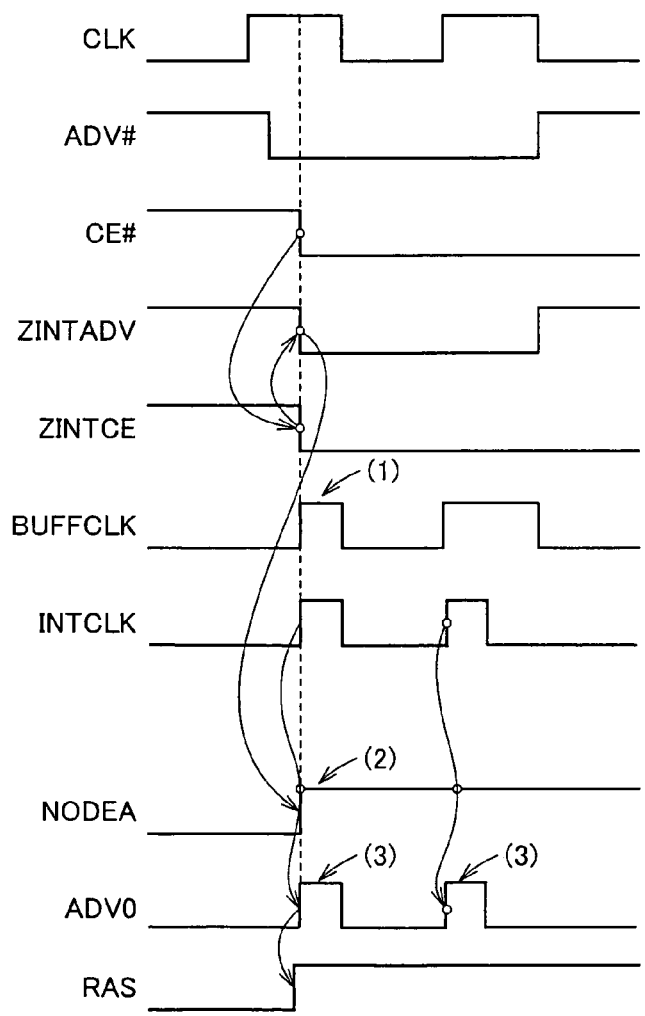
FIG. 69 illustrates timing of changes occurring in various signals when ADV0 generating circuit 1050 in the background art is used.

FIG. 69 illustrates timing of changes of various signals, which occur when ADV0 generating circuit 1050 in the background art is used. Referring to FIG. 69, external clock CLK, external address take-in signal ADV# and external chip enable signal CE# are applied as illustrated in FIG. 69. When external chip enable signal CE# is at "H", CLK buffer 1004 and control buffer 1005 are not operating, and only CE buffer 1003 takes in external chip enable signal CE#, and produces internal chip enable signal INTCE. In response to the activation (i.e., setting to "L") of external chip enable signal CE#, inverted internal chip enable signal ZINTCE attains "L".

When inverted internal chip enable signal ZINTCE attains "L", control buffer 1005 resumes the operation, and takes in external address take-in signal ADV# to produce internal address take-in signal INTADV. At this point in time, external address take-in signal ADV# is at "L" so that inverted internal address take-in signal ZINTADV is at "L".

When inverted internal chip enable signal ZINTCE attains "L", CLK buffer 1004 resumes the operation to take in external clock CLK, and produces internal clock INTCLK of a constant pulse width in response to the rising of buffer clock BUFFCLK held therein. Before inverted internal chip enable signal ZINTCE attains "L", CLK buffer 1004 does not hold external clock CLK so that buffer clock BUFFCLK in CLK buffer 1004 indicated at (1) in FIG. 69 does not have a pulse width equal to that of external clock CLK. This reduces a time interval between first and second internal clocks INTCLK.

Clocked inverter CIV1 in ADV0 generating circuit 1050 receives inverted internal address take-in signal ZINTADV, and provides an output NODEA, which rises to "H" at the rising of internal clock INTCLK as indicated at (2) in FIG. 69.

NAND circuit NAND1 and an inverter IV1 in ADV0 generating circuit 1050 produces address take-in trigger signal ADV0 from output NODEA of clocked inverter CIV1 and internal clock INTCLK. The pulses of address take-in trigger signal ADV0 are formed of leading and subsequent pulses of internal clock INTCLK as indicated at (3) in FIG. 69.

RAS generating circuit 1011 activates row address strobe signal RAS to attain "H" in accordance with the rising of the leading pulse of address take-in trigger signal ADV0. Consequently, row address strobe signal RAS is activated according to timing, which is earlier than the intended timing, and precedes the rising (i.e., the intended start timing of access) of clock CLK immediately following the time of input of external chip enable signal CE#, and this early activation starts the next processing. The above unpreferable situation and problem have recently been found.

ADV0 Generating Circuit of the Embodiment

For avoiding the above problem, the ADV0 generating circuit of this embodiment has a structure different from that in the background art.

Figure 70:
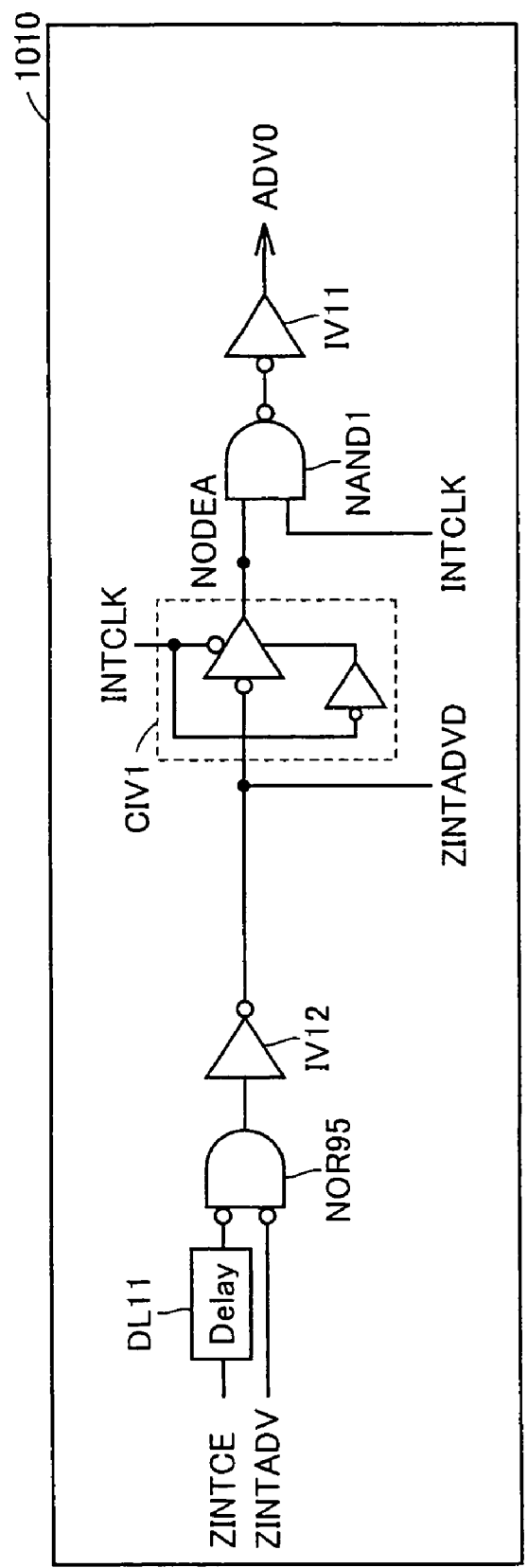
FIG. 70 shows a structure of an ADV0 generating circuit 1010 in the tenth embodiment.

FIG. 70 shows a structure of ADV0 generating circuit 1010 of the embodiment. ADV0 generating circuit 1010 includes the same structure as conventional ADV0 generating circuit 1050, and additionally includes a delay circuit (Delay) DL11, NOR circuit NOR95 and an inverter IV12. Referring to FIG. 70, delay circuit (Delay) DL11 receives inverted internal chip enable signal ZINTCE. NOR circuit NOR95 receives the output of delay circuit (Delay) DL11 and inverted internal address take-in signal ZINTADV. Inverter IV12 receives the output of NOR circuit NOR95, and provides an inverted delayed internal address take-in signal ZINTADVD. Clocked inverter CIV1 receives inverted delayed internal address take-in signal ZINTADVD. NAND circuit NAND1 receives the output of clocked inverter CIV1 and internal clock INTCLK, and inverter IV1 receives the output of NAND circuit NAND1. The output of inverter IV1 forms address take-in trigger signal ADV0.

Operation of the Embodiment

Figure 71:
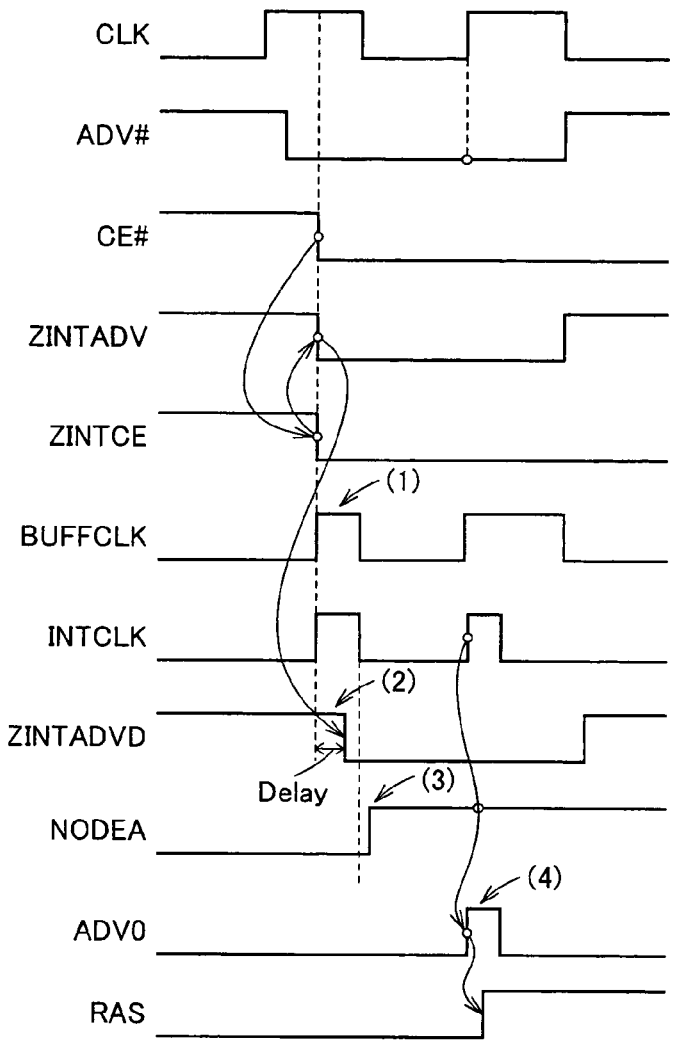
FIG. 71 illustrates timing of changes occurring in various signals when ADV0 generating circuit 1010 in the tenth embodiment is used.

FIG. 71 illustrates timing of changes of various signals, which occur when ADV0 generating circuit 1010 of the embodiment is used.

External clock CLK, external address take-in signal ADV#, external chip enable signal CE#, internal chip enable signal INTCE, internal address take-in signal INTADV, buffer clock BUFFCLK and internal clock INTCLK change according to the same timing as that in the background art already illustrated.

In ADV0 generating circuit 1010, delay circuit (Delay) DL11, NOR circuit NOR95 and inverter IV1 receive inverted internal chip enable signal ZINTCE and inverted internal address take-in signal ZINTADV, and provide inverted delayed internal address take-in signal ZINTADVD as indicated at (2) in FIG. 71.

Clocked inverter CIV1 receives inverted delayed internal address take-in signal ZINTADVD, and provides an output NODWA, which rises to "H" at the falling of internal clock INTCLK as indicated at (3) in FIG. 71.

In ADV0 generating circuit 1010, NAND circuit NAND1 and inverter IV11 produce address take-in trigger signal ADV0 from output NODEA of clocked inverter CIV1 and internal clock INTCLK. Pulses of address take-in trigger signal ADV0 are formed of second and subsequent pulses of internal clock INTCLK as indicated at (4) in FIG. 71. Thus, the leading pulse of address take-in trigger signal ADV0 produced by ADV0 generating circuit 1010 is formed of the internal clock pulse produced from the external clock pulse, which rises during the active state of external address take-in signal ADV#. Delay circuit (Delay) DL11 has a delay amount, which is determined to achieve the above.

RAS generating circuit 1011 activates row address strobe signal RAS in accordance with the rising of the leading pulse of address take-in trigger signal ADV0. Consequently, row address strobe signal RAS is activated according to the same timing as the intended activation of row address strobe signal RAS, and thus is activated at the rising of clock CLK immediately following the input of external chip enable signal CE#. In other words, the delay amount of delay circuit (Delay) DL11 is set to a value achieving the above.

As described above, the synchronous pseudo-SRAM according to the embodiment stops the operation of the input buffers when the chip is inactive, and therefore can suppress wasting of the current.

Since inverted internal chip enable signal ZINTCE is delayed, a malfunction does not occur even when external chip enable signal CE# changes asynchronously.

The embodiment has been described in connection with the structure and method for avoiding the problem, which may occur when external chip enable signal CE# becomes active asynchronously to the clock in the case where external chip enable signal CE# stops the input buffers. This is effective regardless of whether external chip enable signal CE# stops the input buffers or not.

It is desired that the delay amount of delay circuit DL11 is equal to or smaller than a quarter of one cycle of external clock CLK because an excessively large delay amount affects some other operations.

The embodiment has been described in connection with the structure and method for avoiding the problem, which may occur when external chip enable signal CE# becomes active asynchronously to the clock. However, even when external chip enable signal CE# is deactivated asynchronously to the clock, the following problem may occur. If precharging is performed immediately after data was written into a memory cell during the inactive state of external chip enable signal CE#, this may corrupt the data in memory cells.

Figure 72:
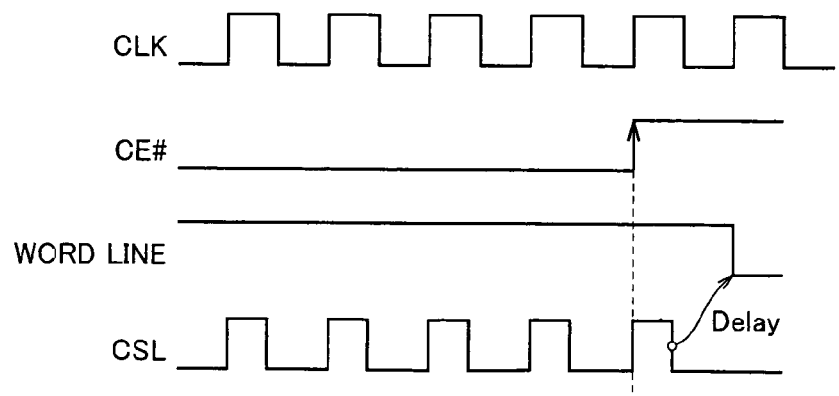
FIG. 72 illustrates timing of precharging delayed when an external chip enable signal CE# asynchronously becomes inactive.

FIG. 72 illustrates such a situation that the timing of precharging is delayed when external chip enable signal CE# is deactivated asynchronously to the clock. As illustrated in FIG. 72, the word line is deactivated when a predetermined time (Delay) elapses from the falling of column select signal CSL following the deactivation ("H") of external chip enable signal CE#. Thus, when the writing is being performed, the word line will be deactivated after waiting for the correct end of the writing. Thereby, the corruption of data in the memory cells can be prevented.

This embodiment is not restrictively applied to the synchronous pseudo-SRAM, and may be applied to various semiconductor memory devices operating in synchronization with clocks.

As shown in FIG. 70, this embodiment uses clocked inverter CIV1 as an example of a data holding circuit, which holds the output of inverter IV12 in synchronization with internal clock INTCLK. However, this is not restrictive, and another data holding circuit may be used.

Figure 73:
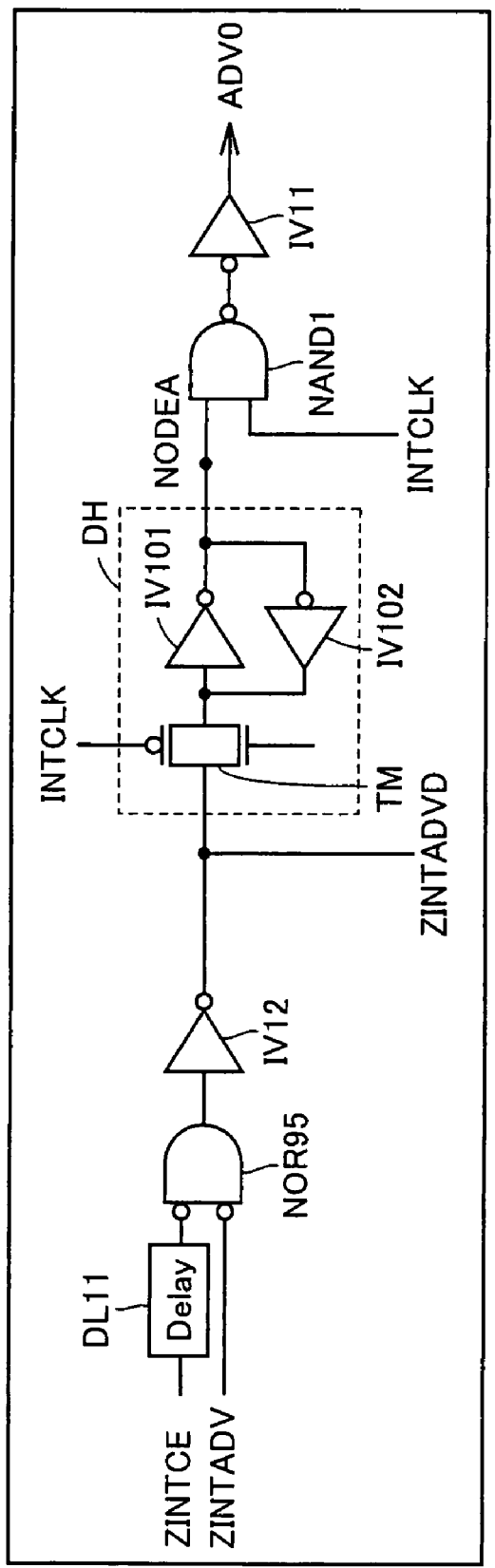
FIG. 73 shows another example of a data holding circuit.

FIG. 73 shows a structure of an ADV0-generating circuit including another data holding circuit DH.

Referring to FIG. 73, data holding circuit DH is formed of a transmission gate TM transmitting an output of inverter IV12 in synchronization with internal clock INTCLK, and a flip-flop, which is formed of inverters IV101 and IV102 for holding an output of transmission gate TM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operable in synchronization with a clock, comprising:
   a memory array having a plurality of memory cells arranged in rows and columns;
   a trigger producing circuit providing a trigger signal;
   a delay circuit receiving said trigger signal, and providing a delay signal produced by delaying said trigger signal;
   a clock counter receiving said clocks, counting the received clocks during a period from reception of said trigger signal to reception of said delay signal, and providing a result of the counting;
   a determining circuit storing a relationship between the number of clocks and a latency, and determining the latency corresponding to the result of counting provided from said clock counter;
   a register holding said determined latency; and
   a wait control circuit externally providing a wait signal based on the latency held in said register.

2. The semiconductor memory device according to claim 1, wherein
   said trigger producing circuit includes:
   a circuit latching an external signal to produce a latch signal, and
   a logic circuit providing said trigger signal together with a read signal or a write signal according to a combination of said latch signal.

* * * * *